(12) United States Patent
Fujishima et al.

(10) Patent No.: US 6,740,952 B2
(45) Date of Patent: May 25, 2004

(54) HIGH WITHSTAND VOLTAGE SEMICONDUCTOR DEVICE

(75) Inventors: Naoto Fujishima, Nagano (JP); Akio Kitamura, Nagano (JP); Gen Tada, Nagano (JP); Masaru Saito, Nagano (JP)

(73) Assignee: Fuji Electric Co., Ltd. (JP)

( * ) Notice: Subject to any disclaimer, the term of this patent is extended or adjusted under 35 U.S.C. 154(b) by 31 days.

(21) Appl. No.: 10/096,357

(22) Filed: Mar. 12, 2002

(65) Prior Publication Data

US 2002/0145172 A1 Oct. 10, 2002

(30) Foreign Application Priority Data

Mar. 12, 2001 (JP) .................................... 2001-069019

(51) Int. Cl.$^7$ .............................................. H01L 23/58
(52) U.S. Cl. ...................................... 257/487; 257/496
(58) Field of Search .................................. 257/487, 496

(56) References Cited

PUBLICATIONS

"Process and Device Design of a 1000–V MOS IC"; Yamaguchi et al.; Reprineted from IEEE Trans. Electron Devices, vol. ED–29; pp. 1171–1178; Aug. 1982.

"Low On–State Resistance of High Withstand Voltage Horizontal Power MOSFETs for an Intelligent Power Devices"; Uno et al.; Summary of Results from the Research Meeting of the Institute of Electrical Engineers of Japan; Chiyoda–ku, Tokyo, Japan; Nov. 17, 2000; pp. 20–29; The Institute of Electrical Engineers of Japan.

*Primary Examiner*—Amir Zarabian
*Assistant Examiner*—Kiesha Rose
(74) *Attorney, Agent, or Firm*—Rossi & Associates

(57) ABSTRACT

A semiconductor device includes a stable high withstand voltage lateral MISFET device which suppresses a gradual withstand voltage drop under high voltage and humidity conditions. In a MISFET device with a 700V breakdown drain voltage, the length of extension Mc ($\mu$m) of a field plate FP1 from the source side end of a thermal oxidization film, and the total insulating film thickness Tox ($\mu$m) directly below the extending tip of the field plate FP1, are greater than or equal to lower limit values $Mc_{min}$, $Tc_{min}$. As a result, even if there is growth in charge accumulation at the interface of the mold resin, the field strength at a point B and point C is always lower than at a point A, which suppresses a gradual withstand voltage drop and a gradual ON current drop, whereby it becomes possible to realize a withstand voltage of 700V.

51 Claims, 28 Drawing Sheets

HIGH WITHSTAND VOLTAGE SEMICONDUCTOR DEVICE

FIELD OF THE INVENTION

The present invention relates to a high withstand voltage power semiconductor device to be used by a switching power source, an AC adapter, or to drive a motor or a fluorescent bulb inverter, or the like.

BACKGROUND OF THE INVENTION

Power ICs for switching power sources in commercial use that drive 100 to 200V, for example, require a device withstand voltage of 700 volts or more to drive a transformer. There is a requirement for a control circuit section and, for the straightforward integration thereof, a high withstand voltage lateral MISFET device (RESURF LDMOS) of the kind shown in FIG. 25, on the same chip.

This high withstand voltage lateral MISFET device is a device with a design withstand voltage of 700V and has: a p-type channel region (a Pwell and MISFET device body region) 2, which is formed on the main face side of a p-type semiconductor substrate 1 with a high resistance of 120 Ωcm; an $n^+$ source region 3 and a $p^+$ substrate contact 4, which are formed on the main face side within the channel region 2; an $n^+$ drain region 6, which is separated from the channel region 2 on the main face side of the p-type semiconductor substrate 1 by an n-type drain drift region 5 of relatively low concentration therebetween; a gate electrode layer 9, which backgates the channel region 2 via a gate insulating film 7, and which extends toward the drain side on a thermal oxidation film (field oxide film) 8 selectively formed on the main face of the drain drift region 5; a source electrode layer 11, which is in conductive contact with the substrate contact 4 and source region 3 via an interlayer insulating film 10 formed on the gate electrode layer 9; a drain electrode layer 12, which is in conductive contact with the drain region 6, and which extends toward the source side on the interlayer insulating film 10; a field plate 13, which extends, further than the gate electrode layer 9, toward the drain side on the interlayer insulating film 10, and which is in conductive contact with the gate electrode layer 9 via a contact hole 13a; a passivation film (protective film, nitride film) 14, which is formed on the source electrode layer 11, the drain electrode layer 12 and the field plate 13; and an enclosing mold resin (epoxy resin or the like) 15, which covers the passivation film 14.

The portion of the gate electrode layer 9 which extends toward the drain side on the thermal oxidation film 8 functions as a field plate for alleviating the field concentration of the well end of the channel region 2. Further, the field plate 13 alleviates the field concentration of the extending tip of the gate electrode layer 9. In addition, the extending portion of the drain electrode layer 12 on the interlayer insulating film 10 functions as a field plate for alleviating the field concentration of the drain region 6. For example, the length of extension of the field plate 13 must be sufficiently long to alleviate the field concentration of the extending tip of the gate electrode layer 9; however, at the same time, a field concentration is produced at the extending tip of the field plate 13. For this reason, it may be said that, ordinarily, an optimized design is such that a 700V voltage device, whose drain drift length is approximately 60 μm, has a field plate extension length on the order of 5 μm. Naturally, a design is required such that the length of extension of the gate electrode layer 9, or the like, is also not too long.

FIG. 26 is a two-dimensional device simulation figure to show the distribution of equipotential lines for a case in which a drain voltage of 700V is applied to the drain electrode layer 12 in an OFF state, in a high withstand voltage lateral MISFET device with a design withstand voltage of 700V and in which the length of the drain drift region 5 is 60 μm. Further, in FIG. 26, the field plate 13 is shown formed as a layer common also to the source electrode layer 11, and, unit length in a vertical direction is shown considerably exaggerated in comparison with unit length in a crosswise direction on the figure. The interval between equipotential lines is 100V.

The length of extension Mc from the source side end (bars peak) of the thermal oxidation film 8 of the field plate 13 is longer than the norm and set at 10 μm, and the total insulating film thickness Tox (oxide film) directly below the extending tip of the field plate 13 is formed with a thickness of 2 μm. In an attempt to provide a stable and reliable device voltage, this high withstand voltage lateral MISFET device is designed such that, at a PN junction face A of the p-type semiconductor substrate 1 and the drain drift region 5, directly below the drain region 6, sacrificial voltage breakdown is forcedly produced. Among the equipotential lines, the low equipotential lines are not oriented toward the extending tip of the gate electrode layer 9 as a result of the effect of the field plate 13, and bend directly below the gate electrode layer 9 within the drain drift region 5 so as to wrap around the outside of the tip of the field plate 13. When Mc is long, at a position B, which is in the main face of the drift region and directly below the tip of the field plate 13, the low equipotential lines are pushed out toward the drain side, and, in the vicinity of this position B, the upper ends of the low equipotential lines are squeezed in the unoccupied interval between the field plate 13 and the extending portion of the drain electrode layer 12. The potential at position B directly below the tip of the field plate 13 is approximately 100V. The field strength (critical field strength) at the PN junction face A is approximately $3 \times 10^5$ V/cm, and makes it possible to obtain a device with a design withstand voltage of 700V, and voltage rate limitation is primarily produced at the PN junction face A. However, since Mc is long in comparison with the norm, it is only natural that the field strength at position B directly below the tip of the field plate 13 already reaches approximately $1 \times 10^5$ V/cm even if an unstable voltage breakdown is generated to an extent owing to structural dispersion, or the like, in the vicinity of position B directly below the tip of the field plate 13.

FIG. 27 is a two-dimensional device simulation figure to show the distribution of equipotential lines for a drain voltage of 500V in a case in which Tox remains as 2 μm as in FIG. 26, and the length of extension Mc of the field plate 13 is 25 μm. Since Mc is now too long, during the application of the drain voltage of 500V, at position B, which is in the main face of the drift region 5 and directly below the tip of the field plate 13, since the low equipotential lines are pushed out toward the drift side, the interval between the equipotential lines contracts, and, in the vicinity of position B, the low equipotential lines are squeezed in the unoccupied interval between the field plate 13 and the extending portion of the drain electrode layer 12 such that the bend of these low equipotential lines changes, which leads to further contraction of the interval between the equipotential lines. For a drain voltage of 500V, the potential at position B directly below the tip of the field plate 13 is approximately 100 V, but the field strength is already higher than the approximate $1 \times 10^5$ V/cm of the PN junction face A and reaches the critical field strength $3 \times 10^5$ V/cm, such that voltage breakdown is produced more at position B directly below the tip of field plate 13 that at PN junction face A. As a result, the realization of a device with a design withstand voltage of 700V is inconceivable, and it is only possible to obtain a device with a voltage of 500V at the most.

Therefore, when the field plate 13 is made long, the interval between equipotential lines contracts synergistically at position B directly below the tip of the field plate 13 as a result of the approach by the low equipotential lines toward the drain side and the squeezing of the low equipotential lines, and, on account of the tendency for there to be an increment in the field strength with respect to an increment in the length of extension ($\partial E/\partial Mc>0$), it has been a design requirement to not make the length of extension of the field plate 13 long, but instead to limit this length to be on the order of a few $\mu$m at most.

However, the following problems were posed by the above-mentioned high withstand voltage lateral MISFET device.

Therefore, during actual use, in which a voltage is applied to a high withstand voltage lateral MISFET device, under high voltage and high humidity conditions, the walk-out phenomenon was observed according to which a gradual withstand voltage drop and ON current drop occur. For example, in a device with a design withstand voltage (initial withstand voltage) of 750V, as shown by "a" (the solid line) in FIG. 28(C), the withstand voltage during actual use dropped momentarily to 700V, and, when a voltage was applied for three hours under high voltage and high humidity conditions, this withstand voltage dropped as far as 650V. Further, as shown by "a" (the solid line) in FIGS. 28(A) and 28(B), the ON current was also seen to drop to 73% of the initial current value following a voltage application of 200 hours.

SUMMARY OF THE INVENTION

Therefore, a first object of the present invention is to provide a semiconductor device comprising a stable high withstand voltage lateral MISFET device capable of suppressing a gradual withstand voltage drop which occurs under high voltage and high humidity conditions in the course of actual use.

Furthermore, a second object of the present invention is to provide a semiconductor device comprising a stable high withstand voltage lateral MISFET device capable of suppressing a gradual ON current drop which occurs under high voltage and high humidity conditions in the course of actual use.

Mechanism Responsible for the Walk-Out Phenomenon

The walk-out phenomenon is a gradual withstand voltage drop under high voltage and high humidity conditions, during actual use. According to research undertaken by the inventors, low withstand voltage devices with a withstand voltage on the order of a few volts, and high withstand voltage devices in a wafer state (in a state in which the mold resin does not cover the device or has been peeled therefrom), are devices in which it is possible to obtain a substantial design withstand voltage and design ON current by rate-limiting the withstand voltage directly below the drain region, and in which devices the walk-out phenomenon is not observed, whereas high withstand voltage devices following resin packaging exhibit the walk-out phenomenon. For this reason, the mechanism generating this phenomenon was thought to be explained by the fact that, since a residual substitute (chlorine or the like) is inevitably contained in the mold resin (epoxy resin, for example), moisture in the atmosphere in which ICs are employed is readily ionized in a high electric field to produce mobile ions, and these mobile ions gradually accumulate as charge at the interface with the passivation film just above the field plate, thereby severely disrupting the potential distribution of the bulk interface, and thus bringing about a gradual withstand voltage drop and ON current drop. Further, the gradual withstand voltage drop means that, when the device is OFF, there is a gradual field concentration that is greater in the section directly below the extending tip of the channel field plate than in the voltage breakdown sacrificial position directly below the drain region, such that the critical field strength is reached primarily directly below this extending tip, and the gradual ON current drop implies that, when the device is ON, there is a gradual field concentration in the section directly below the extending tip of the drain field plate, which results in depletion of this section, which in turn brings about an increase in the ON resistance as a result of the partial constriction of the cross section of the electrical path of the drain drift region.

Here, it may be possible to suppress the gradual withstand voltage drop by making the concentration of the drain drift region low; however, conversely, it is then difficult to ensure a large current capacitance. It may also be possible to suppress the gradual ON current drop by making the concentration of the drain drift region high. However, conversely, it is then problematic to ensure a high withstand voltage. Therefore, it is not possible to reliably suppress both these drops by simply relying on adjustment of the concentration of the drain drift region itself.

However, the field concentration directly below the extending tip of the drain field plate is not as serious as the field concentration directly below the extending tip of the channel field plate. This is because, even if high equipotential lines are squeezed in the unoccupied interval between the drain field plate and the channel field plate, the bend of these lines does not change, and therefore the field strength directly below the extending tip of the drain field plate is generally lower than the field strength directly below the extending tip of the source field plate, and also because, if the total insulating film thickness directly below the extending tip of the drain field plate is made thick, it is to be expected that the field concentration will be alleviated such that depletion will not result. Here, the benefit, for example, of being able to suppress the gradual withstand voltage drop, also permits a high concentration for the drain drift region for the sake of a large current capacitance, and, at the same time, can instead be utilized to stop the depletion directly below the extending tip of the drain field plate from becoming troublesome, to thus generate a dependent benefit which is related to the suppression of the gradual ON current drop. Therefore, the alleviation of the field concentration directly below the extending tip of the channel field plate must be tackled first of all.

Indeed, on the basis of the hypothetical principle of the present inventors that, under high voltage and high humidity conditions during actual use, positive charge, which is constituted by mobile ions in mold resin, gradually accumulates at the interface between the passivation film (nitride film) 14, on the field plate 13, and the mold resin 15, in the course of the voltage application time, for example as shown in FIG. 1 (in which the field plate 13 is shown as a layer common also to the source electrode layer 11), when a comparison is made with the case without mold resin in FIG. 26, two variations in the distribution of the equipotential lines may be observed.

In the first distribution variation, as a result of the positive charge accumulation, since line ends of the low equipotential lines that appear above the field plate 13 lie together in parallel within the passivation film (nitride film) 14 interposed between the field plate 13 and the mold resin 15, these lines bend so as to form a reverse "S" shape, the top portion of which is compressed, and, in contrast to the equipotential lines in FIG. 26, the lowest equipotential lines (0V) are caused to draw slightly close directly below the extending tip of the field plate 13. This is because the upper line ends lie together in parallel with the field plate 13, and undergo strong bending toward the source side in the vicinity of the extending tip of the field plate 13, but are conversely forced to bulge out somewhat toward the drain side at the main face of the drain drift region 5 directly below the field plate 13. The first distribution variation is not illustrated very prominently in FIG. 1, but, if it is taken into account that Tox is 2 μm for a drain drift length of 60 μm, since it is necessary to recognize that the ratio of the actual size, in a direction running across the thickness of the oxide film directly below the field plate 13, is compressed to close to 1/10 of that shown in the figure, it may be judged that, directly below the extending tip of the field plate 13, the equipotential lines become very dense.

In the second distribution variation, since the upper ends of the medium and high equipotential lines also lie together in parallel with the field plate 13, and therefore inevitably move to the channel side also within the drain drift region 5, directly below the extending tip of the field plate 13, the equipotential lines pack closely together to become extremely dense. Therefore, during growth in the charge accumulation, both the low equipotential lines and the high equipotential lines are drawn close directly below the tip of the field plate 13. However, it may be said that since, conversely, there is also an accumulation of negative charge constituted by negative ions or similar in the drain electrode layer 12, the upper ends of the equipotential lines may be respectively controlled by both the positive charge and negative charge in a proportional distribution that corresponds to the degree of polarization of the positive charge accumulation layer and the negative charge accumulation layer.

In the above-mentioned two-dimensional device simulation, the equipotential line distribution is for a case in which the potential of the positive charge accumulation layer is the same as the drain voltage, and, for a breakdown voltage (drain voltage) of 400V, the field strength at point A is approximately $1.7 \times 10^5$ V/cm such that voltage breakdown is no longer generated; however, the field strength at point B is approximately $3 \times 10^5$ V/cm and reaches the critical field strength such that voltage breakdown is primarily produced at point B. In the worst case, the withstand voltage drops gradually to 57% of the design withstand voltage of 700V. When voltage breakdown is produced at point B, since hot electrons enter the oxide film, the potential distribution is disturbed further, which in turn brings about unstable operation.

FIG. 2 is a two-dimensional device simulation figure for a case in which Tox is 4 μm, primarily to suppress the first distribution variation. The flexure of the low equipotential lines within the total insulating film thickness (oxide film) directly below the extending tip of the field plate 13 is slight in comparison with FIG. 1, with the result that the interval between the equipotential lines becomes somewhat sparse. For a breakdown voltage (drain voltage) of 500V, the field strength at point A is approximately $2 \times 10^5$ V/cm; however, the field strength at point B is approximately $3 \times 10^5$ V/cm such that voltage breakdown is, in fact, primarily produced at point B. In the worst case, the withstand voltage drops gradually to 72% of the design withstand voltage of 700V. However, a slight improvement may be observed in comparison with the case in FIG. 1. Formation with a thick Tox therefore means that a suppression of the gradual withstand voltage drop is possible.

FIG. 3 is a two-dimensional device simulation figure for a case in which Tox=2 μm and Mc=25 μm. In contrast to the case in FIG. 1, Mc has been made long, but there is barely any change to the equipotential distribution at position B directly below the extending tip of the field plate 13. Since it can be seen that the extending tip of the field plate 13 shifts the upper line ends of the equipotential lines in parallel toward the drain side with these lines maintained at a substantial meeting point, similarly to the case in FIG. 1, a multiplicity of equipotential lines slip into the section directly below the field plate 13 such that the interval between the equipotential lines at the main face of the drain drift region is substantially the same. For a breakdown voltage (drain voltage) of 400V, the field strength at point A is approximately $1.6 \times 10^5$ V/cm, and the field strength at point B is approximately $3 \times 10^5$ V/cm such that voltage breakdown is, in fact, primarily produced at point B. However, the point to take into consideration here is that, in a case in which a charge accumulation layer is added from the beginning, even if Mc is extended from 10 μm to 25 μm, it may be perceived that there is no change to the field strength in the section directly below the tip of the field plate 13 ($\partial E/\partial Mc \leq 0$). This means that, in contrast to the customary upper limit value for Mc in a state in which there is no charge accumulation layer, there is a lower limit value for Mc at which there is no gradual voltage drop in a state in which there is a charge accumulation layer, which is completely at variance with the conventional technology, according to which an upper limit is set for Mc of a few μm. It may thus also be concluded that it is precisely the customary practice of setting an upper limit value of a few μm that is the main factor in the generation of a gradual withstand voltage drop as a result of the influence of a charge accumulation layer.

Here, when FIG. 3 is compared with FIG. 27, when Mc is long, it may be said that, since low equipotential lines in the vicinity of point B already lie so as to approach the main face within the oxide film, the above-mentioned first distribution variation is now worse also as a result of the growth in the charge accumulation layer, but this distribution variation is substantially saturated. Furthermore, as a result of the advancing condition of the charge accumulation, among high equipotential lines that terminate on the side of the drain electrode layer 12, low equipotential lines can be expected to gradually transfer to the charge accumulation layer side on the field plate 13. However, even if they are thus transferred, since these low equipotential lines pass more through the drain side than directly below the extending tip of the field plate 13, there is no scope for the above-mentioned second distribution variation to occur. Conversely, in a case in which Mc is no more than 10 μm, in a state in which there is no charge accumulation, the inclination of the low equipotential at the main face is large, and, as a result, the field strength at point B is alleviated, but as the charge accumulation progresses, a field concentration is produced at point B according to the above-mentioned first distribution variation, meaning that the field strength is dependent on this charge accumulation. Therefore, making the length of extension of the field plate 13 long means that there is a slight drop in the withstand voltage in the wafer state (initial withstand voltage), but that, conversely, it is possible to suppress a gradual withstand voltage drop which is caused by charge accumulation.

FIG. 4 is a two-dimensional device simulation figure for a case in which Tox is 4 μm primarily to suppress the first distribution variation with respect to FIG. 3. The flexure of the low equipotential lines within the total insulating film thickness (oxide film) directly below the extending tip of the field plate 13 is slight in comparison with FIG. 3, meaning that the interval between the equipotential lines becomes markedly sparse. The reason for this marked sparseness of equipotential lines is that, when, not only is Tox thick, but Mc is also long, the enlarged width of the main face length directly below the field plate 13 means that it is easy for the low equipotential lines to pass from below the insulating film as a result of the interval between the low equipotential lines, and it is thus possible to alleviate the curvature of the low equipotential lines directly below the field plate 13. For a breakdown voltage (drain voltage) of 700V, the field strength at point A is approximately $3 \times 10^5$ V/cm, and the field strength at point B is approximately $2.5 \times 10^5$ V/cm, such that, for a design withstand voltage (700V), voltage breakdown does not occur primarily at point B. In other words, as the length of extension of the field plate 13 increases and the film thickness of the total insulating film directly below this extending tip increases, it becomes possible to alleviate the field concentration at point B. If Mc=25 μm, and Tox=4 μm, a gradual withstand voltage drop does not occur, meaning that it is possible to adequately realize a device with a design withstand voltage of 700V that is also capable of suppressing the gradual ON current drop. Further, since voltage breakdown does not occur primarily at point B, it is possible to realize a device having operational stability. Ensuring that it is possible to maintain the true withstand voltage according to the design withstand voltage paves the way for a higher concentration than previously for the drain drift region, and, not only does this fact permit an increase in the current capacitance of the ON current as a whole, as a result of a reduction in the ON resistance, but, since it is possible to weaken the depletion directly below the tip of the extending portion of the drain electrode layer 12, it also becomes possible to eliminate the resistive constriction of the cross-section in this region, whereby it is possible to obtain a large current capacitance.

On the other hand, to raise the current per unit area by ensuring the current capacitance, in a comb-tooth-type or labyrinth-type device planar pattern, which is fabricated on a semiconductor chip in a gate width direction and constituted by gate linear portions and gate curved portions, by making the length of extension of the field plate still longer, not only on gate linear portions, but particularly on gate curved portions whereon field concentrations are readily produced, and, by shortening the radius of curvature instead of enlarging the radius of curvature, because of the reduction in the field strength at such gate curved portions in comparison with the prior art, it becomes possible to improve the integration of a device planar pattern and to realize a large current capacitance.

Dependence of the Gradual Withstand Voltage Drop on Mc and Tox

Furthermore, the present inventors foresaw that there was a mutual relationship between Mc and Tox that did not involve a gradual withstand voltage drop, and, in the above-mentioned high withstand voltage lateral MISFET, measured parameters were Tox and the design withstand voltage $V_{dabs}$ (V) (essentially the breakdown drain voltage when the critical field strength $E_{crit}$ ($3 \times 10^5$ V/cm) is reached in the voltage breakdown sacrificial position directly below the drain region in a state in which the resin covering layer (mold resin) does not cover the device or has been peeled therefrom), and a device simulation was used to seek the dependence of Mc upon: the field strength Es directly below the tip of the field plate in a state in which the resin covering layer (mold resin) does not cover the device or has been peeled therefrom or in an initial state (before voltage application) in which there is no charge accumulation whatever, and of the field strength Es' directly below the tip of the field plate 13 during actual use (following voltage application) when charge accumulation is produced such that the potential on the protective film becomes the drain potential. FIGS. 5 to 12 are graphs to show these results.

FIG. 5 is for a case in which $V_{dabs}$=350V, drain drift length Ld=25 μm, and Tox=2 μm. Values below the design withstand voltage $V_{dabs}$ and at which $E_{crit}$ is exceeded are not plotted. Since the design withstand voltage $V_{dabs}$ is relatively low at 350V, even if Mc is 5 μm, the field strength Es before voltage application does not reach $E_{crit}$, but the field strength Es' following voltage application already exceeds $E_{crit}$. As Mc is extended, Es exhibits a monotonic increase, but when Mc exceeds a value close to 15 μm, Es' exhibits a monotonic decrease from $E_{crit}$. Consequently, in a device which has a charge accumulation layer, and in which Tox=2 μm and Mc is greater than or equal to 15 μm, when the drain voltage is 350V, this means that voltage breakdown occurs in the voltage breakdown sacrificial position directly below the drain region and that voltage breakdown does not occur directly below the tip of the field plate, and it is thus possible to prevent a gradual withstand voltage drop. According to this figure alone, the optimum length is 20 μm, and the permissible deviation therefrom is roughly ±5 μm.

FIG. 6 is for a case in which $V_{dabs}$=350V, drain drift length Ld=25 μm, and Tox=3 μm. Since Tox is 1.5 times the Tox in FIG. 5, even if Mc changes from 15 μm to a third thereof, i.e. to 5 μm, Es' still does not reach $E_{crit}$. A doubling of the enlargement ratio of Tox is equivalent to a reduction ratio for Mc, and this change to the film thickness is prominent in the relaxation of the field concentration. If Mc is approximately from 5 to 15 μm, Es' exhibits a monotonic decrease, but if Mc is on the order of 20 μm, Es' conversely exhibits a moderate monotonic increase. This monotonic increase results since the plate tip draws too close to the drain side, meaning that the unoccupied interval between the plates is constricted, which results in a field concentration. If Tox=3 μm and Mc is approximately greater than or equal to 5 μm, it is possible to prevent a gradual withstand voltage drop while maintaining the realization of a design withstand voltage of 350V. According to this figure, it may be considered that the optimum length is 15 μm, and the permissible deviation is roughly −10 μm to +5 μm. Since, in contrast to Es and Es' being substantially $1 \times 10^5$ V/cm for an optimum length of 15 μm, in FIG. 5, Es and Es' for an optimum length of 20 μm are substantially $2 \times 10^5$ V/cm, in FIG. 6 there is scope for being able to provide the drain drift region with a high concentration.

FIG. 7 is for a case in which $V_{dabs}$=700V, drain drift length Ld=60 μm, and Tox=2 μm. Since the design withstand voltage is 700V, even if Mc is 5 μm, Es reaches $2 \times 10^5$ V/cm. The field strength Es' following voltage application then already exceeds $E_{crit}$. If Mc is approximately 25 μm, Es' falls as far as or below $E_{crit}$. If Tox=2 μm and Mc is greater than or equal to 25 μm, it becomes possible to prevent a gradual withstand voltage drop while maintaining the realization of a design withstand voltage of 700V.

FIG. 8 is for a case in which $V_{dabs}$=700V, drain drift length Ld=60 μm, and Tox=4 μm. Since Tox is doubled with respect to FIG. 7, when Mc exceeds 15 μm, Es' exhibits a monotonic decrease from $E_{crit}$. If Tox=4 µm and Mc is approximately greater than or equal to 15 µm, it becomes possible to prevent a gradual withstand voltage drop while maintaining the realization of a design withstand voltage of 700V. When Mc is on the order of 25 µm, Es' also exhibits a monotonic increase. This is because the plate tip draws too close to the drain side, meaning that the empty portion between the plates is constricted, which results in a field concentration. According to this figure, the optimum length is 20 µm, and the permissible deviation is roughly −5 µm to +10 µm.

FIG. 9 is for a case in which $V_{dabs}$=700V, drain drift length Ld=60 µm, and Tox=6 µm. Since Tox is tripled with respect to FIG. 7, even if Mc is 5 µm, Es' still does not reach $E_{crit}$. If Tox=6 µm and Mc is approximately greater than or equal to 5 µm, it is possible to prevent a gradual withstand voltage drop while maintaining the realization of a design withstand voltage of 700V. According to this figure, it may be considered that the optimum length is 15 µm, and the permissible deviation is roughly −10 µm to +15 µm. When Mc exceeds 20 µm, Es' exhibits a moderate monotonic increase, but even if Mc is 30 µm, since Es' is substantially 2×10$^5$ V/cm, there is scope for being able to provide the drain drift region with a high concentration. The upper limit value for Mc may be half of Ld.

FIG. 10 is for a case in which $V_{dabs}$=1200V, drain drift length Ld=110 µm, and Tox=2 µm. When Mc is approximately 30 µm, Es' falls so as to be no more than $E_{crit}$. If Mc is greater than or equal to 30 µm, it is possible to prevent a gradual withstand voltage drop while maintaining the realization of a withstand voltage of 1200V.

FIG. 11 is for a case in which $V_{dabs}$=1200V, drain drift length Ld=110 µm, and Tox=4 µm. If an attempt is made to extrapolate Es' in a direction extending from the point where Mc=25 µm, when Mc is 22 µm, Es' is no more than $E_{crit}$. If Tox=4 µm and Mc is greater than or equal to 22 µm, it is possible to prevent a gradual withstand voltage drop while maintaining the realization of a withstand voltage of 1200V. According to this figure, the optimum length is 30 µm, and the permissible deviation is roughly −8 µm to +10 µm.

FIG. 12 is for a case in which $V_{dabs}$=1200V, drain drift length Ld=110 µm, and Tox=8 µm. If an attempt is made to extrapolate Es' in a direction extending from the point where Mc=15 µm, when Mc is 11 µm, Es' is no more than $E_{crit}$. If Mc is greater than or equal to 11 µm, it is possible to prevent a gradual withstand voltage drop while maintaining the realization of a withstand voltage of 1200V. According to this figure, the optimum length is 20 µm, and the permissible deviation is roughly from −9 µm to +20 µm or more. When, for a high withstand voltage, the drain drift length Ld is long, it may be said that there is scope for the upper limit value of Mc such that same may be half of Ld.

Derivation of a Relational Expression for Mc and Tox

In consideration of the above, the inventors derived the following relational expression for Mc and Tox, on the basis of the condition that it should be possible to prevent a gradual withstand voltage drop whilst satisfying the design withstand voltage:

$$Mc \geq -\alpha(Tox-\beta) \quad (1)$$

where $\alpha=3500/V_{dabs}$, $\beta=0.01V_{dabs}$.

This is a valid expression for the lower limit values of Mc and Tox respectively. Consideration is given to the lower limit value of Mc as being when Es' reaches the critical field strength. Although with Tox≥β, irrespective of the value of Mc, expression (1) is formally established, and with Mc≥35, irrespective of the value of Tox, expression (1) is formally established, as a prerequisite for establishing expression (1), derivation is made under the condition that Tox≤β and Mc≤35. As far as the upper limit value of Mc is concerned, after establishing that $V_{dabs}$=10 Ld+100 in accordance with experience, the upper limit value of Mc is limited by the limits of Ld. If Ld is the same as the length of extension of the drain plate on account of substantial left and right symmetry of equipotential lines within the insulating film, Mc<Ld/2 is likely, but when the unoccupied interval between these plates is no more than 2 µm, a trap level is generated as a result of deterioration of the insulating film, and instability of the withstand voltage and current also results, meaning that this unoccupied interval must be greater than or equal to 2 µm. It may therefore be said that Mc≤(Ld/2−1)=($V_{dabs}$−100)/20−1 is suitable. However, when the drain voltage is high, enlargement of this unoccupied interval is desirable. This is true because, if Mc is extended too much, as a result of squeezing between the plates, the field strength substantially in the center of the unoccupied interval becomes the maximum. Also in accordance with FIGS. 6, 8, 9, 11 and 12, it may be observed that Es' rises gradually. Expression (1) is established using the process in which Es' exhibits a monotonic decrease. Only, since it may be observed that the slope, for the process in which Es' exhibits a monotonic increase as a result of extending Mc, is more gradual than the slope for the process according to which expression (1) is established, it may be said that, with an adequate unoccupied interval between the plates, the upper limit value of the length of extension need not be controlled very strictly.

Expression (1) agrees with the Mc values in FIGS. 5 and 6 even when $V_{dabs}$=350V. Further, expression (1) agrees with the Mc values in FIGS. 10 to 12 when $V_{dabs}$=1200V. There is therefore a degree of numerical scope in the selection of the coefficients α and β.

Meanwhile, with respect also to the length of extension Md of the drain field plate and the total insulating film thickness Tox, according to the fact that the equipotential distribution on the main face side of the drain drift region and within the insulating film has substantial leftward and rightward symmetry, the following similar expression may be established under a satisfactory condition:

$$Md \geq -\alpha(Tox-\beta);$$

where $\alpha=3500/V_{dabs}$, $\beta=0.01V_{dabs}$.

This expression also establishes a lower limit value. "Satisfactory condition" is intended to mean that, as described hereinabove, the field strength directly below the extending tip of the drain field plate should be lower than the field strength directly below the extending tip of the channel field plate. In addition, needless to say, Md≥(Ld/2−1).

The present invention is based on the principles described hereinabove for a high withstand voltage lateral MISFET device. First of all, the fundamental structure of a semiconductor device that has a high withstand voltage lateral MISFET device relating to the present invention is constituted comprising: a first conductivity-type channel region, which is formed on the main face side of a first conductivity-type substrate; a second conductivity-type source region, which is formed on the main face side within the channel region; a second conductivity-type drain region, which is separated from the channel region on the main face side of the first conductivity-type substrate by a second conductivity-type drain drift region (offset region) therebetween; a drain electrode layer, which is conductively connected with the drain region; a gate electrode layer, which backgates the channel region via a gate insulating film, and which extends toward the drain side on a first insulating film (a field oxide film, for example) formed on the main face of the drain drift region; a source electrode layer, which is conductively connected with the channel region and the source region; and a resin covering layer (mold resin), which covers the gate electrode layer, a protective film being interposed therebetween.

In a fundamental structure of this kind, consideration is first given to the above-mentioned gate electrode layer that serves also as a field plate to alleviate the field concentration of the well end of the channel region. A first embodiment of the present invention is characterized in that a breakdown drain voltage, when the voltage breakdown sacrificial position directly below the drain region reaches a critical field strength in a state in which the resin covering layer does not cover the device or has been peeled therefrom, is $V_{dabs}$ (V), and wherein the length of extension Mc ($\mu$m) of the gate electrode layer on the first insulating film and the total insulating film thickness Tc ($\mu$m) directly below the extending tip of the gate electrode layer are greater than or equal to lower limit values $Mc_{min}$, $Tc_{min}$ that satisfy the following inequalities:

$$350 \leq V_{dabs} \leq 1200;$$

$$Tc_{min} \leq \beta;$$

$$Mc_{min} \leq 35;$$

$$Mc_{min} \geq -\alpha(Tc_{min}-\beta);$$

where $\alpha=3500/V_{dabs}$, $\beta=0.01V_{dabs}$.

Here, "state in which the resin covering layer does not cover the device or has been peeled therefrom" signifies, to objectively regulate a state in which there is no charge accumulation at the interface of the resin covering layer during actual use upon voltage application, a device that is not provided with a resin covering layer, that is, a high withstand voltage lateral MISFET device before a resin packaging process, or a high withstand voltage lateral MISFET device from which the resin covering layer has been peeled after the resin packaging process. Further, "the breakdown drain voltage, when the voltage breakdown sacrificial position directly below the drain region reaches a critical field strength" signifies a device with a design breakdown voltage (design withstand voltage) that is designed such that the voltage breakdown sacrificial position produces voltage breakdown.

In a high withstand voltage lateral MISFET device of this kind, since the length of extension Mc of a gate electrode layer on a first insulating film and the total insulating film thickness Tc directly below the extending tip of the gate electrode layer are greater than or equal to lower limit values $Mc_{min}$, $Tc_{min}$, even if, during actual use in a device provided with a resin covering layer, charge accumulation grows at the interface of the resin covering layer, a gradual voltage drop does not occur, and it is thus possible to also suppress a gradual ON current drop, and, without the withstand voltage being rate-limited directly below the extending tip of the gate electrode layer, it is possible to realize a stable, highly reliable device with a withstand voltage of 350V to 1200V. Furthermore, since control of Mc and Tc is sufficient in the course of fabrication, such a device may be finished without the addition of a special process. For the time being, the above-described device simulation will be fixed at values up to 1200V, but, as design withstand voltages grow higher, since the above-mentioned relationship will be even more valid than for low withstand voltage devices, there is surely scope for possible application also for values above 1200V.

Thus, the expression $Mc<Ld/2=(V_{dabs}-100)/20-1$ is satisfied. To obtain devices with design withstand voltages of 350V to 1200V, by selecting the design withstand voltage $V_{dabs}$, the lower limit values $Mc_{min}$, $Tc_{min}$ can be suitably derived by means of the above-mentioned expression.

In this connection, when $V_{dabs}=350$, since $Tc_{min} \leq 3.5$ and $Mc_{min} \geq 35-10 Tc_{min}$, when $Tc_{min}=2$, $Mc_{min} \geq 15$, when $Tc_{min}=2.5$, $Mc_{min} \geq 10$, and when $Tc_{min}=3$, $Mc_{min} \geq 5$, for example. By means of such conditions, at least for a design withstand voltage of 350V, a gradual voltage drop does not occur, and it is thus possible to provide a stable semiconductor device that is also capable of suppressing a gradual ON current drop. In a 350V withstand voltage device, according to the fact that, typically, Ld=25, if the upper limit value of Mc is 11.5 $\mu$m, since there is little scope for extending $Mc_{min}$, this means that it is necessary to form $Tc_{min}$ with a thickness greater than or equal to 2.35 $\mu$m.

Further, in a case in which $Tc_{min}$ and $Mc_{min}$ satisfy $Tc_{min} \leq 4$ and $Mc_{min} \geq 35-8.75 Tc_{min}$, at least for a design withstand voltage of 400V, a gradual voltage drop does not occur, and it is thus possible to provide a stable semiconductor device that is also capable of suppressing a gradual ON current drop. When $Tc_{min}=2$, $Mc_{min} \geq 18.5$, when $Tc_{min}=2.86$, $Mc_{min} \geq 10$, and when $Tc_{min}=3$, $Mc_{min} \geq 8.86$, for example. Also, according to the fact that, typically, Ld=30, if the upper limit value of Mc is 14 $\mu$m, it is necessary to form $Tc_{min}$ with a thickness greater than or equal to 2.4 $\mu$m.

In addition, in a case in which $Tc_{min}$ and $Mc_{min}$ satisfy $Tc_{min} \leq 5$ and $Mc_{min} \geq 35-7 Tc_{min}$, at least for a design withstand voltage of 500V, a gradual voltage drop does not occur, and it is thus possible to provide a stable semiconductor device that is also capable of suppressing a gradual ON current drop. When $Tc_{min}=2$, $Mc_{min} \geq 21$, when $Tc_{min}=3$, $Mc_{min} \geq 14$, and when $Tc_{min}=3.58$, $Mc_{min} \geq 10$, for example. Also, according to the fact that, typically, Ld=40, if the upper limit value of Mc is 19 $\mu$m, it is necessary to form $Tc_{min}$ with a thickness greater than or equal to 2.28 $\mu$m, but it is possible to form $Tc_{min}$ to be quite thin in comparison with the 350V and 400V cases.

In a case in which $Tc_{min}$ and $Mc_{min}$ satisfy $Tc_{min} \leq 6$ and $Mc_{min} \geq 35-5.83 Tc_{min}$, at least for a design withstand voltage of 600V, a gradual voltage drop does not occur, and it is thus possible to provide a stable semiconductor device that is also capable of suppressing a gradual ON current drop. When $Tc_{min}=2$, $Mc_{min} \geq 23.4$, when $Tc_{min}=3$, $Mc_{min} \geq 17.5$, when $Tc_{min}=4$, $Mc_{min} \geq 11.69$, and when $Tc_{min}=4.39$, $Mc_{min} \geq 10$, for example. Also, according to the fact that, typically, Ld=50, if the upper limit value of Mc is 24 $\mu$m, $Tc_{min}$ may be formed with a thickness greater than or equal to 1.88 $\mu$m, but there is also scope for extension such that Mc is long.

Further, in a case in which $Tc_{min}$ and $Mc_{min}$ satisfy $Tc_{min} \leq 7$ and $Mc_{min} \geq 35-5 Tc_{min}$, at least for a design withstand voltage of 700V, a gradual voltage drop does not occur, and it is thus possible to provide a stable semiconductor device that is also capable of suppressing a gradual ON current drop. When $Tc_{min}=2$, $Mc_{min} \geq 25$, when $Tc_{min}=3$, $Mc_{min} \geq 20$, when $Tc_{min}=4$, $Mc_{min} \geq 15$, when $Tc_{min}=5$, $Mc_{min} \geq 10$, and when $Tc_{min}=6$, $Mc_{min} \geq 5$, for example. Also, according to the fact that, typically, Ld=60, if the upper limit value of Mc is 29 $\mu$m, $Tc_{min}$ may be formed with a thickness greater than or equal to 1.2 $\mu$m, but there is also scope for extension such that Mc is long.

Further, it goes without saying that, in the realization of other desired withstand voltage devices, through substitution of the design withstand voltage value $V_{dabs}$, as described above, it is possible to derive relational expressions for $Tc_{min}$ and $Mc_{min}$.

Indeed, to make the gate width on the chip substantially long, a high withstand voltage lateral MISFET device which serves to ensure a large current capacitance typically has a comb-tooth type device planar pattern extending in a gate width direction and in which gate linear portions and gate curved portions are alternately repeated and connected to one another. However, since the field concentration on the gate curved portions is greater than on the gate linear portions, to alleviate the field concentration on the gate curved portions, the radius of curvature of the gate curved portions is enlarged in an attempt to alleviate the field concentration. However, when the radius of curvature of the gate curved portions is enlarged, since a widening is not necessarily achieved also of the interval between the gate linear portions that lie in parallel with one another and are connected to both ends of the gate curved portions, there are restrictions on making the gate length substantially long and the quantity of current per unit area becomes low, which in turn diminishes a large current capacitance.

However, in a case in which the length of extension of the gate electrode layer on the gate curved portions is longer than the length of extension of the gate electrode layer on gate linear portions, not forming Tc to be thick partially on the gate curved portions means that it is possible to alleviate the field concentration on the gate curved portions, and it is therefore possible to make the radius of curvature of the gate curved portions small. There is also the advantage of being able to lengthen the length of extension of the gate curved portions simply as a result of patterning of the gate electrode layer. It is therefore possible to make the interval between parallel gate linear portions narrower than is known conventionally, and, by means of high-density integration, a large current capacitance is conceivable. In other words, it is possible to adopt a design withstand voltage of 350V to 700V. If the withstand voltage is greater than or equal to 700V, since the length of extension on the gate linear portions is afforded some scope, matching of the length of extension on the gate linear portions to the length on the gate curved portions is permissible.

As outlined by the above exemplification, since there is a requirement to make the first insulating film (field oxide film) thicker as the design withstand voltage rises, the film thickness is desirably greater than or equal to $2\,\mu m$. Since the original function of the field plate of the gate electrode layer is to alleviate the field concentration of the well end of the channel region, if the first insulating film is made too thick, the effect of alleviating the field is also diminished. As a rule, when consideration is given to forming a source electrode layer and a drain electrode layer on an interlayer insulating film on the gate electrode layer, it is desirable to apply the principles described hereinabove to a channel field plate that serves to alleviate the field concentration of the extending tip of the gate electrode layer by utilizing the film thickness of this interlayer insulating film.

In other words, a second embodiment of the present invention is characterized by having a first field plate, which extends, further than the gate electrode layer, toward the drain side on a second insulating film (an interlayer insulating film, for example) formed on the gate electrode, and which, at least when the MISFET device is OFF, is intended to apply a potential that is substantially the same as the potential of the gate electrode layer or the source electrode layer, and is characterized in that the breakdown drain voltage, when the voltage breakdown sacrificial position directly below the drain region reaches a critical field strength in a state in which the resin covering layer does not cover the device or has been peeled therefrom, is $V_{dabs}$ (V), and the length of extension $Mc_1$ ($\mu m$) of the first field plate from the source side end of the first insulating film and the total insulating film thickness $Tc_1$ ($\mu m$) directly below the extending tip of the first field plate are greater than or equal to lower limit values $Mc_{1min}$, $Tc_{1min}$ that satisfy the following inequalities:

$$350 \leq V_{dabs} \leq 1200;$$

$$Tc_{1min} \leq \beta;$$

$$Mc_{1min} \leq 35;$$

$$Mc_{1min} \geq -\alpha(Tc_{1min}-\beta);$$

where $\alpha=3500/V_{dabs}$, $\beta=0.01V_{dabs}$.

Also according to the second embodiment of the present invention, even if charge accumulation grows at the interface of the resin covering layer, a gradual voltage drop does not occur, and it is thus possible to also suppress a gradual ON current drop and thereby realize a stable device with a withstand voltage of 350V to 1200V. Since the first field plate can be formed as metal wiring of a layer common also to the source electrode layer, no addition of a special process is involved here. To make the total insulating film thickness Tc greater than or equal to $2\,\mu m$, since the interlayer insulating film can be utilized, no addition of a special process is involved here.

In a case in which $Tc_{1min}$ and $Mc_{1min}$ satisfy $Tc_{1min} \leq 4$ and $Mc_{1min} \geq 35-8.75Tc_{1min}$, at least for a design withstand voltage of 400V, a gradual voltage drop does not occur, and it is thus possible to provide a stable semiconductor device that is also capable of suppressing a gradual ON current drop.

Further, in a case in which $Tc_{1min}$ and $Mc_{1min}$ satisfy $Tc_{1min} \leq 5$ and $Mc_{1min} \geq 35-7Tc_{1min}$, at least for a design withstand voltage of 500V, a gradual voltage drop does not occur, and it is thus possible to provide a stable semiconductor device that is also capable of suppressing a gradual ON current drop.

In addition, in a case in which $Tc_{1min}$ and $Mc_{1min}$ satisfy $Tc_{1min} \leq 6$ and $Mc_{1min} \geq 35-5.83Tc_{1min}$, at least for a design withstand voltage of 600V, a gradual voltage drop does not occur, and it is thus possible to provide a stable semiconductor device that is also capable of suppressing a gradual ON current drop.

Further, in a case in which $Tc_{1min}$ and $Mc_{1min}$ satisfy $Tc_{1min} \leq 7$ and $Mc_{1min} \geq 35-5Tc_{1min}$, at least for a design withstand voltage of 700V, a gradual voltage drop does not occur, and it is thus possible to provide a stable semiconductor device that is also capable of suppressing a gradual ON current drop.

In a case in which the length of extension of the first field plate on the gate curved portions is longer than the length of extension of the first field plate on the gate linear portions, not forming Tc to be thick partially on the gate curved portions means that it is possible to alleviate the field concentration on the gate curved portions, and it is therefore possible to make the radius of curvature of the gate curved portions small. It is therefore possible to make the interval between parallel gate linear portions narrow, and, by means of high-density integration, a large current capacitance is conceivable. If the length of extension on the gate linear portions is afforded some scope, matching of the length of extension on the gate linear portions to the length on the gate curved portions is permissible.

The first field plate may be conductively connected with the gate electrode layer by means of a connection hole (via hole) in the second insulating film (interlayer insulating film). It is therefore possible to reduce the gate wiring resistance. However, since the gate capacitance increases, this effects the high-speed switching characteristics. It is therefore desirable to form the first field plate as a layer common also to the source electrode layer.

Due to the fact that the second insulating film is generally to be in the form of an interlayer insulating film, to improve reliability in the formation of a source contact hole or the like, restrictions are placed on the thickness of the second insulating film. Therefore, a third embodiment of the present invention is the adoption of a field plate upper layer extending multiple structure, and the adoption of a second field plate.

In other words, a third embodiment of the present invention is characterized by having a first field plate, which extends, further than the gate electrode layer, toward the drain side on a second insulating film formed on the gate electrode layer, and which, at least when the MISFET device is OFF, is intended to apply a potential that is substantially the same as the potential of the gate electrode layer or the source electrode layer; and a second field plate, which extends, further than the first field plate, toward the drain side on a third insulating film (interlayer insulating film) formed on the first field plate, and which, at least when the MISFET device is OFF, is intended to apply a potential that is substantially the same as the potential of the gate electrode layer or the source electrode layer.

As a result of the inclusion of the third insulating film in the field plate upper layer extending multiple structure, a thick Tc can inevitably be formed. In addition, since the second field plate extends, further than the first field plate, toward the drain side, the length of extension from the extending base end of the gate electrode layer is long. Even if there is growth of charge accumulation at the interface of the resin covering layer, suppression of the gradual withstand voltage drop and ON current drop is effected, and it is thus possible to realize a stable semiconductor device.

By means of such a field plate upper layer extending multiple structure, particularly in a case in which the breakdown drain voltage, when the voltage breakdown sacrificial position directly below the drain region reaches a critical field strength in a state in which the resin covering layer does not cover the device or has been peeled therefrom, is $V_{dabs}$ (V), and the length of extension $Mc_2$ ($\mu$m) of the second field plate from the source side end of the first insulating film and the total insulating film thickness $Tc_2$ ($\mu$m) directly below the extending tip of the second field plate are greater than or equal to lower limit values $Mc_{2min}$, $Tc_{2min}$ that satisfy the inequalities below, even if there is growth of charge accumulation at the interface of the resin covering layer, reliable suppression of the gradual withstand voltage drop and ON current drop can be achieved, and it is thus possible to realize a stable semiconductor device.

$$350 \leq V_{dabs} \leq 1200;$$

$$Tc_{2min} \leq \beta;$$

$$Mc_{2min} \leq 35;$$

$$Mc_{2min} \geq -\alpha(Tc_{2min} - \beta);$$

where $\alpha = 3500/V_{dabs}$, $\beta = 0.01 V_{dabs}$.

In a case in which $Tc_{2min}$ and $Mc_{2min}$ satisfy $Tc_{2min} \leq 4$ and $Mc_{2min} \geq 35 - 8.75 Tc_{2min}$, at least for a design withstand voltage of 400V, a gradual voltage drop does not occur, and it is thus possible to provide a stable semiconductor device that is also capable of suppressing a gradual ON current drop.

Further, in a case in which $Tc_{2min}$ and $Mc_{2min}$ satisfy $Tc_{2min} \leq 5$ and $Mc_{2min} \geq 35 - 7 Tc_{2min}$, at least for a design withstand voltage of 500V, a gradual voltage drop does not occur, and it is thus possible to provide a stable semiconductor device that is also capable of suppressing a gradual ON current drop.

In addition, in a case in which $Tc_{2min}$ and $Mc_{2min}$ satisfy $Tc_{2min} \leq 6$ and $Mc_{2min} \geq 35 - 5.83 Tc_{2min}$, at least for a design withstand voltage of 600V, a gradual voltage drop does not occur, and it is thus possible to provide a stable semiconductor device that is also capable of suppressing a gradual ON current drop.

Further, in a case in which $Tc_{2min}$ and $Mc_{2min}$ satisfy $Tc_{2min} \leq 7$ and $Mc_{2min} \geq 35 - 5 Tc_{2min}$, at least for a design withstand voltage of 700V, a gradual voltage drop does not occur, and it is thus possible to provide a stable semiconductor device that is also capable of suppressing a gradual ON current drop.

At this point, in view of the fact that the second field plate is formed in the upper layer of the first field plate, attention will now be directed toward the method of utilizing the second field plate. A semiconductor device comprising a high withstand voltage lateral MISFET device typically has, in a region separate from the region occupied by the MISFET device within the main face side of the first conductivity-type substrate, a control circuit section (also including a protective circuit and the like) for this MISFET device. Therefore, the semiconductor device according to the present invention is characterized in that the first field plate is formed by a first metal layer and the second field plate is formed by a second metal layer, and the control circuit section is constituted using the first and second metal layers as circuitry interconnect wiring layers. The interconnect wiring layers in the control circuit section are thicker than those used conventionally, on account of which wiring connections are afforded a greater degree of freedom, and high-density integration of the control circuit section can be realized. This means that it is equally possible to increase the proportion of the area occupied by the power MISFET device, and consequently a high current capacitance is conceivable, along with a low cost as a result of the small chip size.

Furthermore, the control circuit section may employ a first metal layer as a circuitry interconnect wiring layer and a second metal layer as a shield film to cover at least some of the circuitry. The control circuit section is capable of preventing operational instability caused by floating ions within the resin covering layer and is capable of improving the effect of shielding electromagnetic noise and the like from the MISFET device, for example, whereby it is possible to provide a highly reliable semiconductor device.

In a case in which the length of extension of a second field plate on the gate curved portions is longer than the length of extension of the second field plate on the gate linear portions, not forming Tc to be thick partially on the gate curved portions means that it is possible to alleviate the field concentration on the gate curved portions, and it is therefore possible to make the radius of curvature of the gate curved portions small. It is therefore possible to make the interval between parallel gate linear portions narrow, and, by means of high-density integration, a large current capacitance is conceivable. If the length of extension on the gate linear portions is afforded some scope, matching of the length of extension on the gate linear portions to the length on the gate curved portions is permissible.

The first field plate may be conductively connected with the gate electrode layer by means of a first connection hole in the second insulating film. In such a case, the second field plate may be conductively connected with the first field plate by means of a second connection hole in the third insulating film. It is therefore possible to reduce the gate wiring resistance. However, since the gate capacitance increases, this effects the high-speed switching characteristics. It is therefore desirable to connect the second field plate to the source electrode layer by means of a second connection hole in the third insulating film. Moreover, since a protective film is formed on the second connection hole, if the step coverage of the protective film, which results from the difference in level of the second connection hole, is insufficient, there is a danger of localized deterioration of the film material. Particularly in actual use under high-humidity conditions, if impurities within the resin covering layer pass through the deteriorated section of the protective film by means of moisture so as to permeate inside the device, there is a risk that aluminum corrosion will occur and that a channel leak current will be generated.

Therefore, the second field plate is a metal continuous film on the source electrode layer, the third insulating film being interposed therebetween, and this metal continuous film is formed as a source side covering layer that extends in a planar fashion also beyond the comb-tooth type device planar pattern, and the position of formation of the second connection hole is desirably in the source side covering layer and away from the gate linear portions and the gate curved portions. Since the second connection hole is not positioned in the vicinity of the gate linear portions and the gate curved portions, even in the event that impurities within the resin covering layer permeate into the device as a result of a deterioration of the protective film on the second connection hole, no aluminum corrosion is provoked on the extending portion of the second field plate or the source electrode layer, and the production of a channel leak current is prevented. The second connection hole may be formed in a section at a distance of approximately 10 $\mu$m or more from the gate linear portions and the gate curved portions. However, because no current flows in the second field plate, whose sole function is to transmit a potential, the second connection hole may be formed in the vicinity of a source pad.

In addition, the second field plate may be formed as a layer common also to the source electrode layer. Since the gate capacitance for the second field plate does not increase, it is possible to obtain high-speed switching characteristics. However, since the total insulating film thickness below the source electrode layer also becomes thick, problems arise in connection with the reliability of the formation of the source connection hole and with aluminum corrosion and the like.

The first field plate is desirably formed as a layer common also to the source electrode layer. Since the gate capacitance of the first field plate does not increase, it is possible to obtain high-speed switching characteristics. In a case such as this, the second field plate is conductively connected with the source electrode layer by means of a connection hole in the third insulating film. Here also, the second field plate is a metal continuous film on the source electrode layer, the third insulating film being interposed therebetween, and this metal continuous film is formed as a source side covering layer that extends in a planar fashion also beyond the comb-tooth type device planar pattern, and the position of formation of the third connection hole is desirably in the source side covering layer and away from the gate linear portions and the gate curved portions. It is thus possible to suppress the production of aluminum corrosion and a channel leak current caused by impurities within the resin covering layer permeating into the device. The connection hole may therefore be formed in a section at a distance of approximately 10 $\mu$m or more from the gate linear portions and the gate curved portions. However, the third connection hole may desirably be formed in the vicinity of a source pad.

With a view to resolving the second object alone, the fundamental structure of a semiconductor device that has a high withstand voltage lateral MISFET device is constituted comprising: a first conductivity-type channel region, which is formed on the main face side of a first conductivity-type substrate; a second conductivity-type source region, which is formed on the main face side within the channel region; a second conductivity-type drain region, which is separated from the channel region on the main face side of the first conductivity-type substrate by a second conductivity-type drain drift region therebetween; a gate electrode layer, which backgates the channel region via a gate insulating film; a source electrode layer, which is conductively connected with the channel region and source region; a drain electrode layer, which is conductively connected with the drain region and which extends toward the source side on a first insulating film (field oxide film, for example) formed on the main face of the drain drift region; and a resin covering layer, which covers the drain electrode layer, a protective film being interposed therebetween.

Here, a fourth embodiment of the present invention is characterized in that the breakdown drain voltage, when the voltage breakdown sacrificial position directly below the drain region reaches a critical field strength in a state in which the resin covering layer does not cover the drain electrode layer] or has been peeled therefrom, is $V_{dabs}$ (V), and in that the length of extension Md ($\mu$m) of the drain electrode layer on the first insulating film and the total insulating film thickness Td ($\mu$m) directly below the extending tip of the drain electrode layer are greater than or equal to lower limit values $Md_{min}$, $Td_{min}$ that satisfy the following inequalities:

$$350 \leq V_{dabs} \leq 1200;$$

$$Td_{min} \leq \beta;$$

$$Md_{min} \leq 35;$$

$$Md_{min} \geq -\alpha(Td_{min}-\beta);$$

where $\alpha = 3500/V_{dabs}$, $\beta = 0.01 V_{dabs}$.

Relationships are such that the relationship between Mc and Tc for the channel side is applied as-is to the drain side. In evaluating the length of extension on the drain side, in a case in which an accumulation layer of negative charge is formed on the drain electrode layer, since the upper ends of the high equipotential lines unavoidably meet in the vicinity of the extending tip of the drain electrode layer, even if the length of extension is long, there is barely any increase in the field strength directly below the extending tip within the main face of the drain drift region. This can be predicted to an extent also from the symmetry between equipotential lines on the channel side and roughly in the section above the main face. However, also on account of the fact that, although the low equipotential lines possess a flexion point directly below the channel field plate in a reverse "S" shape distribution, high equipotential lines possess no such flexion point at the drain electrode layer in a "C" shape distribution, it may be said that the field strength directly below the extending tip of the drain electrode layer must inevitably be lower than the field strength directly below the extending tip on the channel side. Therefore, it is possible to regard this condition as a satisfactory condition for the above-mentioned relational expression.

Therefore, for a semiconductor device that satisfies the above relationship, even if a field accumulation layer is gradually generated on the drain side as a result of mobile ions and the like of the resin covering layer, since it is possible to alleviate the field concentration within the main face of the drain drift region, directly below the extending tip of the drain electrode layer, it is possible to suppress the resistive partial constriction of the cross section of this region and therefore suppress the gradual ON current drop. Moreover, since a high concentration is conceivable for the drain drift region, an increase in the ON current can be realized.

In a case in which $Td_{min}$ and $Md_{min}$ satisfy $Td_{min} \leq 4$ and $Md_{min} \geq 35-8.75Td_{min}$, at least for a design withstand voltage of 400V, it is possible to provide a stable semiconductor device that is capable of suppressing a gradual ON current drop.

Further, in a case in which $Td_{min}$ and $Md_{min}$ satisfy $Td_{min} \leq 5$ and $Md_{min} \geq 35-7Td_{min}$, at least for a design withstand voltage of 500V, it is possible to provide a stable semiconductor device that is capable of suppressing a gradual ON current drop.

In addition, in a case in which $Td_{min}$ and $Md_{min}$ satisfy $Td_{min} \leq 6$ and $Md_{min} \geq 35-5.83Td_{min}$, at least for a design withstand voltage of 600V, it is possible to provide a stable semiconductor device that is capable of suppressing a gradual ON current drop.

Further, in a case in which $Td_{min}$ and $Md_{min}$ satisfy $Td_{min} \leq 7$ and $Md_{min} \geq 35-5Td_{min}$, at least for a design withstand voltage of 700V, it is possible to provide a stable semiconductor device that is also capable of suppressing a gradual ON current drop.

Also with regard to the drain electrode layer, it is desirable if the length of extension of the drain electrode layer on the gate curved portions is longer than the length of extension of the drain electrode layer on the gate linear portions, and not forming Td to be thick partially on the gate curved portions means that it is possible to alleviate the field concentration on the gate curved portions, and it is therefore possible to make the radius of curvature of the gate curved portions small. It is therefore possible to make the interval between parallel gate linear portions narrow, and, by means of high-density integration, a large current capacitance is conceivable. If the length of extension on the gate linear portions is afforded some scope, matching of the length of extension on the gate linear portions to the length on the gate curved portions is permissible.

Since the original function of the field plate of the drain electrode layer is to alleviate the field concentration of the drain region, if the first insulating film is made too thick, the effect of alleviating the field is also diminished. As a rule, when consideration is given to forming a source electrode layer and a drain electrode layer on an interlayer insulating film on the gate electrode layer, it is desirable to apply the principles described hereinabove to the drain field plate that serves to alleviate the field concentration of the extending tip of the drain electrode layer by utilizing the film thickness of this interlayer insulating film.

Therefore, a fifth embodiment of the present invention is the adoption of a field plate upper layer extending multiple structure, and the adoption of a first field plate. In other words, the semiconductor device according to the present invention is constituted having a first field plate, which extends, further than the drain electrode layer, toward the channel side on a second insulating film formed on the drain electrode layer, and which, at least when the MISFET device is OFF, is intended to apply a potential that is substantially the same as the potential of the drain electrode layer. Here, since the length of extension of the first field plate on the drain side is long, the first field plate is capable of alleviating the field concentration of the extending tip of the drain electrode layer and of suppressing a gradual ON current drop.

Particularly if the breakdown drain voltage, when the voltage breakdown sacrificial position directly below the drain region reaches a critical field strength in a state in which the resin covering layer does not cover the drain electrode layer or has been peeled therefrom, is $V_{dabs}$ (V), and if the length of extension $Md_3$ ($\mu$m) of the first field plate from the drain side end of the first insulating film and the total insulating film thickness $Td_3$ ($\mu$m) directly below the extending tip of the first field plate are greater than or equal to lower limit values $Md_{3min}$, $Td_{3min}$ that satisfy the inequalities below, suppression of the gradual ON current drop is satisfactory.

$$350 \leq V_{dabs} \leq 1200;$$

$$Td_{3min} < 62;$$

$$Md_{3min} < 35;$$

$$Md_{3min} \geq -\alpha(Td_{3min} - \beta);$$

where $\alpha = 3500/V_{dabs}$, $\beta = 0.01 V_{dabs}$.

In a case in which $Md_{3min}$ and $Td_{3min}$ satisfy $Td_{3min} \leq 4$ and $Md_{3min} \geq 35-8.75Td_{3min}$, at least for a design withstand voltage of 400V, it is possible to provide a stable semiconductor device that is capable of suppressing a gradual ON current drop.

Further, in a case in which $Md_{3min}$ and $Td_{3min}$ satisfy $Td_{3min} \leq 5$ and $Md_{3min} \geq 35-7Td_{3min}$, at least for a design withstand voltage of 500V, it is possible to provide a stable semiconductor device that is capable of suppressing a gradual ON current drop.

In addition, in a case in which $Md_{3min}$ and $Td_{3min}$ satisfy $Td_{3min} \leq 6$ and $Md_{3min} \geq 35-5.83Td_{3min}$, at least for a design withstand voltage of 600V, it is possible to provide a stable semiconductor device that is capable of suppressing a gradual ON current drop. Further, in a case in which $Md_{3min}$ and $Td_{3min}$ satisfy $Td_{3min} \leq 7$ and $Md_{3min} \geq 35-5Td_{3min}$, at least for a design withstand voltage of 700V, it is possible to provide a stable semiconductor device that is also capable of suppressing a gradual ON current drop.

At this point, in view of the fact that the first field plate is formed in the upper layer of the drain electrode layer, attention will now be directed toward the method of utilizing this first field plate. A semiconductor device comprising a high withstand voltage lateral MISFET device typically has, in a region separate from the region occupied by the MISFET device within the main face side of the first conductivity-type substrate, a control circuit section (also including a protective circuit and the like) for this MISFET device. Therefore, the semiconductor device according to the present invention is characterized in that the drain electrode layer is formed by a first metal layer and the first field plate is formed by a second metal layer, and the control circuit section is constituted using the first and second metal layers as circuitry interconnect wiring layers. By means of high-density integration of the control circuit section, it is possible to increase the proportion of the area occupied by the MISFET device, and consequently a high current capacitance is conceivable, along with a low cost as a result of the small chip size.

Furthermore, the control circuit section may employ a first metal layer as a circuitry interconnect wiring layer and a second metal layer as a shield film to cover at least some of the circuitry. The control circuit section is capable of preventing operational instability caused by floating ions within the resin covering layer and is capable of improving the effect of shielding electromagnetic noise and the like, whereby it is possible to provide a highly reliable semiconductor device.

In a case in which the length of extension of the first field plate on the gate curved portions is longer than the length of extension of the first field plate on the gate linear portions, not forming $Td_3$ to be thick partially on the gate curved portions means that it is possible to alleviate the field concentration on the gate curved portions, and it is therefore possible to make the radius of curvature of the gate curved portions small. It is therefore possible to make the interval between parallel gate linear portions narrow, and, by means of high-density integration, a large current capacitance is conceivable. If the length of extension on the gate linear portions is afforded some scope, matching of the length of extension on the gate linear portions to the length on the gate curved portions is permissible.

The first field plate may be conductively connected with the drain electrode layer by means of a connection hole in the second insulating film (interlayer insulating film, for example). However, even in such a case, the first field plate is a metal continuous film on the drain electrode layer, the second insulating film being interposed therebetween, and this metal continuous film is formed as a drain side covering layer that extends in a planar fashion also beyond the comb-tooth type device planar pattern, and the position of formation of the corresponding connection hole is desirably in the drain side covering layer and away from the gate linear portions and the gate curved portions. It is thus possible to suppress the production of aluminum corrosion and a channel leak current caused by impurities within the resin covering layer permeating into the device. The connection hole may therefore be formed in a section at a distance of approximately 10 μm or more from the gate linear portions and the gate curved portions. However, the connection hole may desirably be formed in the vicinity of a drain pad.

Thus far, the detailed explanation has been divided between the channel field plate and the drain field plate, and has served to show how the improvement of the structure of the channel field plate mainly acts to suppress the gradual withstand voltage drop and to show how the improvement of the structure of the drain field plate is to be associated with the suppression of the gradual ON current drop. However, an explanation will now be provided hereinbelow with respect to the comprehensive field plate structure for which both these relationships have been considered.

The fundamental structure of a semiconductor device that has a high withstand voltage lateral MISFET device is constituted comprising: a first conductivity-type channel region, which is formed on the main face side of a first conductivity-type substrate; a second conductivity-type source region, which is formed on the main face side within the channel region; a second conductivity-type drain region, which is separated from the channel region on the main face side of the first conductivity-type substrate by a second conductivity-type drain drift region therebetween; a gate electrode layer, which backgates the channel region via a gate insulating film and which extends toward the drain side on a first insulating film (a field oxide film, for example) formed on the main face of the drain drift region; a source electrode layer, which is conductively connected with the channel region and the source region; a drain electrode layer, which is conductively connected with the drain region and which extends toward the channel side on a second insulating film (field oxide film, for example) formed on the main face of the drain drift region; and a resin covering layer, which covers the gate electrode layer and the drain electrode layer, a protective film being interposed therebetween. The first insulating film and the second insulating film need not be of the same thickness as a same layer common film. For example, the film thickness of the first insulating film may be formed by selective oxidation to be thicker than the film thickness of the second insulating film. However, typically, to avoid the addition of a further process, these insulating films are desirably field insulating films and constitute films common to the same layer.

In a fundamental structure of this kind, a sixth embodiment of the present invention is characterized in that the breakdown drain voltage, when the voltage breakdown sacrificial position directly below the drain region reaches a critical field strength in a state in which the resin covering layer does not cover the gate electrode layer and drain electrode layer or has been peeled therefrom, is $V_{dabs}$ (V), and in that the length of extension Mc (μm) of the gate electrode layer on the first insulating film, the total insulating film thickness Tc (μm) directly below the extending tip of the gate electrode layer, the length of extension Md (μm) of the drain electrode layer on the second insulating film and the total insulating film thickness Td (μm) directly below the extending tip of the drain electrode layer are greater than or equal to lower limit values $Mc_{min}$, $Tc_{min}$, $Md_{min}$, $Td_{min}$ that satisfy the following inequalities:

$$350 \leq V_{dabs} \leq 1200;$$

$$Tc_{min} \leq \beta;$$

$$Td_{min} \leq \beta;$$

$$Mc_{min} \leq 35;$$

$$Md_{min} \leq 35;$$

$$Mc_{min} \geq -\alpha(Tc_{min}-\beta);$$

$$Md_{min} \geq -\alpha(Td_{min}-\beta);$$

where $\alpha=3500/V_{dabs}$, $\beta=0.01V_{dabs}$.

Even if there is formation of charge accumulation at the interface of the resin covering layer, a gradual withstand voltage drop does not occur, and it is possible to also suppress a gradual ON current drop, whereby it is possible to realize a stable high withstand voltage.

In a case in which $Tc_{min}$, $Td_{min}$, $Mc_{min}$, $Md_{min}$ satisfy:

$$Tc_{min} \leq 4;$$

$$Td_{min} \leq 4;$$

$$Mc_{min} \geq 35-8.75Tc_{min};$$

$Md_{min} \geq 35-8.75Td_{min}$, at least for a withstand voltage of 400V, it is possible to realize a stable semiconductor device that is capable of suppressing a gradual withstand voltage drop and a gradual ON current drop.

In a case in which $Tc_{min}$, $Td_{min}$, $Mc_{min}$, $Md_{min}$ satisfy:

$$Tc_{min} \leq 5;$$

$$Td_{min} \leq 5;$$

$$Mc_{min} \geq 35-7Tc_{min};$$

$Md_{min} \geq 35-7Td_{min}$, at least for a withstand voltage of 500V, it is possible to realize a stable semiconductor device that is capable of suppressing a gradual withstand voltage drop and a gradual ON current drop.

Further, in a case in which $Tc_{min}$, $Td_{min}$, $Mc_{min}$, $Md_{min}$ satisfy:

$$Tc_{min} \leq 6;$$

$$Td_{min} \leq 6;$$

$$Mc_{min} \geq 35 - 5.83 Tc_{min};$$

$Md_{min} \geq 35 - 5.83 Td_{min}$, at least for a withstand voltage of 600V, it is possible to realize a stable semiconductor device that is capable of suppressing a gradual withstand voltage drop and a gradual ON current drop.

Also, in a case in which $Tc_{min}$, $Td_{min}$, $Mc_{min}$, $Md_{min}$ satisfy:

$$Tc_{min} \leq 7;$$

$$Td_{min} \leq 7;$$

$$Mc_{min} \geq 35 - 5 Tc_{min};$$

$Md_{min} \geq 35 - 5 Td_{min}$, at least for a withstand voltage of 700V, it is possible to realize a stable semiconductor device that is capable of suppressing a gradual withstand voltage drop and a gradual ON current drop.

When the unoccupied interval between the gate electrode layer and the drain electrode layer is too narrow, since a risk is incurred of a trap level being produced by the high electric field and in turn of a withstand voltage drop and an ON current drop being generated by trap carriers, a minimum value of 2 µm is necessary for this unoccupied interval. Also in consideration of reliability and so forth at the protective film interface, it is by no means desirable that the unoccupied interval should be narrow. When the unoccupied interval is too narrow, a distribution is generated in which all the equipotential lines directly below the unoccupied interval are in close proximity, and there is consequently a risk of the generation of a field concentration here. Indeed, higher withstand voltage devices entail an increasing requirement for a long length of extension for the gate electrode layer and the drain electrode layer to suppress a gradual withstand voltage drop. However, it is expedient that, since the drain drift region is then also long, there is scope for being able to make the unoccupied interval relatively large, for example on the order of 50 µm for a withstand voltage of 700V or more.

Furthermore, the MISFET device has a comb-tooth type device planar pattern extending in a gate width direction and in which gate linear portions and gate curved portions are alternately repeated and connected to one another, and it is desirable that the length of extension of the gate electrode layer on the gate curved portions should be longer than the length of extension of the gate electrode layer on the gate linear portions, and that the length of extension of the drain electrode layer on the gate curved portions should be longer than the length of extension of the drain electrode layer on the gate linear portions. Not forming $Tc_{min}$ or $Td_{min}$ to be thick partially on the gate curved portions means that it is possible to alleviate the field concentration on the gate curved portions, and it is therefore possible to make the radius of curvature of the gate curved portions small. It is therefore possible to make the interval between parallel gate linear portions narrow, and, by means of high-density integration, a large current capacitance is conceivable. If the length of extension on the gate linear portions is afforded some scope, matching of the length of extension on the gate linear portions to the length on the gate curved portions is permissible.

To ensure, in a straightforward manner, that the film thickness of Tc is thick, use of the interlayer insulating film is desirable. Therefore, a seventh embodiment of the present invention is to have a first field plate, which extends, further than the gate electrode layer, toward the drain side on a third insulating film formed on the gate electrode layer, and which, at least when the MISFET device is OFF, is intended to apply a potential that is substantially the same as the potential of the gate electrode layer or the source electrode layer. Further, the seventh embodiment of the present invention is characterized in that the breakdown drain voltage, when the voltage breakdown sacrificial position directly below the drain region reaches a critical field strength in a state in which the resin covering layer does not cover the gate electrode layer and the drain electrode layer or has been peeled therefrom, is $V_{dabs}$ (V), and the length of extension $Mc_1$ (µm) of the first field plate from the source side end of the first insulating film, the total insulating film thickness $Tc_1$ (µm) directly below the extending tip of the first field plate, the length of extension Md (µm) of the drain electrode layer on the second insulating film and the total insulating film thickness Td (µm) directly below the extending tip of the drain electrode layer are greater than or equal to lower limit values $Mc_{1min}$, $Tc_{1min}$, $Md_{min}$, $Td_{min}$ that satisfy the following inequalities:

$$350 \leq V_{dabs} \leq 1200;$$

$$Tc_{1min} \leq \beta;$$

$$Td_{min} \leq \beta;$$

$$Mc_{1min} \leq 35;$$

$$Md_{min} \leq 35;$$

$$Mc_{1min} \geq -\alpha(Tc_{1min} - \beta);$$

$$Md_{min} \geq -\alpha(Td_{min} - \beta);$$

where $\alpha = 3500/V_{dabs}$, $\beta = 0.01 V_{dabs}$.

Even if there is formation of charge accumulation at the interface of the resin covering layer, a gradual withstand voltage drop does not occur, and it is possible to also suppress a gradual ON current drop, whereby it is possible to realize a stable high withstand voltage.

In a case in which $Tc_{1min}$, $Td_{min}$, $Mc_{1min}$, $Md_{min}$ satisfy:

$$Tc_{1min} \leq 4;$$

$$Td_{min} \leq 4;$$

$$Mc_{1min} \geq 35 - 8.75 Tc_{1min};$$

$Md_{min} \geq 35 - 8.75 Td_{min}$, at least for a withstand voltage of 400V, it is possible to realize a stable semiconductor device that is capable of suppressing a gradual withstand voltage drop and a gradual ON current drop.

In a case in which $Tc_{1min}$, $Td_{min}$, $Mc_{1min}$, $Md_{min}$ satisfy:

$$Tc_{1min} \leq 5;$$

$$Td_{min} \leq 5;$$

$$Mc_{1min} \geq 35 - 7 Tc_{1min};$$

$Md_{min} \geq 35 - 7 Td_{min}$, at least for a withstand voltage of 500V, it is possible to realize a stable semiconductor device that is capable of suppressing a gradual withstand voltage drop and a gradual ON current drop.

Further, in a case in which $Tc_{1min}$, $Td_{min}$, $Mc_{1min}$, $Md_{min}$ satisfy:

$$Tc_{1min} \leq 6;$$

$$Td_{min} \leq 6;$$

$$Mc_{1min} \geq 35 - 5.83 Tc_{1min};$$

$Md_{min} \geq 35 - 5.83 Td_{min}$, at least for a withstand voltage of 600V, it is possible to realize a stable semiconductor device that is capable of suppressing a gradual withstand voltage drop and a gradual ON current drop.

Also, in a case in which $Tc_{1min}$, $Td_{min}$, $Mc_{1min}$, $Md_{min}$ satisfy:

$$Tc_{1min} \leq 7;$$

$$Td_{min} \leq 7;$$

$$Mc_{1min} \geq 35 - 5 Tc_{1min};$$

$Md_{min} \geq 35 - 5 Td_{min}$, at least for a withstand voltage of 700V, it is possible to realize a stable semiconductor device that is capable of suppressing a gradual withstand voltage drop and a gradual ON current drop.

Here too, the unoccupied interval between the first field plate and the drain electrode layer is desirably greater than or equal to 2 $\mu$m.

It is desirable that the length of extension of the first field plate on the gate curved portions should be longer than the length of extension of the first field plate on the gate linear portions, and that the length of extension of the drain electrode layer on the gate curved portions should be longer than the length of extension of the drain electrode layer on the gate linear portions. It is possible to alleviate the field concentration on the gate curved portions, and it is therefore possible to make the radius of curvature of the gate curved portions small. It is therefore possible to make the interval between parallel gate linear portions narrow, and, by means of high-density integration, a large current capacitance is conceivable. If the length of extension on the gate linear portions is afforded some scope, matching of the length of extension on the gate linear portions to the length on the gate curved portions is permissible.

The first field plate may be conductively connected with the gate electrode layer by means of a connection hole in the third insulating film. Further, the first field plate may be formed as a layer common also to the source electrode layer.

As a multiple field plate structure, an eighth embodiment of the present invention is characterized by having: a first field plate, which extends, further than the gate electrode layer, toward the drain side on a third insulating film formed on the gate electrode layer, and which, at least when the MISFET device is OFF, is intended to apply a potential that is substantially the same as the potential of the gate electrode layer or the source electrode layer; a second field plate, which extends, further than the first field plate, toward the drain side on a fourth insulating film formed on the first field plate, and which, at least when the MISFET device is OFF, is intended to apply a potential that is substantially the same as the potential of the gate electrode layer or the source electrode layer; and a third field plate, which extends, further than the drain electrode layer, toward the channel side on a fifth insulating film formed on the drain electrode layer, and which, at least when the MISFET device is OFF, is intended to apply a potential that is substantially the same as the potential of the drain electrode layer.

Since the length of extension of the second and third field plates is inevitably long, it is possible to realize a stable semiconductor device that is capable of suppressing a gradual withstand voltage drop and a gradual ON current drop.

In concrete terms, if the breakdown drain voltage, when the voltage breakdown sacrificial position directly below the drain region reaches a critical field strength in a state in which the resin covering layer does not cover the gate electrode layer and the drain electrode layer or has been peeled therefrom, is $V_{dabs}$ (V), and the length of extension $Mc_2$ ($\mu$m) of the second field plate from the source side end of the first insulating film, the total insulating film thickness $Tc_2$ ($\mu$m) directly below the extending tip of the second field plate, the length of extension $Md_3$ ($\mu$m) of the third field plate from the drain side end of the second insulating film, and the total insulating film thickness $Td_3$ ($\mu$m) directly below the extending tip of the third field plate are greater than or equal to lower limit values $Mc_{2min}$, $Tc_{2min}$, $Md_{3min}$, $Td_{3min}$ that satisfy the following inequalities, reliable suppression of the gradual withstand voltage drop and the gradual ON current drop can be achieved.

$$350 \leq V_{dabs} \leq 1200;$$

$$Tc_{2min} \leq \beta;$$

$$Td_{3min} \leq \beta;$$

$$Mc_{2min} \leq 35;$$

$$Md_{3min} \leq 35;$$

$$Mc_{2min} \geq -\alpha(Tc_{2min} - \beta);$$

$$Md_{3min} \geq -\alpha(Td_{3min} - \beta);$$

where $\alpha = 3500/V_{dabs}$, $\beta = 0.01 V_{dabs}$.

In a case in which $Tc_{2min}$, $Td_{3min}$, $Mc_{2min}$, $Md_{3min}$ satisfy:

$$Tc_{2min} \leq 4;$$

$$Td_{3min} \leq 4;$$

$$Mc_{2min} \geq 35 - 8.75 Tc_{2min};$$

$Md_{3min} \geq 35 - 8.75 Td_{3min}$, at least for a withstand voltage of 400V, it is possible to realize a stable semiconductor device that is capable of suppressing a gradual withstand voltage drop and a gradual ON current drop.

In a case in which $Tc_{2min}$, $Td_{3min}$, $Mc_{2min}$, $Md_{3min}$ satisfy:

$$Tc_{2min} \leq 5;$$

$$Td_{3min} \leq 5;$$

$$Mc_{2min} \geq 35 - 7 Tc_{2min};$$

$Md_{3min} \geq 35 - 7 Td_{3min}$, at least for a withstand voltage of 500V, it is possible to realize a stable semiconductor device that is capable of suppressing a gradual withstand voltage drop and a gradual ON current drop.

Further, in a case in which $Tc_{2min}$, $Td_{3min}$, $Mc_{2min}$, $Md_{3min}$ satisfy:

$$Tc_{2min} \leq 6;$$

$$Td_{3min} \leq 6;$$

$$Mc_{2min} \geq 35 - 5.83 Tc_{2min};$$

$Md_{3min} \geq 35 - 5.83 Td_{3min}$, at least for a withstand voltage of 600V, it is possible to realize a stable semiconductor device that is capable of suppressing a gradual withstand voltage drop and a gradual ON current drop.

Also, in a case in which $Tc_{2min}$, $Td_{3min}$, $Mc_{2min}$, $Md_{3min}$ satisfy:

$$Tc_{2min} \leq 7;$$

$$Td_{3min} \leq 7;$$

$$Mc_{2min} \geq 35 - 5Tc_{2min};$$

$Md_{3min} \geq 35 - 5Td_{3min}$, at least for a withstand voltage of 700V, it is possible to realize a stable semiconductor device that is capable of suppressing a gradual withstand voltage drop and a gradual ON current drop.

In view of the fact that the second field plate and the third field plate are formed in the upper layers of the source electrode layer and the drain electrode layer respectively, attention will now be directed toward the method of utilizing these upper layers. A semiconductor device comprising a high withstand voltage lateral MISFET device typically has, in a region separate from the region occupied by the MISFET device within the main face side of the first conductivity-type substrate, a control circuit section (also including a protective circuit and the like) for this MISFET device. Therefore, the semiconductor device according to the present invention is characterized in that the first field plate and the drain electrode layer are formed by a first metal layer and the second field plate and the third field plate are formed by a second metal layer, and the control circuit section is constituted using the first and second metal layers as circuitry interconnect wiring layers. By means of high-density integration of the control circuit section, it is possible to increase the proportion of the area occupied by the MISFET device, and consequently a high current capacitance is conceivable, along with a low cost as a result of the small chip size.

Further, the first metal layer may be used as a circuitry interconnect wiring layer, and the second metal layer may be used as a shield film to cover at least some of the circuitry. The control circuit section is capable of preventing operational instability caused by floating ions within the resin covering layer and is capable of improving the effect of shielding electromagnetic noise and the like, whereby it is possible to provide a highly reliable semiconductor device.

With regard to the upper limit value for the field plates, the unoccupied interval between the second field plate and the third field plate is desirably greater than or equal to 2 $\mu$m. This serves to suppress a withstand voltage drop and an ON current drop caused by trap carriers on the basis of the generation of a trap level caused by a high electric field.

The length of extension of the second field plate on the gate curved portions may be made longer than the length of extension of the second field plate on the gate linear portions, and the length of extension of the third field plate on the gate curved portions may be made longer than the length of extension of the third field plate on the gate linear portions. It is possible to alleviate the field concentration on the gate curved portions, and it is therefore possible to make the radius of curvature of the gate curved portions small. It is therefore possible to make the interval between parallel gate linear portions narrow, and, by means of high-density integration, a large current capacitance is conceivable. if the length of extension on the gate linear portions is afforded some scope, matching of the length of extension on the gate linear portions to the length on the gate curved portions is permissible.

The first field plate may be conductively connected with the gate electrode layer by means of the first connection hole in the third insulating film. In such a case, the second field plate may be conductively connected with the first field plate by means of a second connection hole in a fourth insulating film, the second field plate may be conductively connected with the source electrode layer by means of the second connection hole in the fourth insulating film, and the third field plate may be conductively connected with the drain electrode layer by means of a third connection hole in a fifth insulating film. Moreover, since a protective film is formed on the second and third connection holes, if the step coverage of the protective film, which results from the difference in level of the second and third connection holes, is insufficient, there is a problem of localized deterioration of the film material. Particularly in actual use under high-humidity conditions, if impurities within the resin covering layer pass through the deteriorated section of the protective film by means of moisture so as to permeate inside the device, there is a risk that aluminum corrosion will occur and that a channel leak current will be generated.

Therefore, a characteristic feature is that the second field plate is formed, as a source side covering layer that extends in a planar fashion also beyond the comb-tooth type device planar pattern, by a metal continuous film on the source electrode layer, the fourth insulating film being interposed therebetween, and the third field plate is formed, as a drain side covering layer that extends in a planar fashion also beyond the comb-tooth type device planar pattern, by a metal continuous film on the drain electrode layer, the fifth insulating film being interposed therebetween, and the position of formation of the second connection hole is in the source side covering layer and away from the gate linear portions and the gate curved portions, and the position of formation of the third connection bole is in the drain side covering layer and away from the gate linear portions and the gate curved portions. It is thus possible to suppress the production of aluminum corrosion and a channel leak current caused by impurities within the resin covering layer permeating into the device. The second and third connection holes may therefore be formed in a section at a distance of approximately 10 $\mu$m or more from the gate linear portions and the gate curved portions. However, the second connection hole and the third connection hole may desirably be formed in the vicinity of a source pad and in the vicinity of a drain pad respectively.

The second field plate may be formed as a layer common also to the source electrode layer. In such a case, the total insulating film thickness directly below the source electrode layer is thick.

Meanwhile, in a case in which the first field plate is formed as a layer common also to the source electrode layer, typically, connection relationships can be adopted according to which the second field plate may be conductively connected with the source electrode layer by means of a first connection hole in the fourth insulating film, and the third field plate may be conductively connected with the drain electrode layer by means of a second connection hole in the fifth insulating film. Also in a case such as this, the second field plate is a metal continuous film on the source electrode layer, the third insulating film being interposed therebetween, and this metal continuous film is formed as a source side covering layer that extends in a planar fashion also beyond the comb-tooth type device planar pattern; the third field plate is a metal continuous film on the drain electrode layer, the fifth insulating film being interposed therebetween, and this metal continuous film is formed as a drain side covering layer that extends in a planar fashion also beyond the comb-tooth type device planar pattern; and the position of formation of the first connection hole is desirably in the source side covering layer and away from the gate linear portions and the gate curved portions, and the position of formation of the second connection hole is desirably in the drain side covering layer and away from the gate linear portions and the gate curved portions. It is thus possible to suppress the production of aluminum corrosion and a channel leak current caused by impurities within the resin covering layer permeating into the device. A connection hole may therefore be formed in a section at a distance of approximately 10 $\mu$m or more from the gate linear portions and the gate curved portions. However, the first connection hole and the second connection hole may desirably be formed in the vicinity of a source pad and in the vicinity of a drain pad respectively.

Due to the fact that conventional high withstand voltage semiconductor devices were known to generate a gradual withstand voltage drop as a result of growth in charge accumulation during actual use, with the object of precipitating the extension of the depletion layer of the drain drift region, a high resistance for the drain drift region was inevitable. For this reason, since it was not possible to lower the ON resistance, and since, on the drain side, a partial constriction of the electrical path was gradually produced, which brought about a drop in the ON resistance, an improvement of the ON resistance was not possible. However, according to the above-mentioned first through third and sixth through eighth embodiments of the present invention, as a result of the benefit of being able to suppress a gradual withstand voltage drop, it is possible to make the impurity concentration of the drain drift region two or more times greater than conventionally, that is, to make the amount of charge per unit area at least $1\times10^{12}/cm^3$ and no more than $3\times10^{12}/cm^3$, which paves the way for an attempt to afford the drain drift region a low resistance. As a result, it is possible to increase the ON current in comparison with conventional practice. Moreover, on account of being able to suppress partial depletion on the drain side in an ON state and thus an inversion of conductivity type, it is possible to realize a large current capacitance.

On the other hand, according to the above-mentioned fourth and fifth embodiments of the present invention, since it is possible to suppress a field concentration on the drain side in an ON state, it is possible to suppress partial depletion and an inversion of the conductivity type. However, if the impurity concentration of the drain drift region is made two or more times greater than conventionally, i.e. if the amount of charge per unit area is at least $1\times10^{12}/cm^3$ and no more than $3\times10^{12}/cm^3$, since it is possible to suppress partial depletion and an inversion of the conductivity type, on the drain side in an ON state, it is all the more possible to realize a large current capacitance.

The impurity concentration of the drain drift region may be high as described above, but it is more favorable to form the drain region within a second conductivity type well which is formed on the main face side of the first conductivity type semiconductor substrate and to make the impurity concentration of the second conductivity type well higher than the impurity concentration of the drain drift region. The inclusion of a second conductivity type well of relatively high concentration in the drain side essentially shortens the resistive length of the drain drift region, meaning that a reduction in the ON resistance is possible. Moreover, the withstand voltage can thus be reliably rate-limited on the drain side, whereby it is also possible to ensure stability.

Furthermore, in a case in which a first conductivity type top region is provided in the main face of the drain drift region, a MISFET device of this kind is capable of preventing penetration by hot electrons into the field insulating film caused by avalanche breakdown that is readily produced at the main face of the drain drift region, and thus makes it possible for a high withstand voltage to be obtained. However, in addition to also being capable of alleviating the field concentration in the section directly below the extending tip of the source field plate within the main face of the drain drift region and therefore being capable of suppressing a gradual withstand voltage drop while achieving a high withstand voltage, since there is no depletion in the ON state in the section directly below the extending tip of the drain field plate, this MISFET device is also capable of suppressing a gradual ON current drop.

Further, with regard to the voltage breakdown sacrificial position, a position is defined in advance in which avalanche breakdown occurs as a result of induced charge and so forth, and this position is directly below the drain region and within the PN junction face of the first conductivity type substrate and the drain drift region to permit the rapid extraction of excess electrons and holes when avalanche breakdown is generated to thereby obtain operational stability. The first conductivity type substrate is at substantially the same potential as the source potential as a result of the channel region lying therebetween. However, a drop to the ground potential is particularly favorable for the substrate through contact of the substrate rear face with the ground by means of a lead frame die pad or similar.

BRIEF DESCRIPTION OF THE DRAWINGS

The invention will now be described with reference to certain preferred embodiments thereof and the accompanying drawings, wherein:

FIG. 28(B), which is a graph in which the gradual ON current drop, when the application time is zero, is shown normalized as 1; and FIG. 28(C), which is a graph to show a comparison with respect to the gradual withstand voltage drop.

DETAILED DESCRIPTION OF THE PREFERRED EMBODIMENTS

The embodiments of the present invention will be described hereinbelow on the basis of the appended figures. Indeed, hereinbelow, layers and regions designated by N(n) and P(p) respectively denote layers and regions with a multiplicity of carriers respectively constituted by electrons and positive holes. Further, the superscript character "+" signifies a relatively high impurity concentration and the superscript character "−" signifies a relatively low impurity concentration.

First Embodiment

Figure 1:
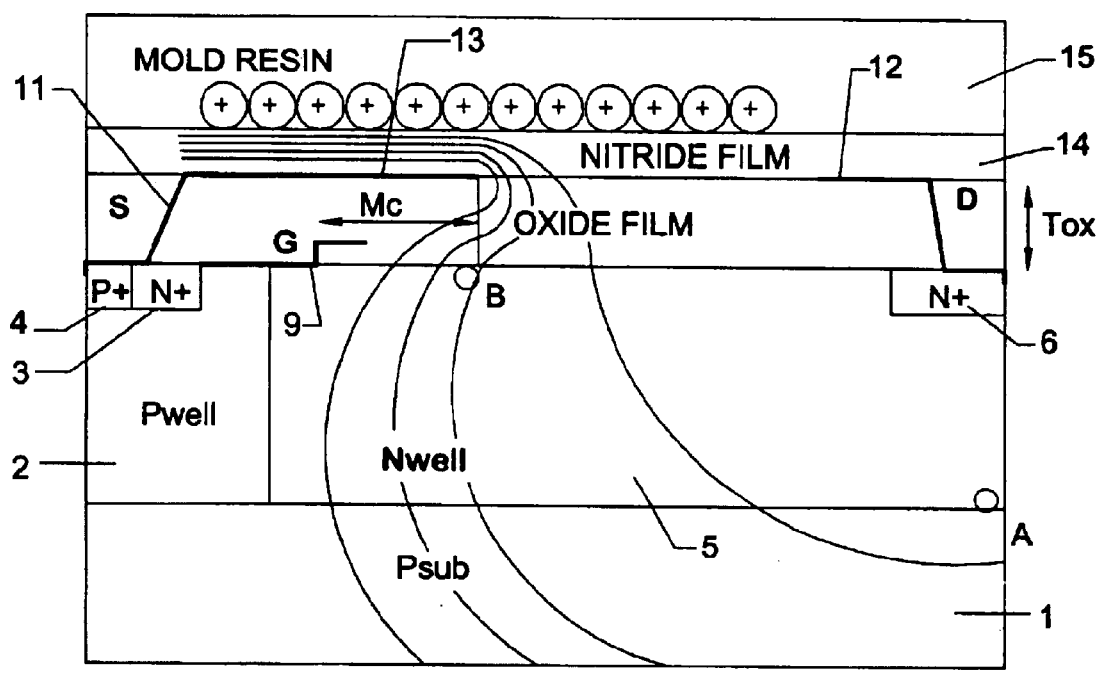
FIG. 1 is a two-dimensional device simulation figure to show the distribution of equipotential lines in a state in which a charge accumulation layer is formed at the interface with the mold resin in a case in which a drain voltage of 700V is applied in an OFF state in a high withstand voltage lateral MISFET device with a design withstand voltage of 700V and in which the length of extension Mc of the channel field plate=10 $\mu$m, the insulating film thickness Tx=2 $\mu$m, and the length Ld of the drain drift region=60 $\mu$m.
Figure 2:
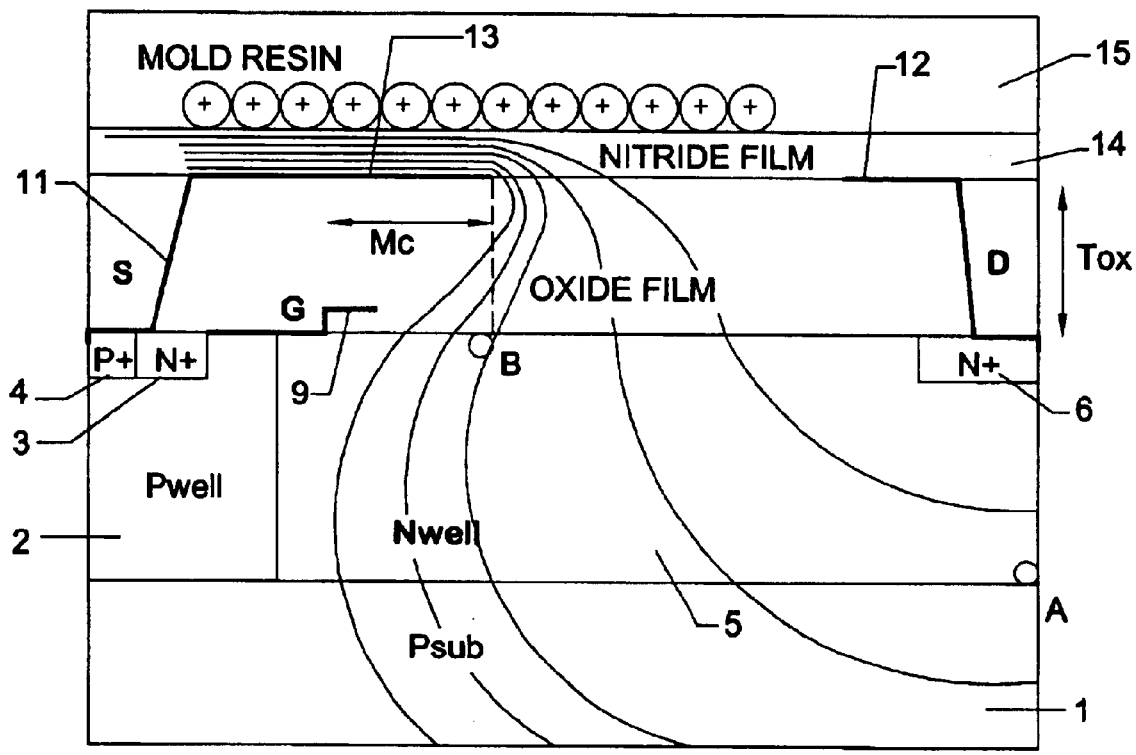
FIG. 2 is a two-dimensional device simulation figure to show the distribution of equipotential lines in a state in which a charge accumulation layer is formed at the interface with the mold resin in a case in which a drain voltage of 700V is applied in an OFF state in a high withstand voltage lateral MISFET device with a design withstand voltage of 700 V and in which the length of extension Mc of the channel field plate=10 $\mu$m, the film thickness Tx of the insulating film=4 $\mu$m, and the drain drift region length Ld=60 $\mu$m.
Figure 3:
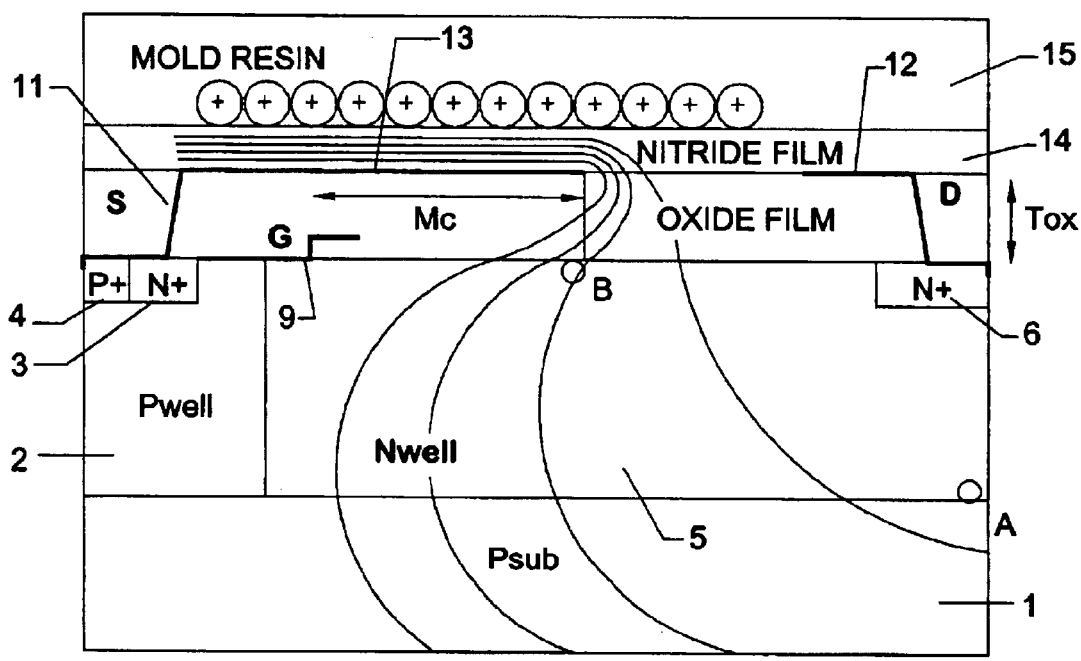
FIG. 3 is a two-dimensional device simulation figure to show the distribution of equipotential lines in a state in which a charge accumulation layer is formed at the interface with the mold resin in a case in which a drain voltage of 700V is applied in an OFF state in a high withstand voltage lateral MISFET device with a design withstand voltage of 700V and in which the length of extension Mc of the channel field plate=25 $\mu$m, the film thickness Tx of the insulating film=2 $\mu$m, and the drain drift region length Ld=60 $\mu$m.
Figure 4:
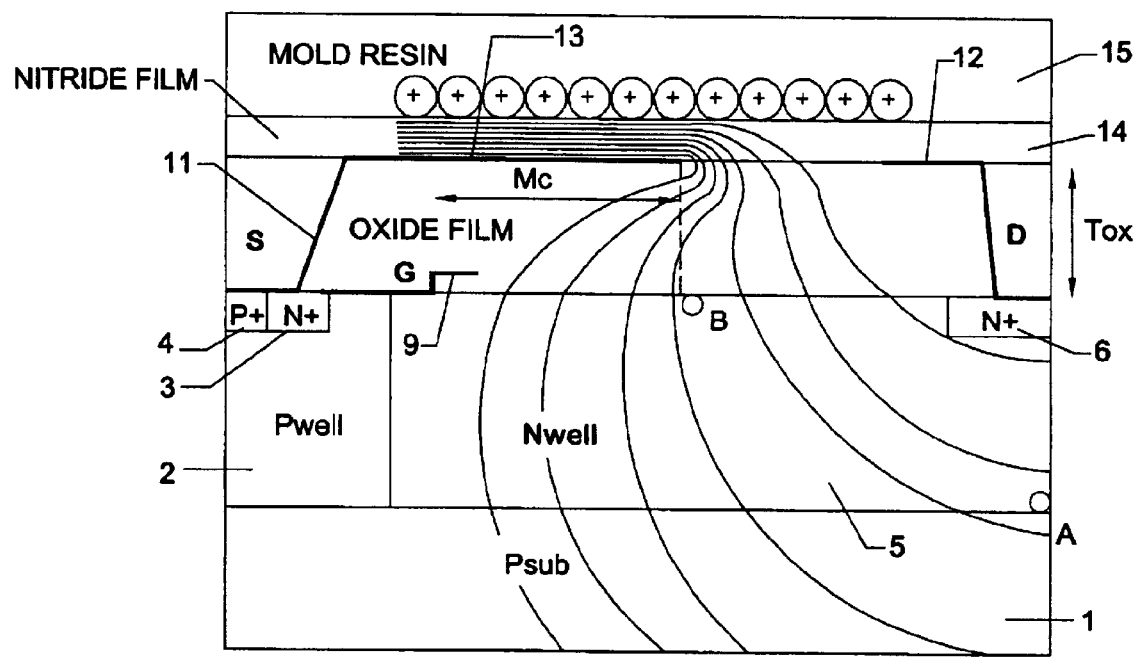
FIG. 4 is a two-dimensional device simulation figure to show the distribution of equipotential lines in a state in which a charge accumulation layer is formed at the interface with the mold resin in a case in which a drain voltage of 700V is applied in an OFF state in a high withstand voltage lateral MISFET device with a design withstand voltage of 700V and in which the length of extension Mc of the channel field plate=25 μm, the film thickness Tx of the insulating film=4 μm, and the drain drift region length Ld=60 μm.
Figure 5:
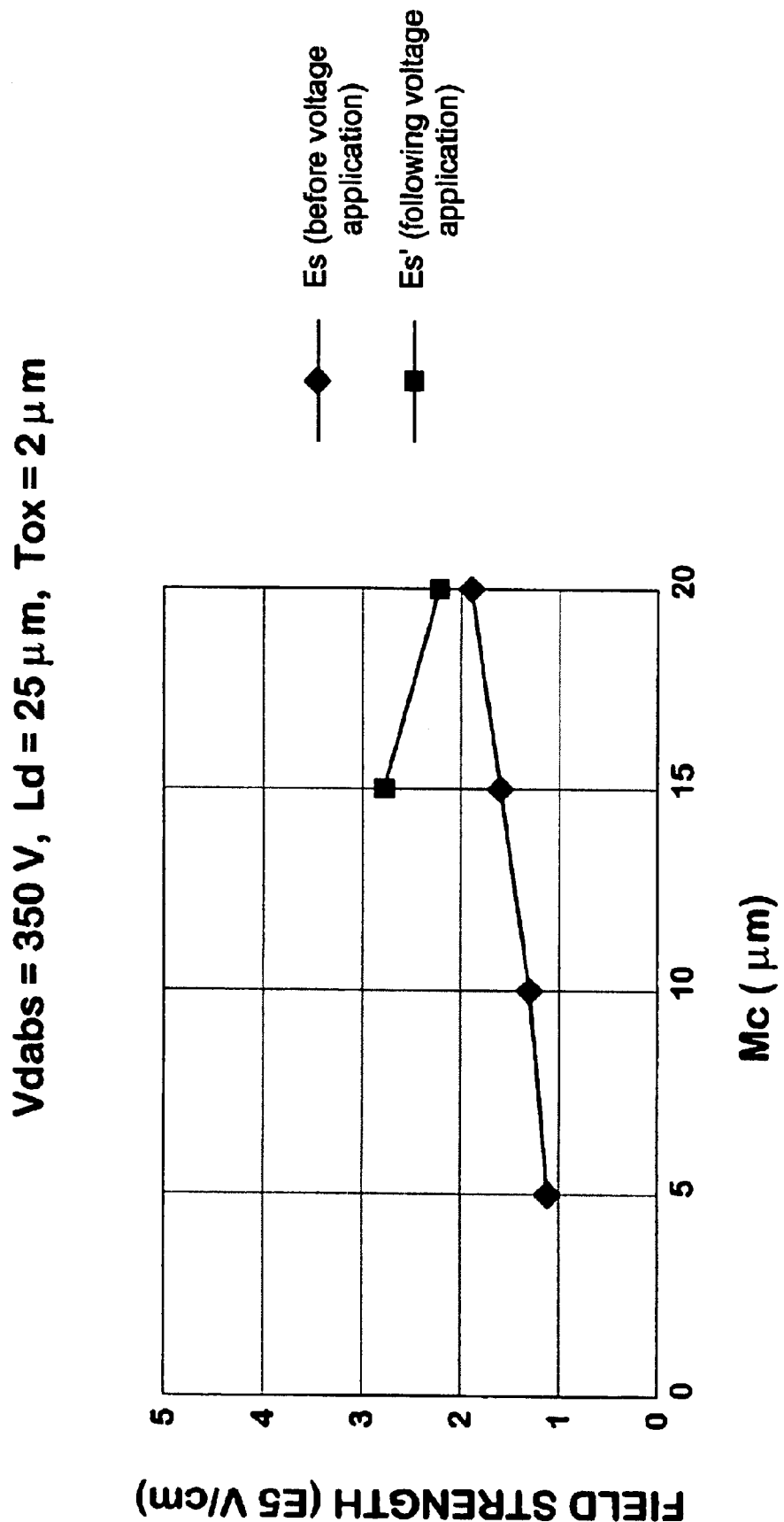
FIG. 5 is a device simulation figure to show the field plate extension length Mc dependence, of the field strength Es directly below the tip of the channel field plate in a state in which the mold resin does not cover the device or has been peeled therefrom or in an initial state (before voltage application) in which there is no charge accumulation whatever, and of the field strength Es' directly below the tip of the channel field plate during actual use (following voltage application) when charge accumulation is produced such that the potential on the protective film becomes the drain potential, in a high withstand voltage lateral MISFET device in which the breakdown drain voltage is 350V, the drain drift length Ld=25 μm, and the film thickness Tox of the insulating film=2 μm.
Figure 6:
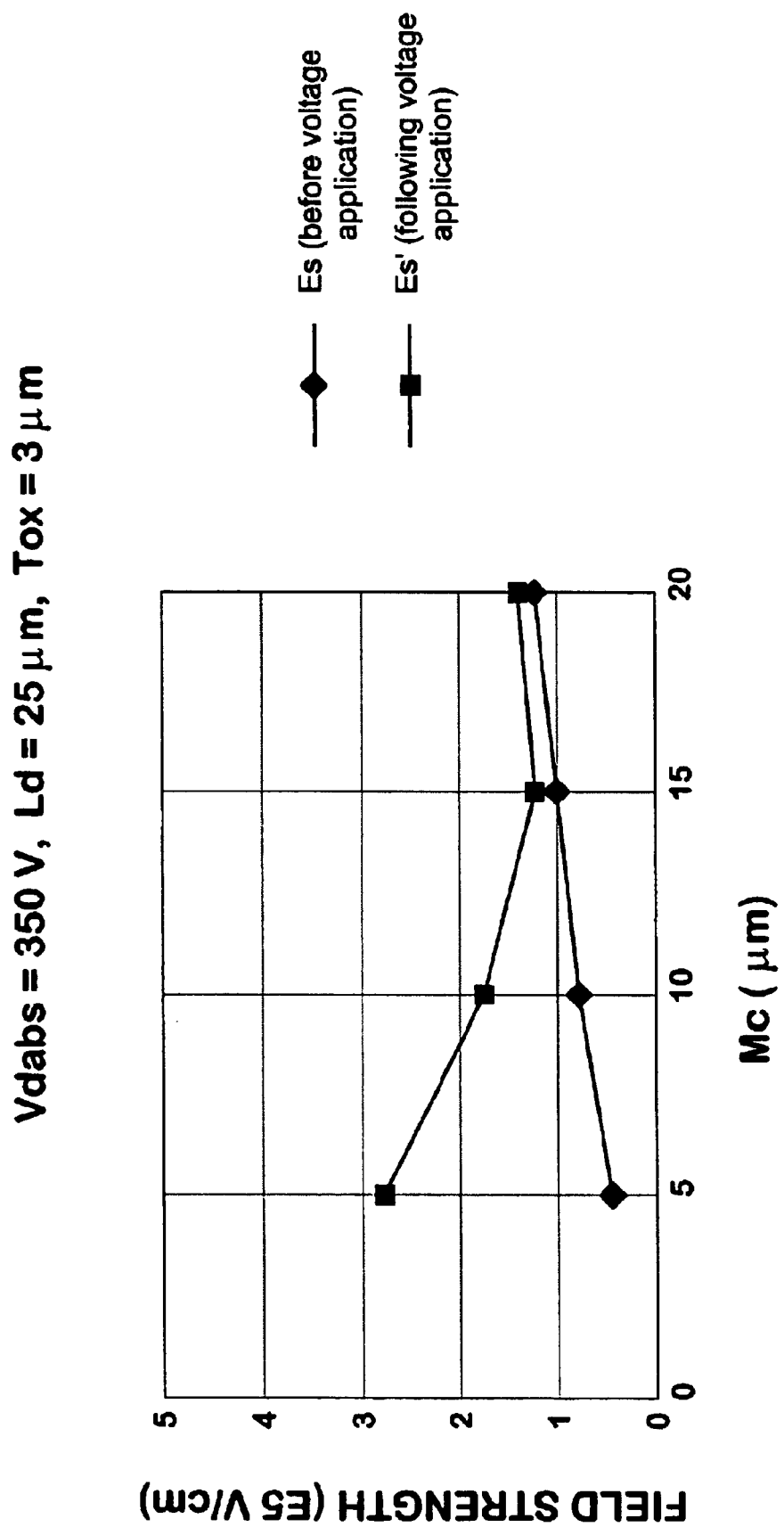
FIG. 6 is a device simulation figure to show the field plate extension length Mc dependence, of the field strength Es directly below the tip of the channel field plate in a state in which the mold resin does not cover the device or has been peeled therefrom or in an initial state (before voltage application) in which there is no charge accumulation whatever, and of the field strength Es' directly below the tip of the channel field plate during actual use (following voltage application) when charge accumulation is produced such that the potential on the protective film becomes the drain potential, in a high withstand voltage lateral MISFET device in which the breakdown drain voltage is 350V, the drain drift length Ld=25 μm, and the film thickness Tox of the insulating film=3 μm.
Figure 7:
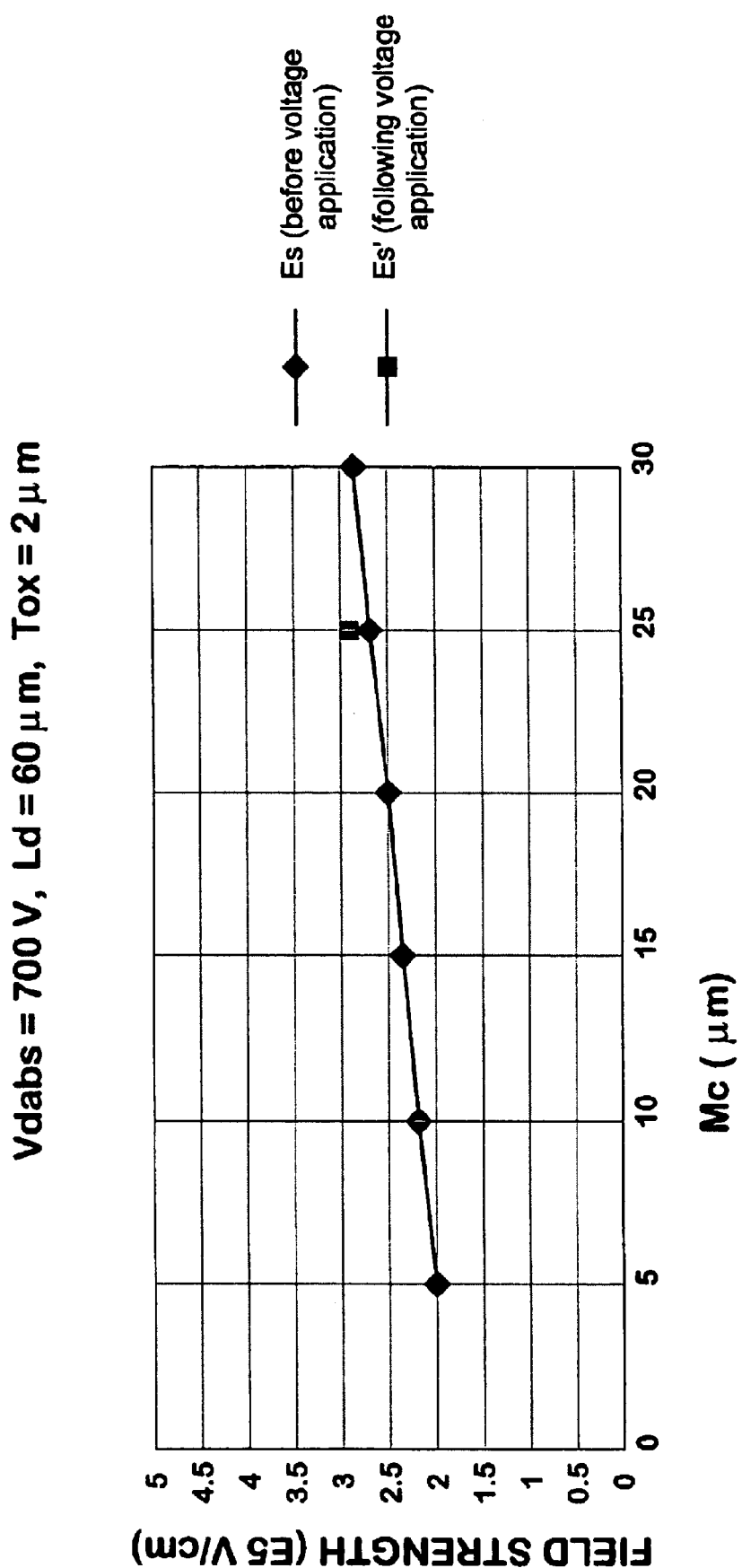
FIG. 7 is a device simulation figure to show the field plate extension length Mc dependence, of the field strength Es directly below the tip of the channel field plate in a state in which the mold resin does not cover the device or has been peeled therefrom or in an initial state (before voltage application) in which there is no charge accumulation whatever, and of the field strength Es' directly below the tip of the channel field plate during actual use (following voltage application) when charge accumulation is produced such that the potential on the protective film becomes the drain potential, in a high withstand voltage lateral MISFET device in which the breakdown drain voltage is 700V, the drain drift length Ld=60 μm, and the film thickness Tox of the insulating film=2 μm.
Figure 8:
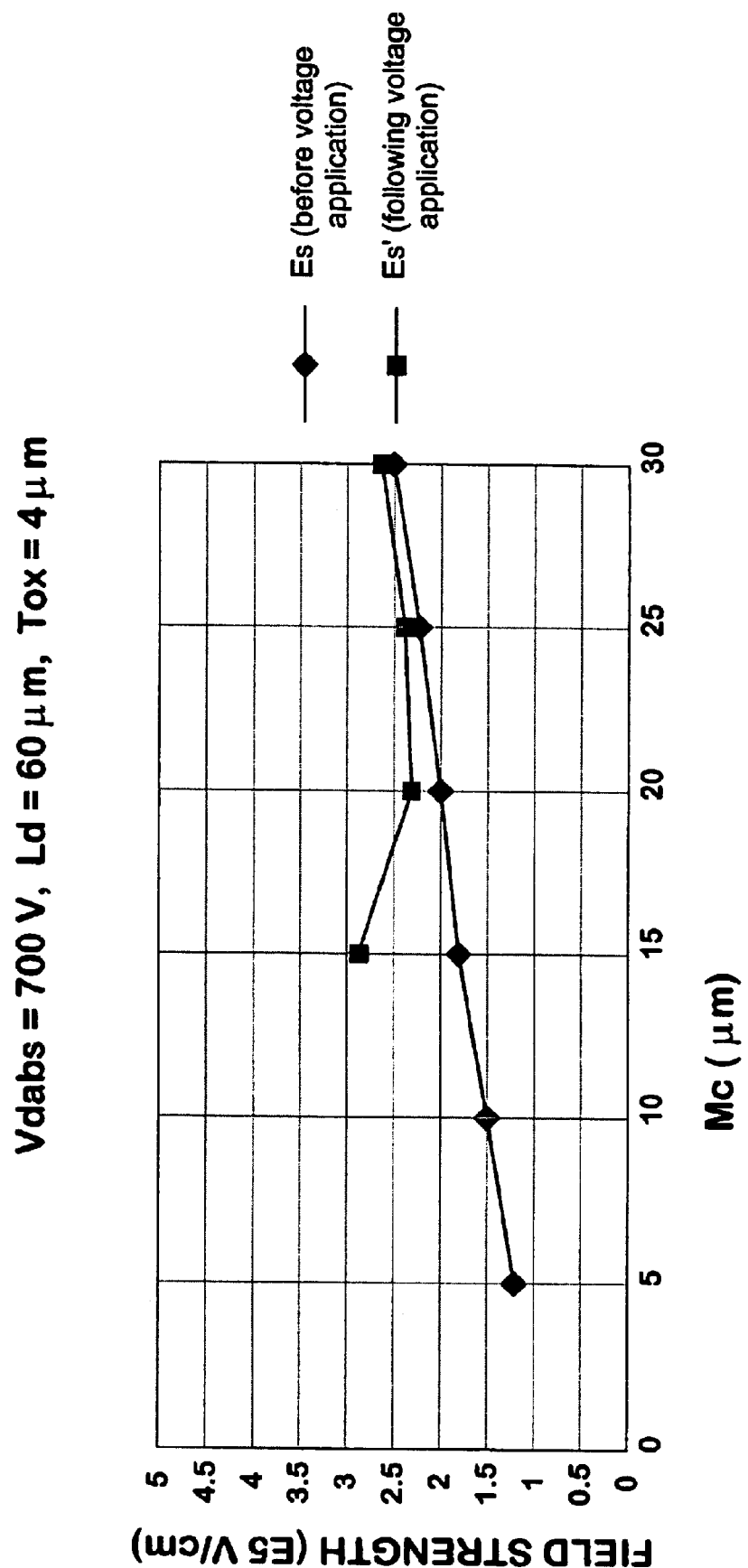
FIG. 8 is a device simulation figure to show the field plate extension length Mc dependence, of the field strength Es directly below the tip of the channel field plate in a state in which the mold resin does not cover the device or has been peeled therefrom or in an initial state (before voltage application) in which there is no charge accumulation whatever, and of the field strength Es' directly below the tip of the channel field plate during actual use (following voltage application) when charge accumulation is produced such that the potential on the protective film becomes the drain potential, in a high withstand voltage lateral MISFET device in which the breakdown drain voltage is 700V, the drain drift length Ld=60 μm, and the film thickness Tox of the insulating film=4 μm.
Figure 9:
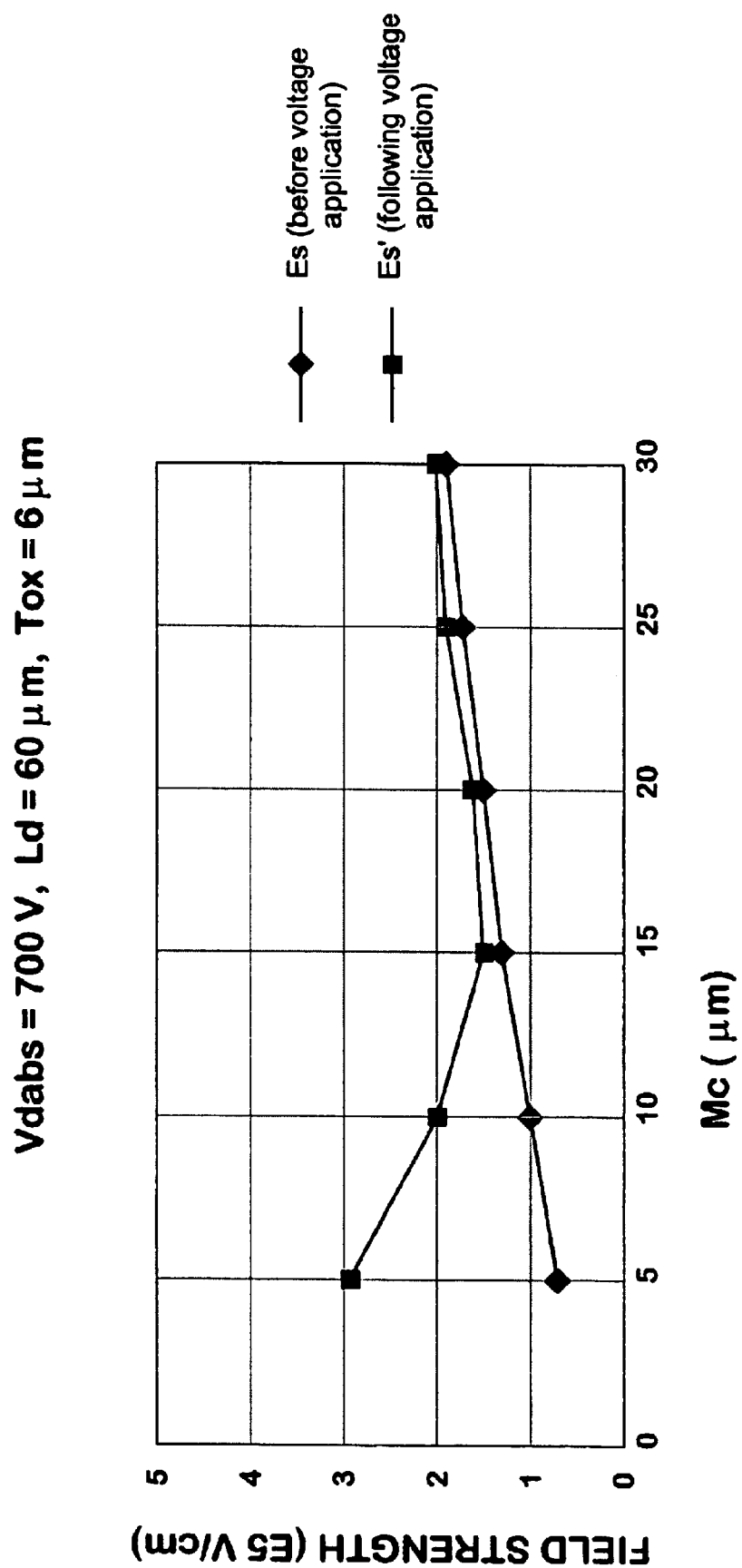
FIG. 9 is a device simulation figure to show the field plate extension length Mc dependence, of the field strength Es directly below the tip of the channel field plate in a state in which the mold resin does not cover the device or has been peeled therefrom or in an initial state (before voltage application) in which there is no charge accumulation whatever, and of the field strength Es' directly below the tip of the channel field plate during actual use (following voltage application) when charge accumulation is produced such that the potential on the protective film becomes the drain potential, in a high withstand voltage lateral MISFET device in which the breakdown drain voltage is 700V, the drain drift length Ld=60 μm, and the film thickness Tox of the insulating film=6 μm.
Figure 10:
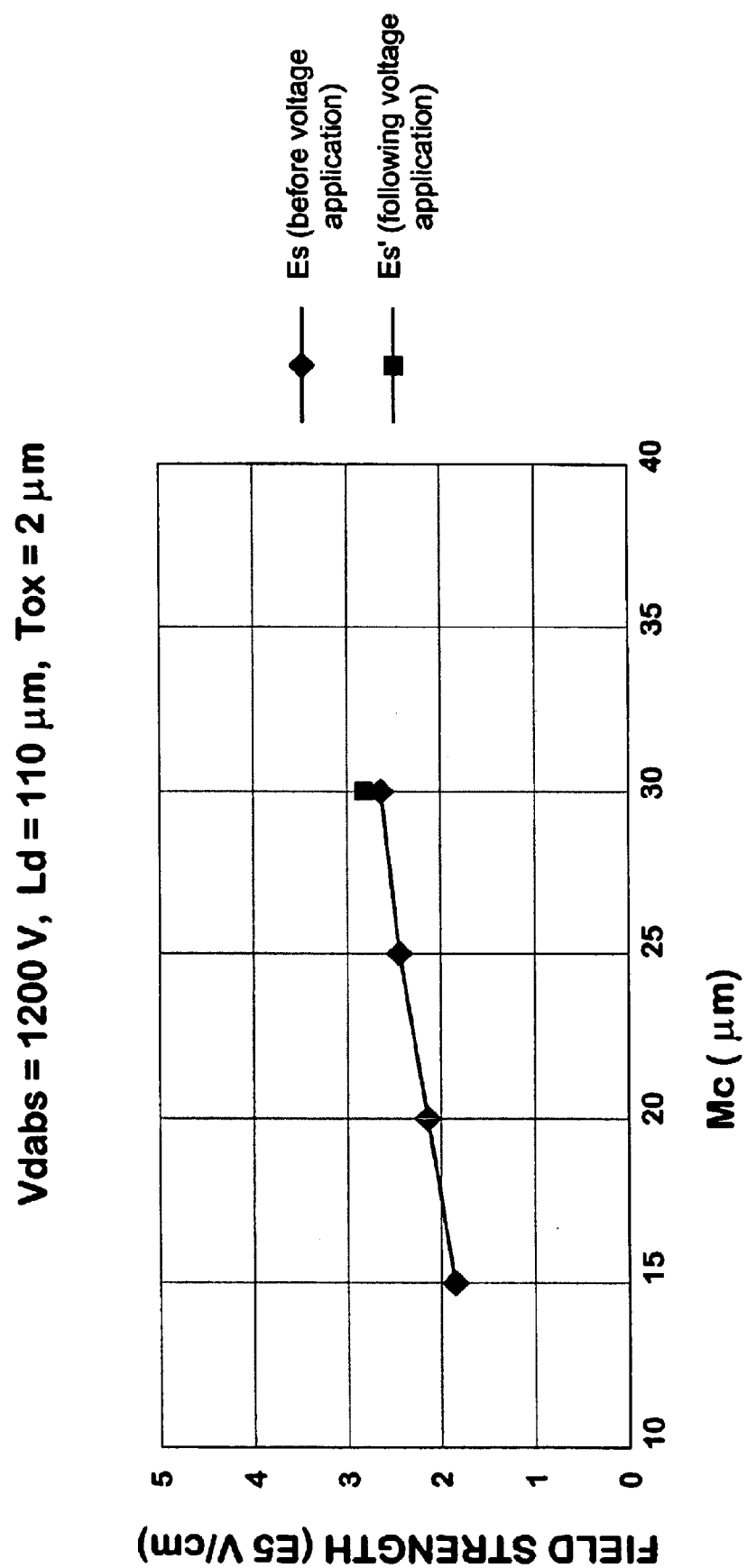
FIG. 10 is a device simulation figure to show the field plate extension length Mc dependence, of the field strength Es directly below the tip of the channel field plate in a state in which the mold resin does not cover the device or has been peeled therefrom or in an initial state (before voltage application) in which there is no charge accumulation whatever, and of the field strength Es' directly below the tip of the channel field plate during actual use (following voltage application) when charge accumulation is produced such that the potential on the protective film becomes the drain potential, in a high withstand voltage lateral MISFET device in which the breakdown drain voltage is 1200V, the drain drift length Ld=110 μm, and the film thickness Tox of the insulating film=2 μm.
Figure 11:
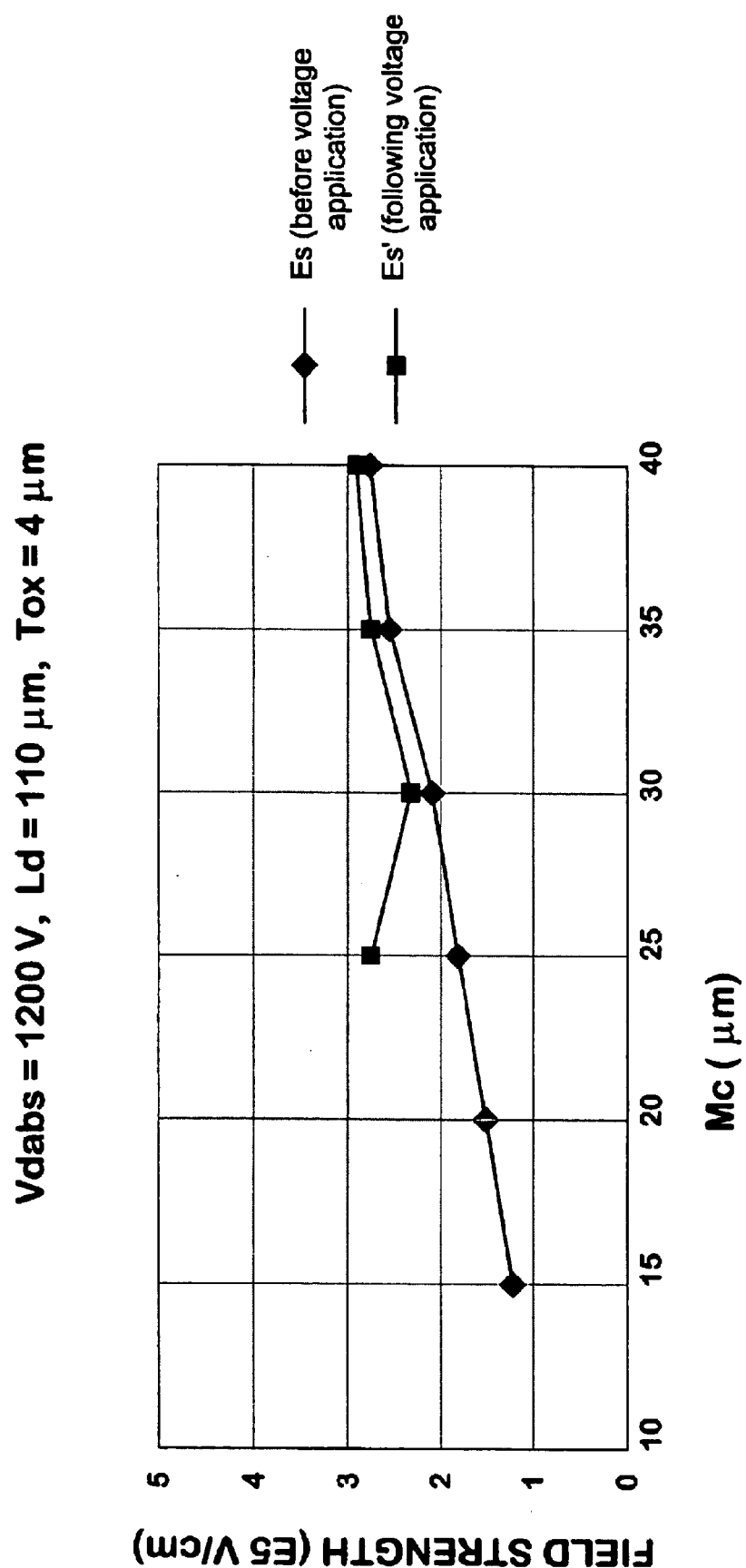
FIG. 11 is a device simulation figure to show the field plate extension length Mc dependence, of the field strength Es directly below the tip of the channel field plate in a state in which the mold resin does not cover the device or has been peeled therefrom or in an initial state (before voltage application) in which there is no charge accumulation whatever, and of the field strength Es' directly below the tip of the channel field plate during actual use (following voltage application) when charge accumulation is produced such that the potential on the protective film becomes the drain potential, in a high withstand voltage lateral MISFET device in which the breakdown drain voltage is 1200V, the drain drift length Ld=110 μm, and the film thickness Tox of the insulating film=4 μm.
Figure 12:
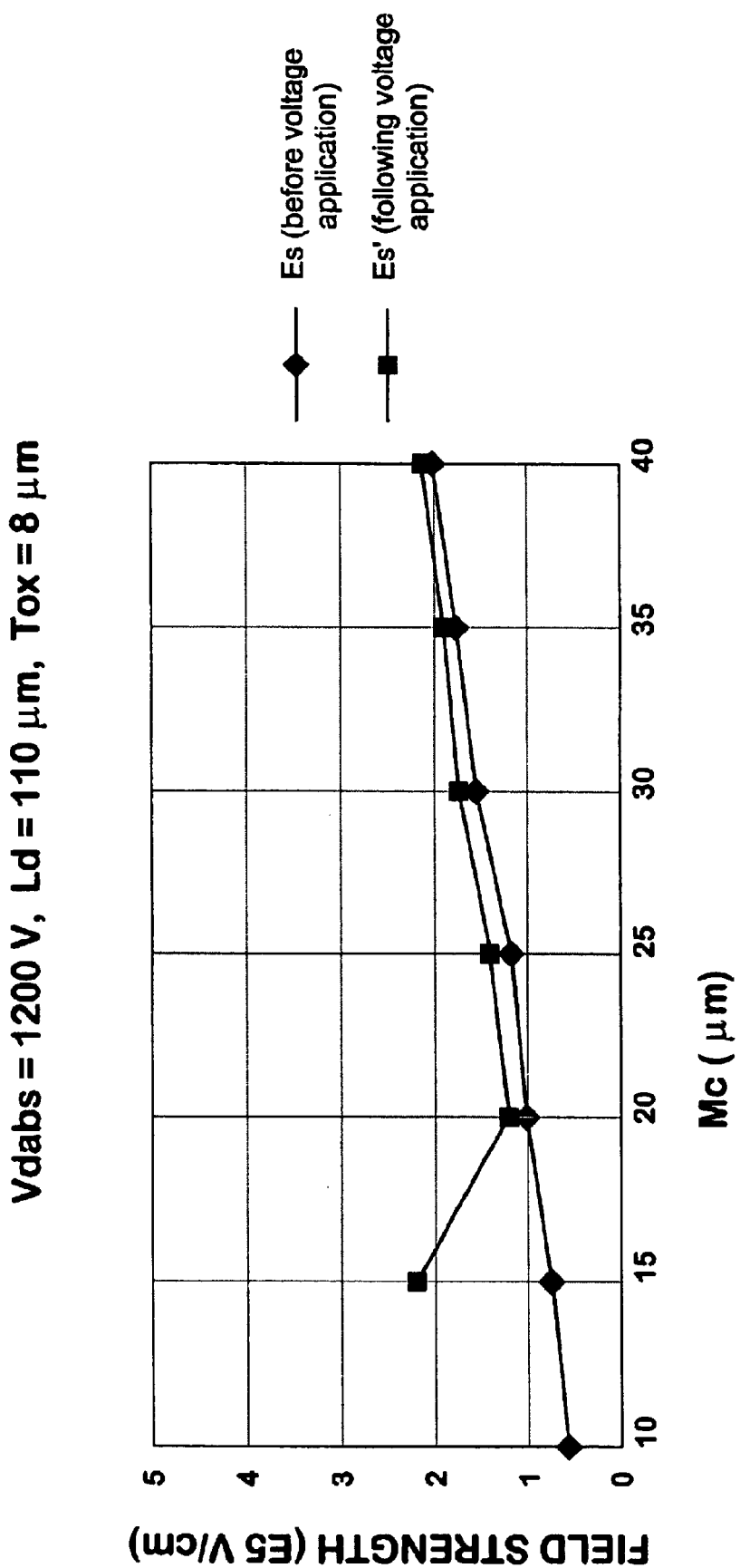
FIG. 12 is a device simulation figure to show the field plate extension length Mc dependence, of the field strength Es directly below the tip of the channel field plate in a state in which the mold resin does not cover the device or has been peeled therefrom or in an initial state (before voltage application) in which there is no charge accumulation whatever, and of the field strength Es' directly below the tip of the channel field plate during actual use (following voltage application) when charge accumulation is produced such that the potential on the protective film becomes the drain potential, in a high withstand voltage lateral MISFET device in which the breakdown drain voltage is 1200V, the drain drift length Ld=110 μm, and the film thickness Tox of the insulating film=8 μm.
Figure 13:
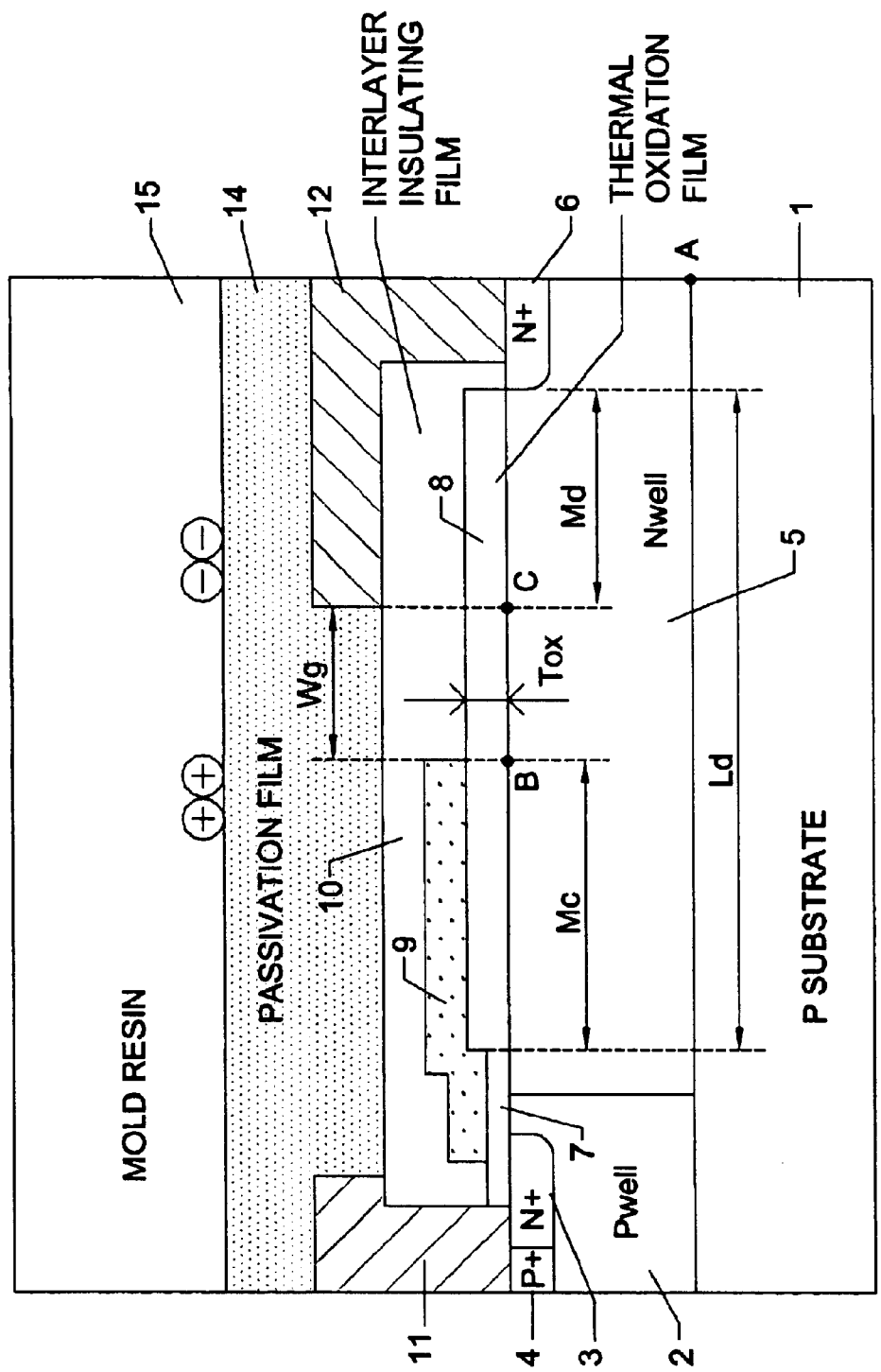
FIG. 13 is a partial sectional view to show a semiconductor device comprising a high withstand voltage lateral MISFET device, according to a first embodiment of the present invention.

FIG. 13 is a partial sectional view to show a semiconductor device comprising a high withstand voltage lateral MISFET device, according to a first embodiment of the present invention.

This high withstand voltage lateral MISFET device is a device with a design withstand voltage (breakdown drain voltage) of 350V, and is constituted having: a p-type semiconductor substrate 1 with a high resistance of 60 $\Omega$cm; a p-type channel region (Pwell) 2, which has an upper face concentration of $5 \times 10^{16}$/cm$^3$ and a diffusion depth of 4 $\mu$m and which is formed on the main face side of the p-type semiconductor substrate 1; an n$^+$ source region 3 and a p$^+$ substrate contact 4, which are formed on the main face side within the channel region 2; an n-type drain drift region 5, which has an upper face concentration of $0.5 \times 10^{16}$/cm$^3$ and a diffusion depth of 4 $\mu$m and which is formed on the main face side of the p-type semiconductor substrate 1; an n$^+$ drain region 6, which is separated from the channel region 2 on the main face side of the p-type semiconductor substrate 1 by the n-type drain drift region 5 therebetween; a gate electrode layer 9, which backgates the channel region 2 via a gate insulating film 7, and which extends toward the drain side on a thermal oxidation film (field oxide film, film thickness Tox=2.2 $\mu$m) 8 selectively formed on the main face of the drain drift region 5; a source electrode layer 11, which is in conductive contact with the substrate contact 4 and source region 5 via an interlayer insulating film (film thickness 1 $\mu$m) 10 formed on the gate electrode layer 9; a drain electrode layer 12, which is in conductive contact with the drain region 6, and which extends toward the source side on the interlayer insulating film 10; a passivation film (protective film) 14, which is formed on the source electrode layer 11 and the drain electrode layer 12; and an enclosing mold resin (epoxy resin or the like) 15, which covers the passivation film 14.

The extending portion of the gate electrode layer 9 on the thermal oxidation film 8 functions principally as a field plate for alleviating the field concentration of the well end of the channel region 2, and the length of extension Mc on the thermal oxidation film 8 is 14 $\mu$m. Further, the extending portion of the drain electrode layer 12 on the interlayer insulating film 10 functions principally as a field plate for alleviating the field concentration of the well end of the drain region 6, and when the length of extension Md on the interlayer insulating film 10 or from the well end of the drain region 6 is 8 $\mu$m, the total insulating film thickness directly below the extending tip of the drain electrode layer 12 is 3.2 $\mu$m. Further, when the drain drift length Ld is 25 $\mu$m, there is a wide difference between the levels of the gate electrode layer 9 and the drain electrode layer 12, which difference corresponds to the film thickness of the interlayer insulating film 10, but the unoccupied interval Wg between these layers is 3 $\mu$m.

In the present embodiment of a 350V withstand voltage device, the length of extension Mc of the gate electrode layer 9 and the length of extension Md of the drain electrode layer 12 is formed in an extended manner. As a result, even if there is growth in the charge accumulation at the interface of the mold resin 15 during actual use, the field strength at a point B and point C directly below the extending tip of the gate electrode layer 9 and the drain electrode layer 12 is always lower than at a voltage breakdown sacrificial position A directly below the drain region, which means that, for a drain voltage of 350V, there is voltage breakdown primarily at voltage breakdown sacrificial position A. Consequently, a gradual voltage drop does not occur and it is therefore possible to provide a stable semiconductor device with a 350V withstand voltage which is also capable of suppressing a gradual ON current drop.

When the breakdown drain voltage $V_{dabs}$=350, Mc=14 satisfies Mc≧35−10×2.2, and Md=8 satisfies Md≧35−10× 3.2. Even in a case in which the film thicknesses of the insulating films are equal, the field strength at point C directly below the extending tip of the drain electrode layer 12 is always lower than at point B directly below the extending tip of the gate electrode layer 9. In the present embodiment, there is scope for making the total insulating film thickness directly below the extending tip of the drain electrode layer 12 thin and for making Md short. However, since the drain electrode layer 12 is formed in the same layer as the source electrode layer 11, the film thickness is not excessively thick. In the present embodiment, the structure is such that no process addition is involved. However, since the main point is the withstand voltage rate limitation at point B directly below the extending tip of the gate electrode 9, Md is desirably short and Mc is desirably extended so as to be even longer. However, in consideration of the degree of growth of the charge accumulation constituted by mobile ions or the like within the mold resin 15, negative charge accumulates at the resin interface directly above the drain electrode layer 12, and positive charge accumulates at the resin interface directly above the gate electrode layer 9. However, since there is also a difference in the mobility of the mobile ions and the insulating film thickness on the gate electrode layer 9 is thicker than that on the drain electrode layer 12, it may be surmised that the dense accumulation of positive charge at the resin interface directly above the gate electrode layer 9 is small in comparison with that on the drain side, and it may therefore be said that this serves to permit an alleviation of the field concentration at point B directly below the extending tip of the gate electrode layer 9. In other words, as a result of the wide difference in the disposition of the gate electrode layer 9 (channel field plate) and the drain electrode layer 12 (drain field plate), a dummy effect is exhibited in which negative charge is densely accumulated at the resin interface directly above the drain electrode layer 12 (drain field plate), and there is a corresponding alleviation of the field concentration at point B directly below the extending tip of the gate electrode layer 9 (channel field plate).

In addition, ensuring that the unoccupied interval Wg=3 $\mu$m prevents a trap level. However, in a case in which the film thickness of the interlayer insulating film 10 is thick, for example greater than or equal to 3 $\mu$m, a field plate structure is also considered possible according to which the gate electrode layer 9 (channel field plate) and the drain electrode layer 12 (drain field plate) are caused to overlap with the interlayer insulating film 10 present therebetween. However, since equipotential lines are caused to lie in the unoccupied interval Wg, it is necessary to ensure that the insulating film 8 and the interlayer insulating film 10 are of an appropriate thickness.

Second Embodiment

Figure 14:
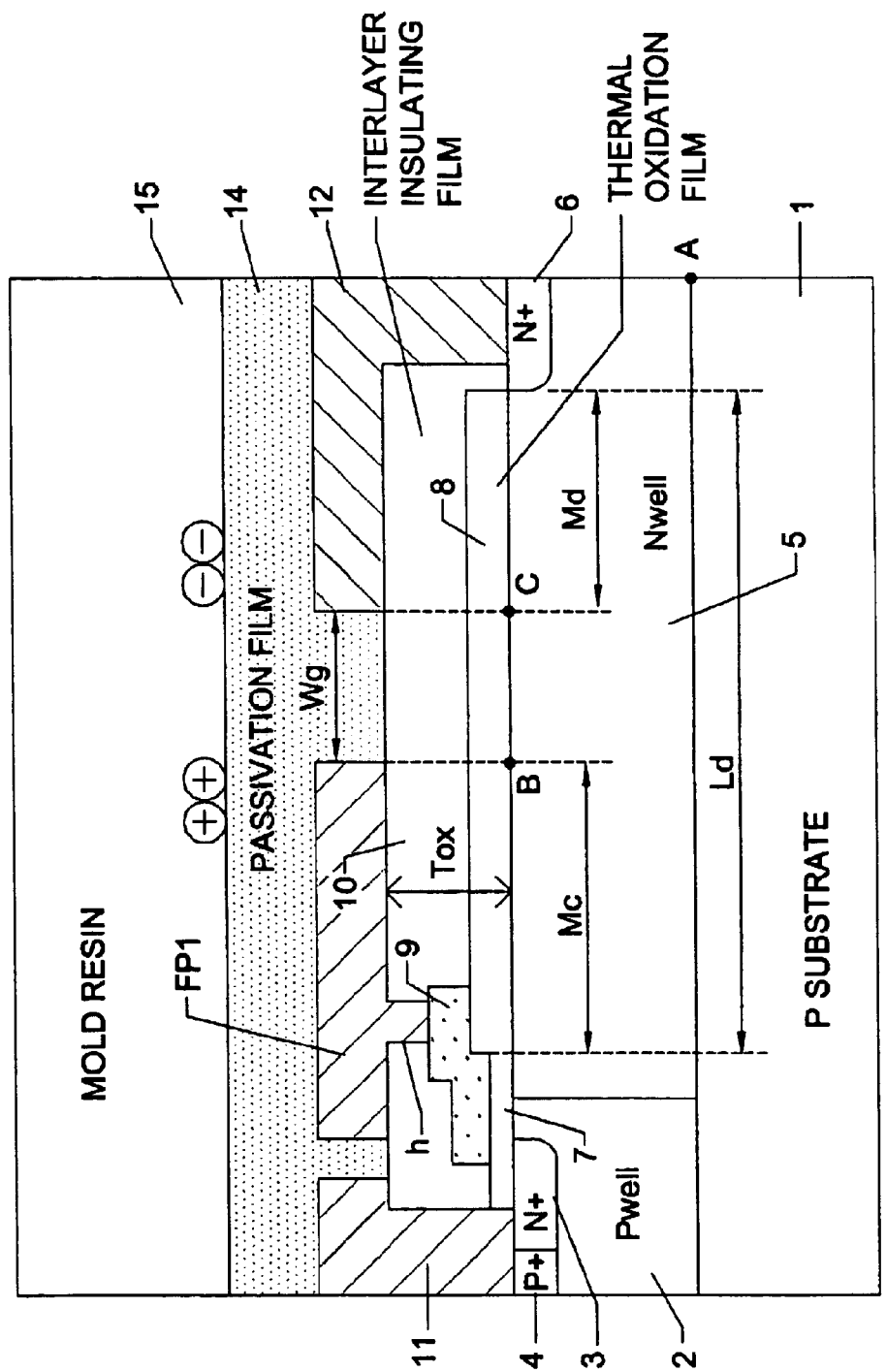
FIG. 14 is a partial sectional view to show a semiconductor device comprising a high withstand voltage lateral MISFET device, according to a second embodiment of the present invention.

FIG. 14 is a partial sectional view to show a semiconductor device comprising a high withstand voltage lateral MISFET device, according to a second embodiment of the present invention.

This high withstand voltage lateral MISFET device is a device with a design withstand voltage (breakdown drain voltage) of 700V, and is constituted having: a p-type semiconductor substrate 1 with a high resistance of 120 Ωcm; a p-type channel region (Pwell) 2, which has an upper face concentration of $5\times10^{16}$/cm$^3$ and a diffusion depth of 4 $\mu$m and which is formed on the main face side of the p-type semiconductor substrate 1; an n$^+$ source region 3 and a p$^+$ substrate contact 4, which are formed on the main face side within the channel region 2; an n-type drain drift region 5, which has an upper face concentration of $0.5\times10^{16}$/cm$^3$ and a diffusion depth of 4 $\mu$m and which is formed on the main face side of the p-type semiconductor substrate 1; an n$^+$ drain region 6, which is separated from the channel region 2 on the main face side of the p-type semiconductor substrate 1 by the n-type drain drift region 5 therebetween; a gate electrode layer 9, which backgates the channel region 2 via a gate insulating film 7, and which extends toward the drain side on a thermal oxidation film (field oxide film, film thickness 0.6 $\mu$m) 8 selectively formed on the main face of the drain drift region 5; a source electrode layer 11, which is in conductive contact with the substrate contact 4 and source region 5 via an interlayer insulating film (film thickness 4.4 $\mu$m) 10 formed on the gate electrode layer 9; a field plate FP1, which extends, further than the gate electrode layer 9, toward the drain side on an interlayer insulating film 10, and which is in conductive contact with the gate electrode layer 9 through a via hole h; a drain electrode layer 12, which is in conductive contact with the drain region 6, and which extends toward the source side on the interlayer insulating film 10; a passivation film (protective film) 14, which is formed on the source electrode layer 11 and the drain electrode layer 12; and an enclosing mold resin 15, which covers the passivation film 14.

The drain drift length Ld is 60 $\mu$m, the film thickness sum total Tox of the insulating film 8 and the interlayer insulating film 10 is 5 $\mu$m, the length of extension Mc of the field plate FP1 on the insulating film 8 is 18 $\mu$m, the length of extension Md of the drain electrode layer 12 on the interlayer insulating film 10 is 27 $\mu$m, and the unoccupied interval Wg is 15 $\mu$m.

Figure 28:
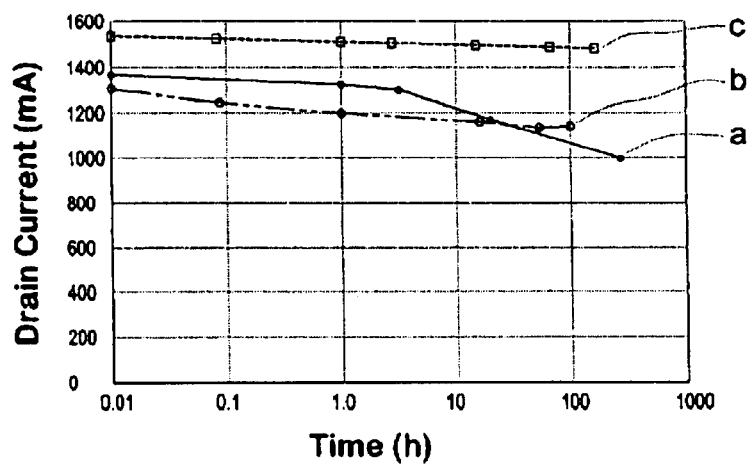
FIG. 28 shows graphs, namely FIG. 28(A), which is a graph to show a comparison of the gradual ON current drop in devices with a design withstand voltage (initial withstand voltage) of 750V for a conventional structure and for the second embodiment.
Figure 28:
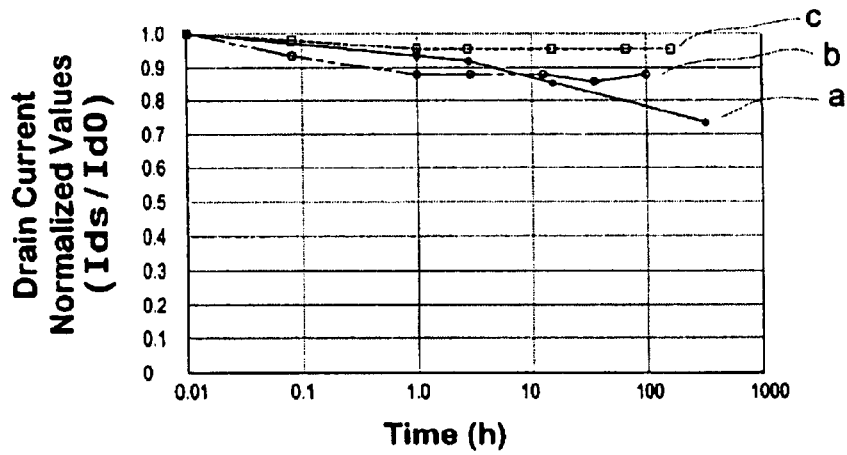
Figure 28:
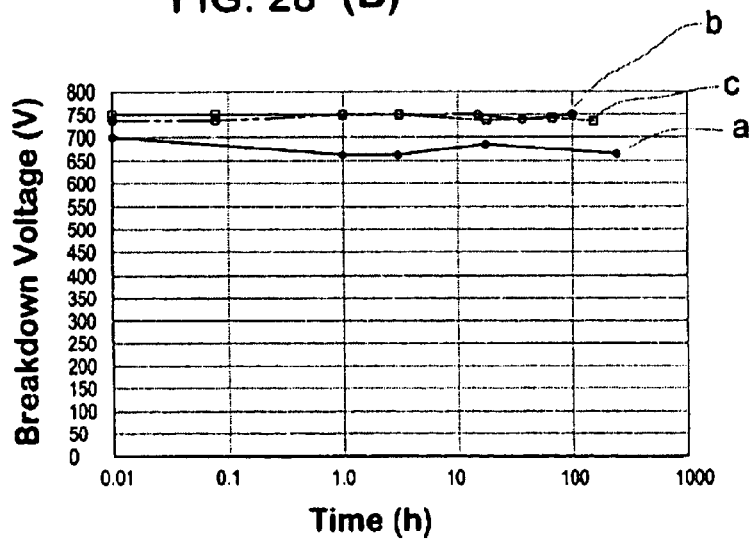

In a high humidity and high voltage application test (700V, 125° C.), with an initial voltage of 750V, as shown by b (the two dot chain line) in FIG. 28(C), a withstand voltage drop is barely observed over a long duration and the withstand voltage is therefore sufficiently stable. On the other hand, as shown by b (the two dot chain line) in FIGS. 28(A) and 28(B), the ON current exhibits a 14% drop for a voltage application of 100 hours, which represents a considerable suppression of the ON current drop in comparison with a conventional case. In a conventional case, the field concentration in the ON state at point C directly below the extending tip of the drain electrode layer 12 generates a conductivity type inversion, but it may be inferred that, in the present embodiment, effects are limited to very high depletion.

Here, since stabilization of the withstand voltage is assured, the concentration of the drain drift region 5 is made high at from $0.5\times10^{16}$/cm$^3$ to $1.0\times10^{16}$/cm$^3$ (upon conversion to the amount of donors (amount of charge) per unit area in relation to the resistance of the drain drift region 5, this is equivalent to from $1.0\times10^{12}$/cm$^2$ to $2.0\times10^{12}$/cm$^2$). Despite the high concentration, as shown by c (dotted line) in FIG. 28(C), a withstand voltage drop is barely observed over a long duration, and the withstand voltage is therefore sufficiently stable. On the other hand, as shown by c (the dotted line) in FIG. 28(A), the ON current increases such that the current value is higher than b and rises to 1560 mA, and, as shown by c (the dotted line) in FIG. 28(B), the ON current drop is limited to 4%, which is considered to be attributable to a narrowing of the enlargement width of the depletion layer. When the initial ON resistance is expressed as the ON resistance per unit area, this means that, at an operation point in which the gate voltage is 5V and the drain voltage is 10V, the ON resistance 40 Ωmm² is improved to 35 Ωmm², which makes a substantial contribution toward a reduction in chip size. Further, for a device with a 700V withstand voltage and in which Ld=65 μm, an improvement is to be expected which is represented by an ON resistance being reduced to around 26 Ωmm².

Therefore, in the 700V withstand voltage device of the present embodiment, since Tox is formed to be thick by means of a thick interlayer insulating film and Mc and Md are formed extendedly to be long, even if there is growth in charge accumulation at the interface of the mold resin 15 during actual use, the field strength at points B and C directly below the extending tip of the field plate FP1 and the drain electrode layer 12 is always lower than that at the voltage breakdown sacrificial position A directly below the drain region such that voltage breakdown occurs primarily at voltage breakdown sacrificial position A at a 700V drain voltage. As a result, a gradual voltage drop does not occur, and it is thus possible to provide a stable semiconductor device with a 700V withstand voltage that is also capable of suppressing a gradual ON current drop.

Further, in the structure of the present embodiment, if the interlayer insulating film was greater than or equal to 2 μm, Md was greater than or equal to 10 μm, Mc was greater than or equal to 10 μm, and Wg was in the range of 2 μm to 40 μm, it was judged from experiments that the above-mentioned effects were obtained.

Third Embodiment

Figure 15:
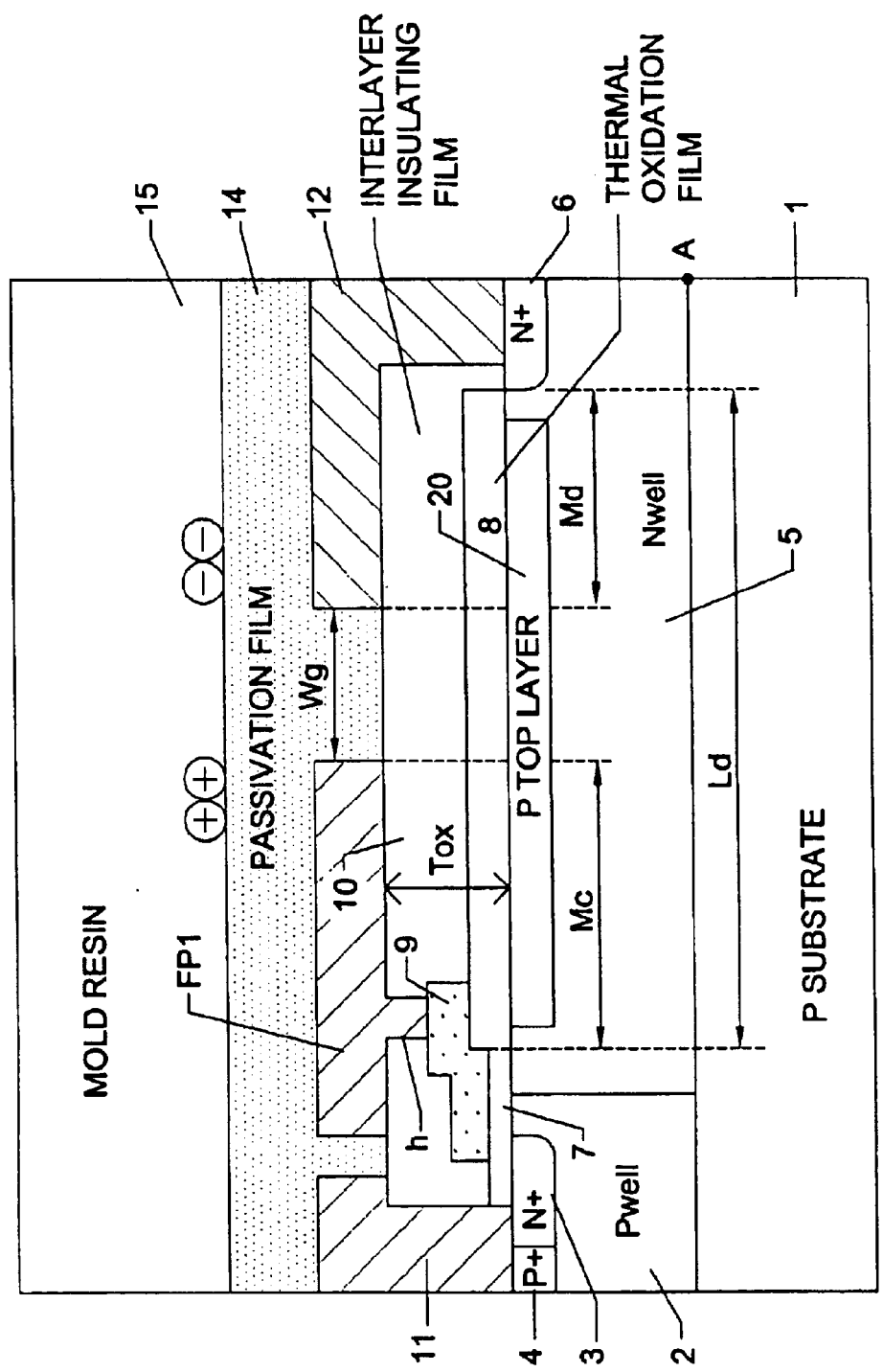
FIG. 15 is a partial sectional view to show a semiconductor device comprising a high withstand voltage lateral MISFET device, according to a third embodiment of the present invention.

FIG. 15 is a partial sectional view to show a semiconductor device comprising a high withstand voltage lateral MISFET device, according to a third embodiment of the present invention. Note that components in FIG. 15 that are the same as components shown in FIG. 14 have been assigned the same reference numerals and a description of such components will therefore be omitted hereinbelow.

Here, a point at variance with the device shown in FIG. 14 illustrating this high withstand voltage lateral MISFET device is to be found in the fact that the upper face concentration of the n-type drain drift region 5 is quite high at $3 \times 10^{16}/cm^3$, and a p-type top layer (with an upper face concentration of $5 \times 10^{16}/cm^3$ and a diffusion depth of 1 μm) 20 is provided on the main face side of the n-type drain drift region 5. For this reason, the drain drift length Ld is set at 70 μm.

According to the present embodiment, since Mc is set at 23 μm, Md is set at 32 μm, and Wg is set at 15 μm, it is possible to suppress a gradual withstand voltage drop and a successive ON current drop also in a high humidity and high voltage application test (700V, 125° C.), with an initial voltage of 750V. Further, as a result of the formation of a p-type top layer 20, there is an advantage in that, as well as being able to provide the n-type drain drift region 5 with a high concentration, it is possible to maintain the withstand voltage, and a reduction in the ON resistance is also effected.

Further, in the structure of the present embodiment, if the interlayer insulating film was greater than or equal to 2 μm, Md was greater than or equal to 10 μm, Mc was greater than or equal to 10 μm, and Wg was in the range of 2 μm to 50 μm, it was judged from experiments that the above-mentioned effects were obtained.

Fourth Embodiment

Figure 16:
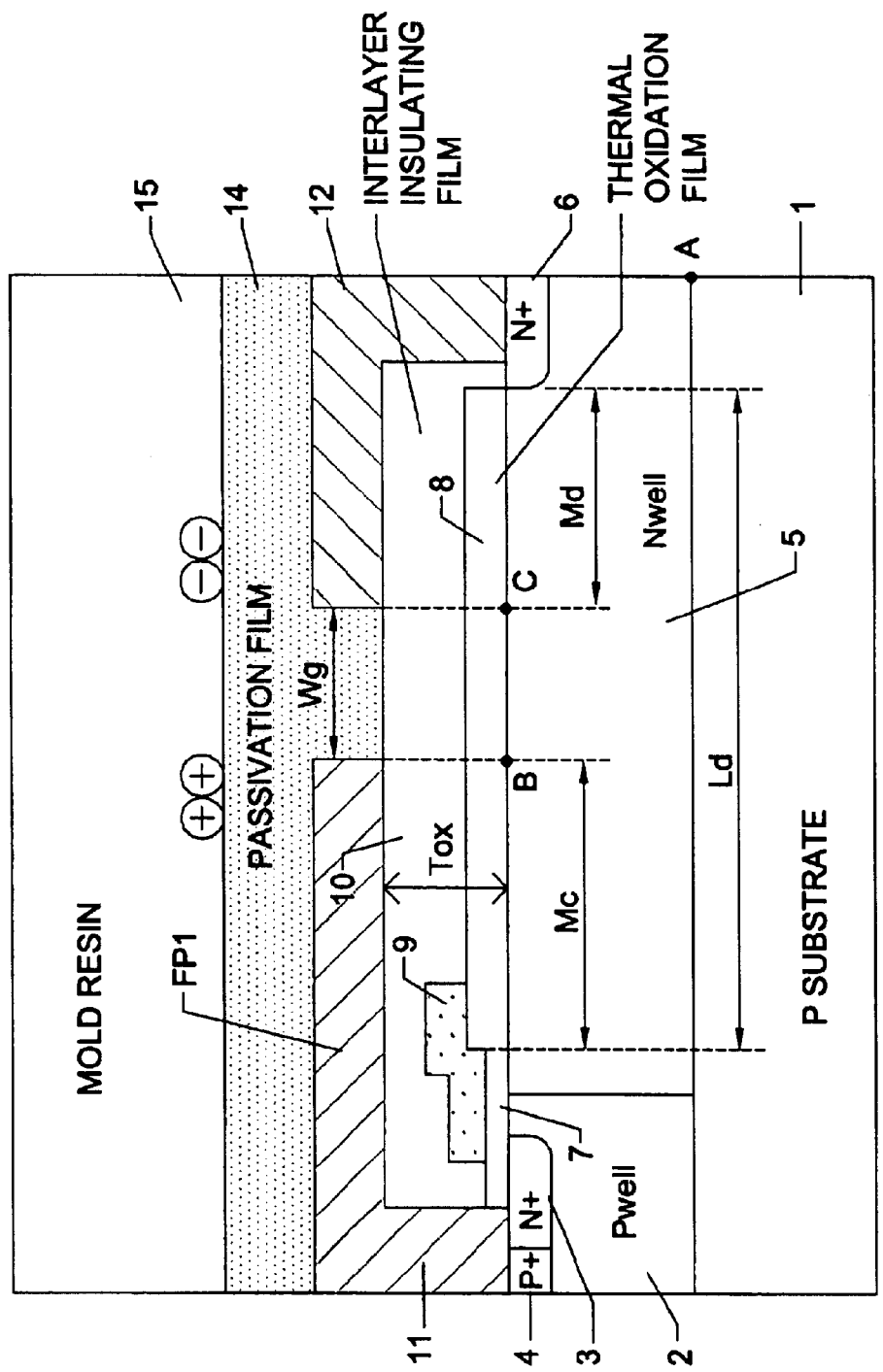
FIG. 16 is a partial sectional view to show a semiconductor device comprising a high withstand voltage lateral MISFET device, according to a fourth embodiment of the present invention.

FIG. 16 is a partial sectional view to show a semiconductor device comprising a high withstand voltage lateral MISFET device, according to a fourth embodiment of the present invention. Note that components in FIG. 16 that are the same as components shown in FIG. 14 have been assigned the same reference numerals and a description of such components will therefore be omitted hereinbelow.

According to the device shown in FIG. 14, field plate FP1 is in conductive contact with the gate electrode layer 9 via a via hole h, but in the present embodiment, field plate FP1 is formed as a layer common also to the source electrode layer 11. The device shown in FIG. 14 is capable of reducing the gate wiring resistance, but since the gate capacitance therefore increases, this effects the high-speed switching characteristics. In the present embodiment, not only is the via hole h unnecessary, but it is also possible to obtain high-speed switching characteristics. In addition, in the case of the present embodiment, the source electrode layer 11, the drain electrode layer 12 and the field plate FP1 are metal layers of aluminum or the like.

Fifth Embodiment

Figure 17:
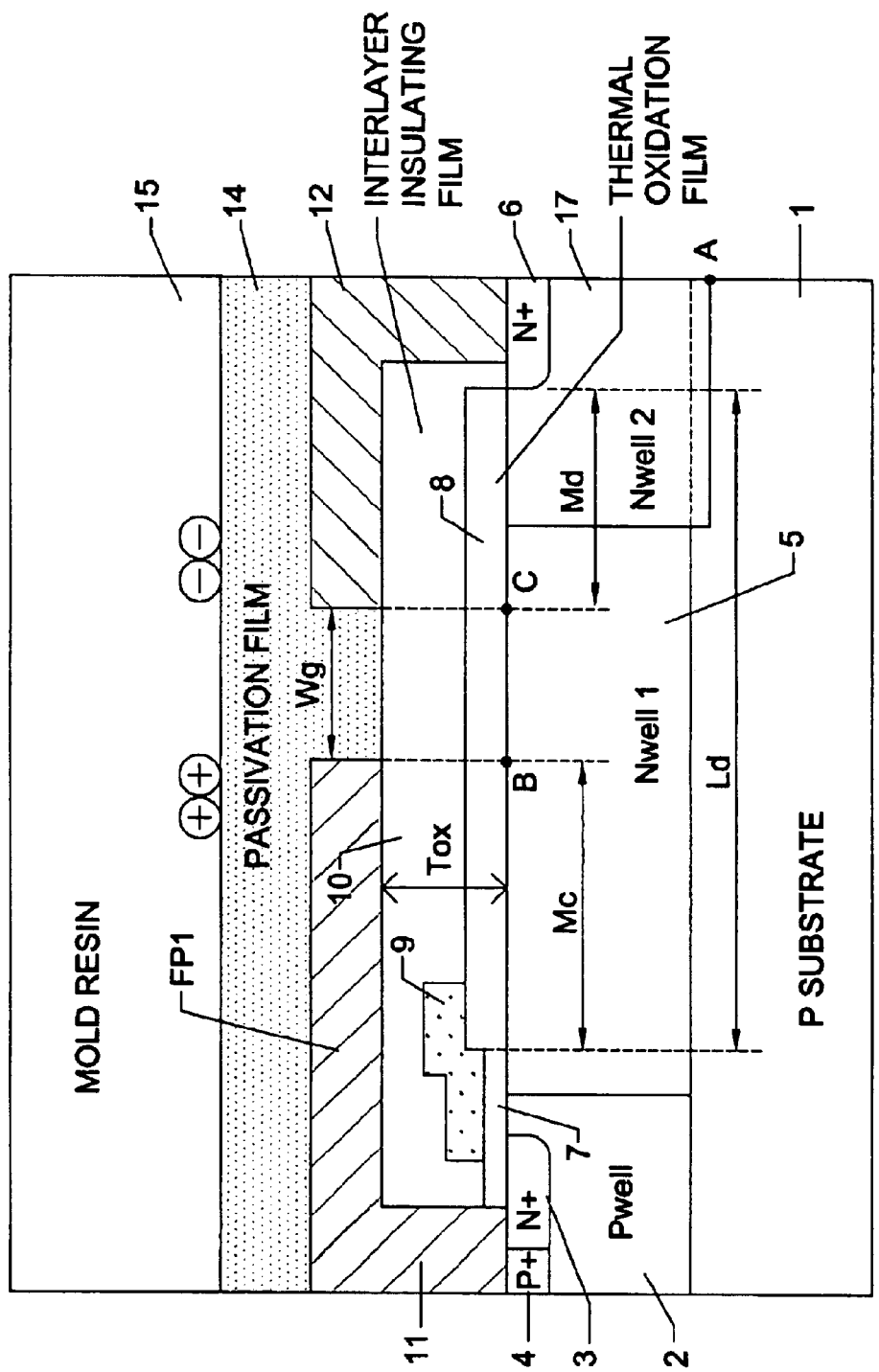
FIG. 17 is a partial sectional view to show a semiconductor device comprising a high withstand voltage lateral MISFET device, according to a fifth embodiment of the present invention.

FIG. 17 is a partial sectional view to show a semiconductor device comprising a high withstand voltage lateral MISFET device, according to a fifth embodiment of the present invention. Note that components in FIG. 17 that are the same as components shown in FIG. 16 have been assigned the same reference numerals and a description of such components will therefore be omitted hereinbelow.

According to the present embodiment, an n-type well (n-type well 2) 17 is formed directly below and in the vicinity of the drain region 6. This n-type well 17 has an impurity concentration that is higher than that of the drain drift region (n-type well 1) 5 and has an upper face concentration of $1 \times 10^{16}/cm^3$ and a diffusion depth of approximately 4 μm. The insulating film 8 of the n-type well 17 and the overlap length of the insulating film 8 are 10 μm, which permits a reduction of the ON resistance without bringing about a deterioration of the withstand voltage stability. Since, in the ON state, the depletion layer extending from the PN junction of the p-type substrate 1 and the drain drift region 5 grows substantially on the drain side, resistance on the drain side of the drain drift region is notably substantial. However, due to the presence of the n-type well 17, growth of the depletion layer toward the drain side can be suppressed and current capacitance maintained, which in turn leads to a 20% reduction in the ON resistance.

Sixth Embodiment

Figure 18:
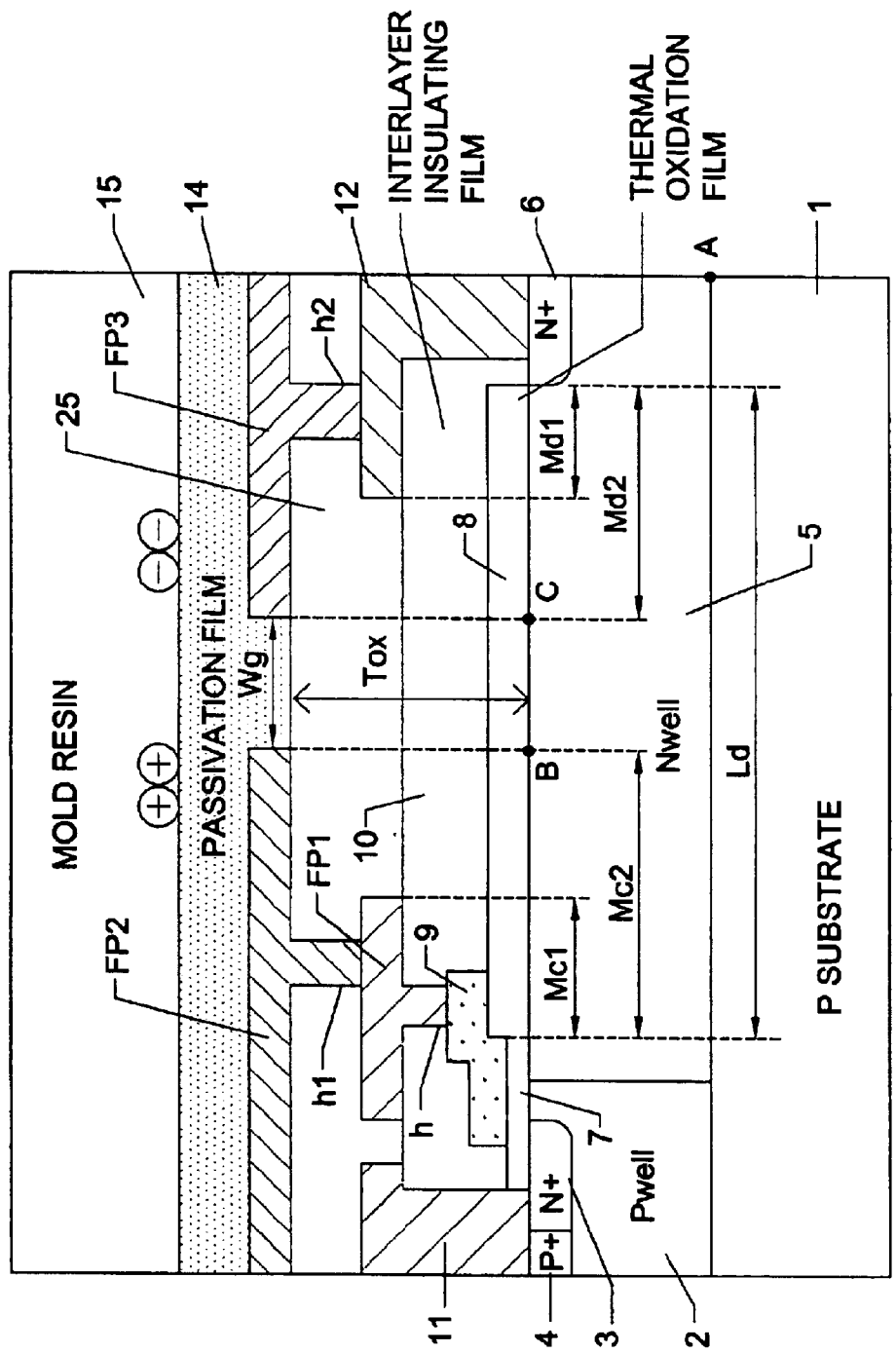
FIG. 18 is a partial sectional view to show a semiconductor device comprising a high withstand voltage lateral MISFET device, according to a sixth embodiment of the present invention.

FIG. 18 is a partial sectional view to show a semiconductor device comprising a high withstand voltage lateral MISFET device, according to a sixth embodiment of the present invention. Note that components in FIG. 18 that are the same as components shown in FIG. 14 have been assigned the same reference numerals and a description of such components will therefore be omitted hereinbelow.

Taking the structure shown in FIG. 14 as the basic structure, the present embodiment is such that a second field plate FP2 and a third field plate FP3 are formed on the drain electrode layer 12, the source electrode layer 11 and the first field plate FP1, a second interlayer insulating film 25 being interposed therebetween. Field plates FP2, FP3 are formed as a second metal layer, and the second field plate FP2 extends, further than the first field plate FP1, toward the drain side, and is conductively connected with the first field plate FP1 via the via hole $h_1$, and the third field plate FP3 extends, further than the drain electrode layer 12, toward the channel side, and is conductively connected with the drain electrode layer 12 via the via hole $h_2$. Field plates FP2, FP3 are a second metal layer of aluminum or the like. Since there is a requirement of the total insulating film thickness below the field plates FP2, FP3 to be 4.4 μm, the thickness of the first interlayer insulating film 10 is then 1.3 μm, whereas the thickness of the second interlayer insulating film 25 is then 2.5 μm. The length of extension Mc1 of the first field plate FP1 is wholly significant in connection with an alleviation of the field concentration at the extending tip of the gate electrode layer 9, while the length of extension Md1 of the drain electrode layer 12 is wholly significant in connection with an alleviation of the field concentration at the end of the drain region 6. Mc1 is set at 12 μm and Md1 is set at 10 μm. The length of extension Mc2 of the second field plate FP2 is 18 μm and the length of extension Md2 of the third field plate FP3 is 27 μm.

Therefore, according to the present embodiment, since a multiple field plate extending structure is employed, because the total insulating film thickness directly below the uppermost layer field plates FP2, FP3 can inevitably be formed to be thick by utilizing a plurality of interlayer insulating films 10, 25, it is possible to suppress both the gradual withstand voltage drop and the gradual ON current drop. Moreover, as a result of forming the second interlayer insulating film 25 to be thick, since it is possible to form the film thickness of the first interlayer insulating film 10 to be relatively thin, it is possible to make the opening size of the contact hole, of the control circuit section formed in a region separate from the semiconductor substrate 1, no more than 2 μm, and to thus reduce the area occupied by the control circuit section to 70% or less.

Seventh Embodiment

Figure 19:
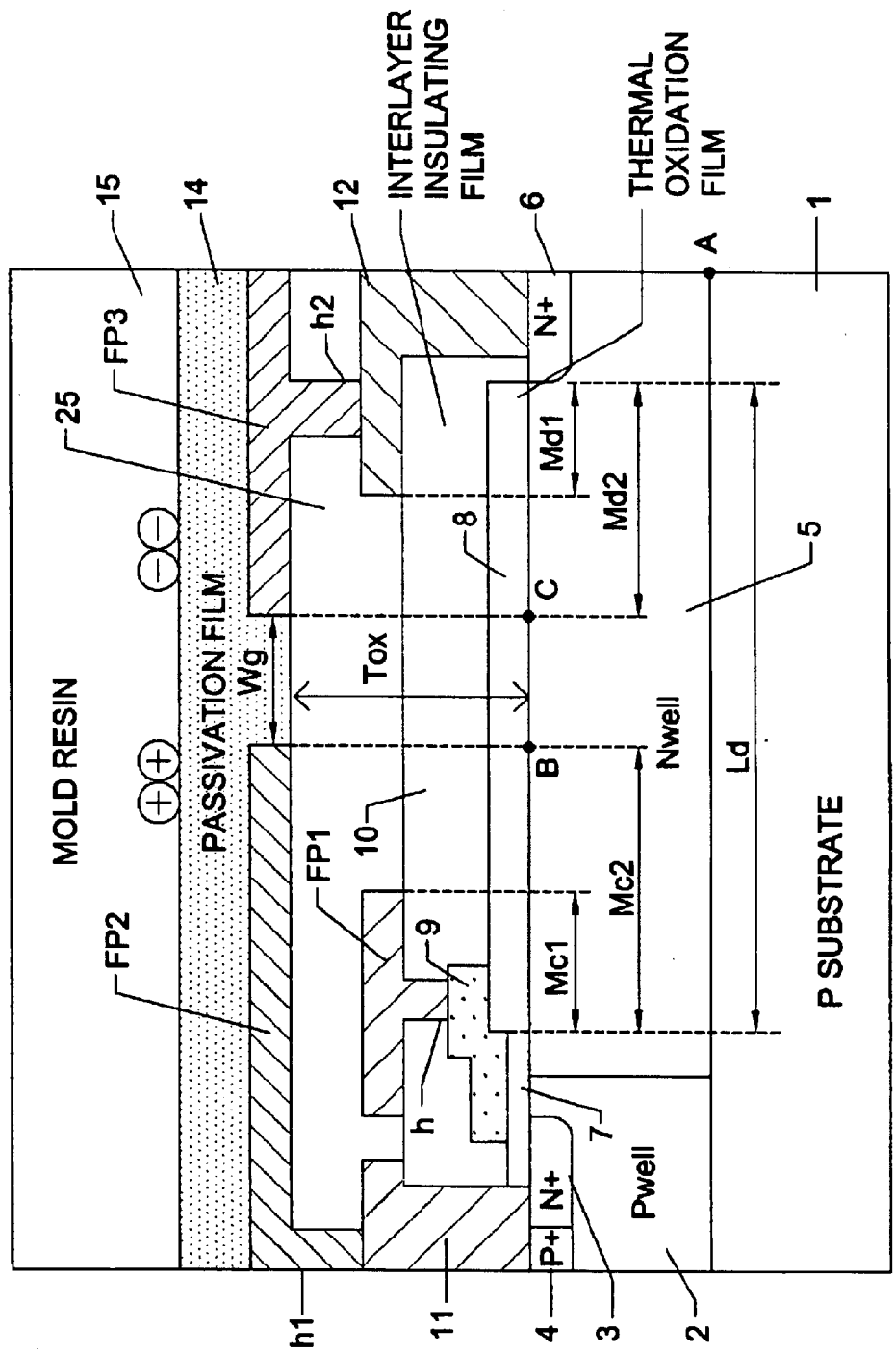
FIG. 19 is a partial sectional view to show a semiconductor device comprising a high withstand voltage lateral MISFET device, according to a seventh embodiment of the present invention.

FIG. 19 is a partial sectional view to show a semiconductor device comprising a high withstand voltage lateral MISFET device, according to a seventh embodiment of the present invention. Note that components in FIG. 19 that are the same as components shown in FIG. 18 have been assigned the same reference numerals and a description of such components will therefore be omitted hereinbelow.

According to the device shown in FIG. 18, the second field plate FP2 is in conductive contact with the first field plate FP1 via the via hole $h_1$, however, in the present embodiment, the second field plate FP2 is conductively connected with the source electrode layer 11 via the via hole $h_1$. The device shown in FIG. 18 is capable of reducing the gate wiring resistance, but since the gate capacitance therefore increases, this effects the high-speed switching characteristics. There is a trade-off relation with regard to the switching characteristics in accordance with the layout pattern. However, in the present embodiment, the second field plate FP2 is not conductively connected with the gate electrode layer 9, and, consequently, it becomes possible to avoid an enlargement of the gate capacitance and to prevent a deterioration of the high-speed switching characteristics.

Indeed, the first field plate FP1 may also be formed as a layer common also to the source electrode layer 11 without there being a via hole $h_1$ therebetween.

Eighth Embodiment

Figure 20:
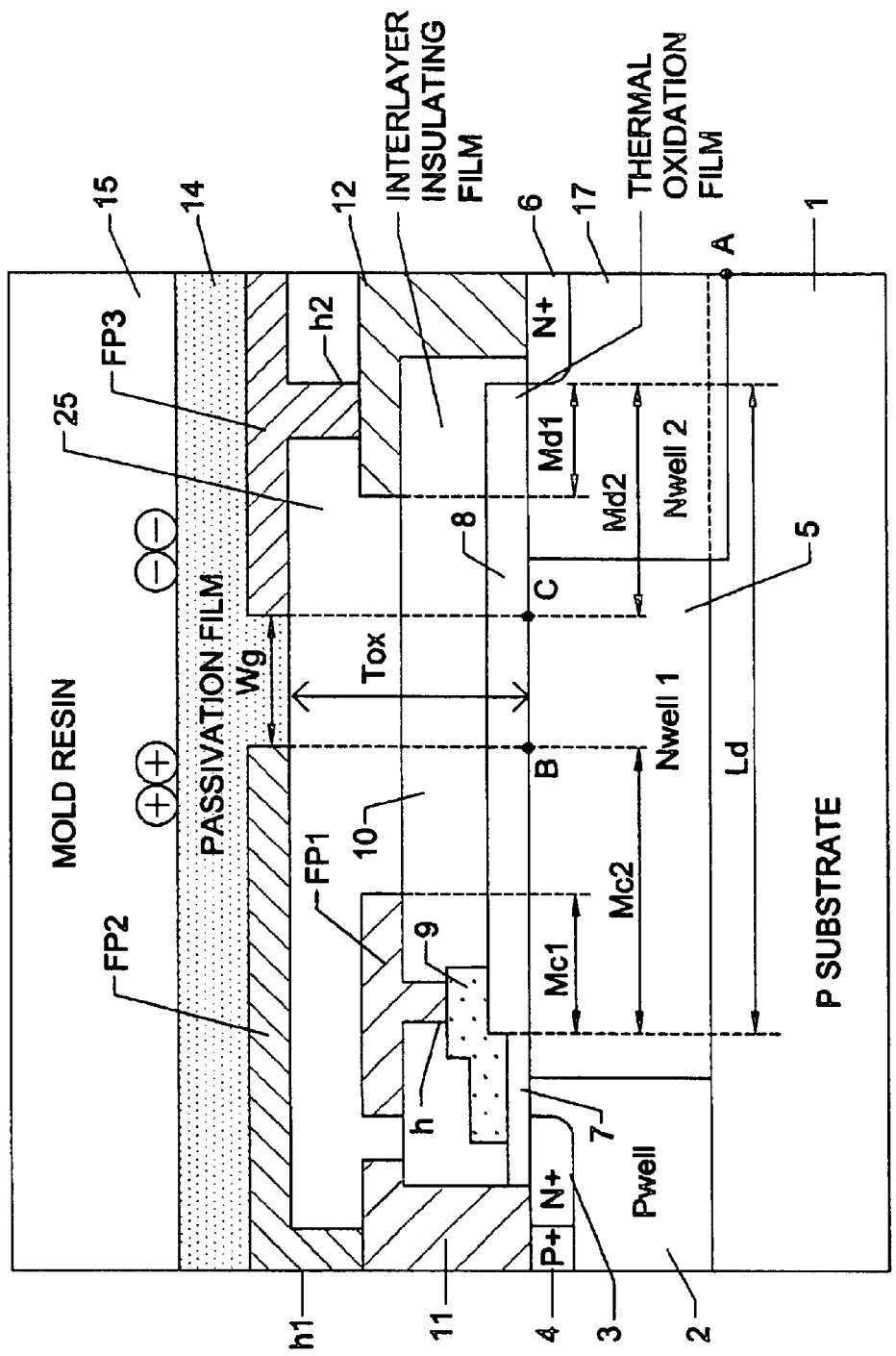
FIG. 20 is a partial sectional view to show a semiconductor device comprising a high withstand voltage lateral MISFET device, according to an eighth embodiment of the present invention.

FIG. 20 is a partial sectional view to show a semiconductor device comprising a high withstand voltage lateral MISFET device, according to an eighth embodiment of the present invention. Note that components in FIG. 20 that are the same as components shown in FIG. 18 have been assigned the same reference numerals and a description of such components will therefore be omitted hereinbelow.

According to the present embodiment, an n-type well (n-type well 2) 17 is formed directly below and in the vicinity of the drain region 6. This n-type well 17 has an impurity concentration that is higher than that of the drain drift region (n-type well 1) 5 and has an upper face concentration of $1 \times 10^{16}/cm^3$ and a diffusion depth of approximately 4 μm. The insulating film 8 of the n-type well 17 and the overlap length of the insulating film 8 are 10 μm, which permits a reduction of the ON resistance without bringing about a deterioration of the withstand voltage stability.

Ninth Embodiment

Figure 21:
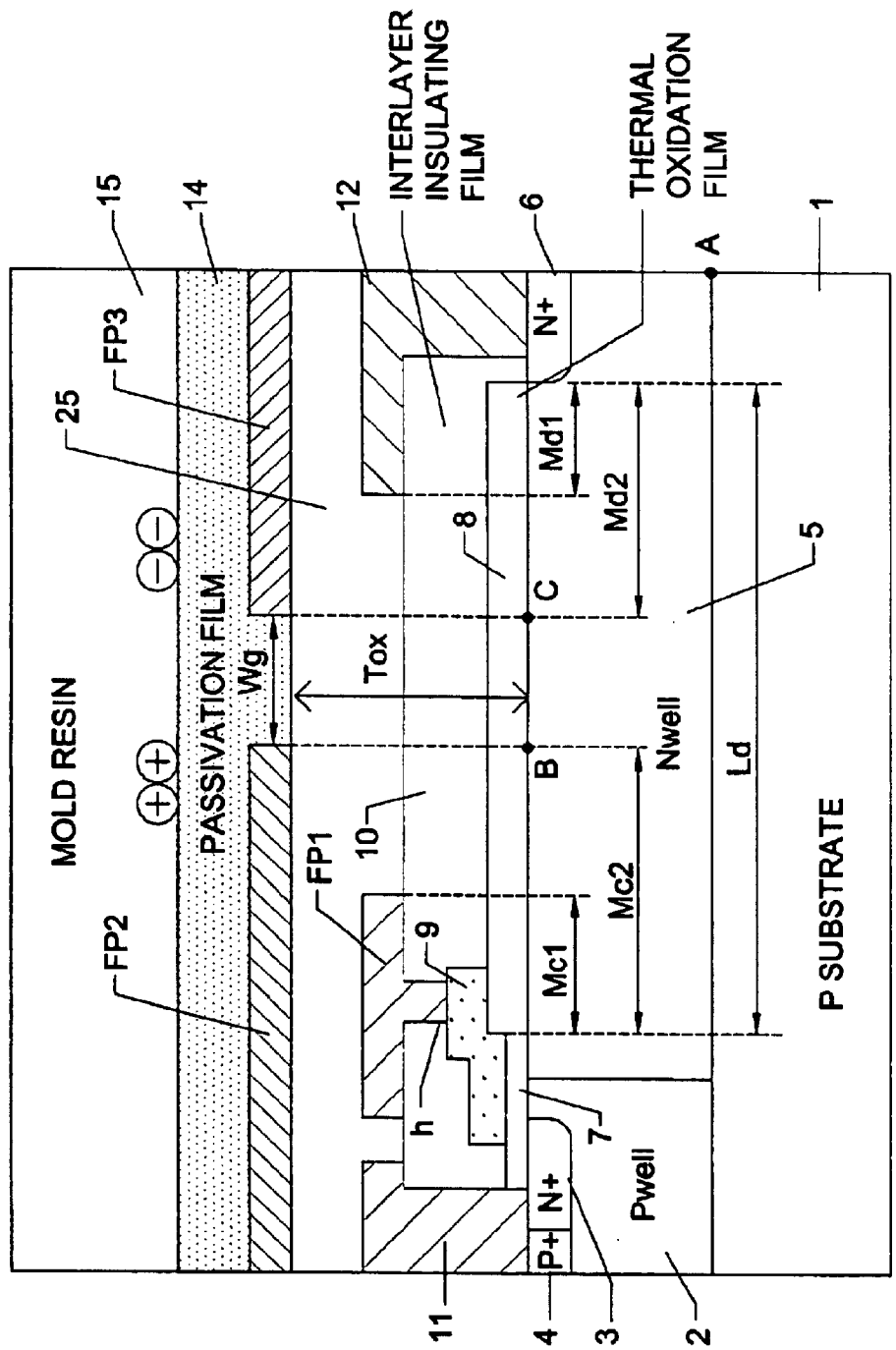
FIG. 21 is a partial sectional view to show a semiconductor device comprising a high withstand voltage lateral MISFET device, according to a ninth embodiment of the present invention.
Figure 22:
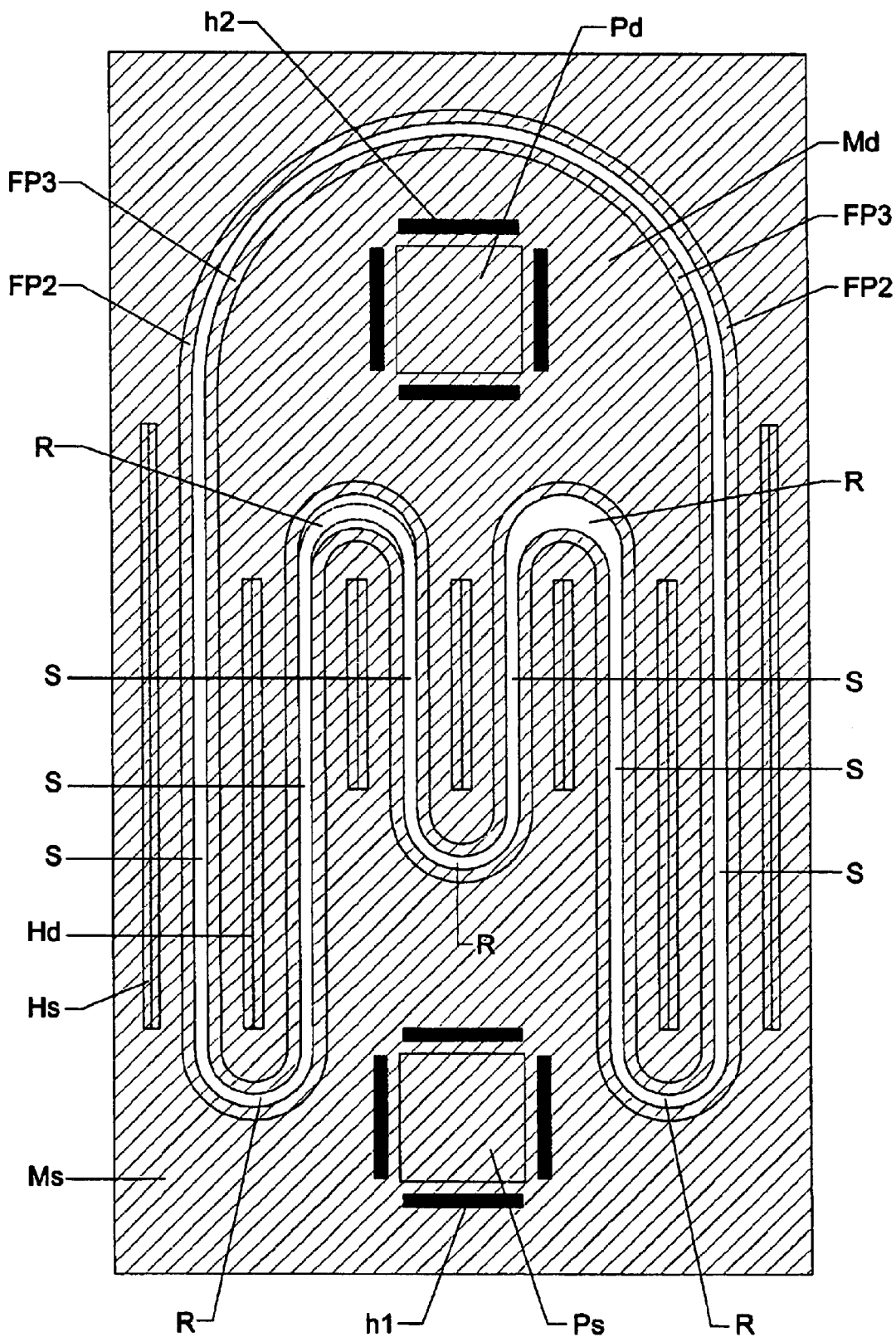
FIG. 22 is a planar view showing a planar pattern of a high withstand voltage lateral MISFET device, according to the ninth embodiment.

FIG. 21 is a partial sectional view to show a semiconductor device comprising a high withstand voltage lateral MISFET device, according to a ninth embodiment of the present invention; FIG. 22 is a planar view showing a planar pattern of a high withstand voltage lateral MISFET device. Note that components in FIG. 21 that are the same as components shown in FIG. 18 have been assigned the same reference numerals and a description of such components will therefore be omitted hereinbelow.

According to the multiple field plate extending structure shown in FIGS. 18 to 20, the via hole $h_1$, which penetrates the second interlayer insulating film 25 serves only to cause the second field plate FP2 to conduct a potential that is the same as the potential of the source electrode layer 11 or the gate electrode layer 9, and the via hole $h_2$ also only serves to cause the third field plate FP3 to conduct a potential that is the same as the drain electrode layer 12. However, when the via hole $h_1$ and the via hole $h_2$ are formed in the second, relatively thick interlayer insulating film 25, directly above the channel and directly above the drain, respectively, since a protective film 14 is formed on these via holes, the step coverage of the protective film 14, which results from the difference in level of the via holes $h_1$, $h_2$, is insufficient, and there is a danger of localized deterioration of the film material. Particularly in actual use under high-humidity conditions, if impurities within the mold resin 15 pass through the deteriorated section of the protective film 14 by means of moisture so as to permeate inside the device, there is a risk that aluminum corrosion will occur and that a channel leak current will be generated as a result of accumulation in the gate electrode layer 9.

Therefore, according to the present embodiment, as may also be judged from FIG. 21, the via hole $h_1$ is not formed directly above the channel, and the via hole $h_2$ is not formed directly above the drain.

As shown in FIG. 22, a semiconductor device comprising a lateral MISFET device typically has a comb-tooth type device planar pattern extending in a gate width direction and in which gate linear portions S and gate curved portions R are alternately repeated and connected to one another. However, the second field plate FP2 of the present embodiment is a metal continuous film on a source electrode layer 11, a second interlayer insulating film 25 being interposed therebetween, and this metal continuous film is formed as a source side covering layer Ms that extends in a planar fashion also beyond the comb-tooth type device planar pattern; and the third field plate FP3 is a metal continuous film on a drain electrode layer 12, the second interlayer insulating film 25 being interposed therebetween, and this metal continuous film is formed as a drain side covering layer Md that extends in a planar fashion also beyond the comb-tooth type device planar pattern. According to the present embodiment, the drain side covering layer Md occupies a center island region on the plane of the chip, and the source side covering layer Ms occupies a neighboring region which is separated by an unoccupied interval Wg from this center island region. A drain pad Pd is formed in a marginal section of the area occupied by the center island region and a source pad Ps is formed in a marginal section of the area occupied by the neighboring region. A via hole $h_2$ is formed in the vicinity of the four borders of the drain pad Pd and a via hole $h_1$ is formed in the vicinity of the four borders of the source pad Ps. In addition, Hs is a contact hole that serves to conductively connect the source electrode layer 11 with the source region 3, and Hd is a contact hole that serves to conductively connect the drain electrode layer 12 with the drain region 6.

Therefore, since the via holes $h_1,h_2$ are formed in sections away from the gate linear portions S and the gate curved portions R, no aluminum corrosion is provoked, and the production of a channel leak current can be prevented.

In FIG. 22, as exaggerated by dotted lines in a gate curved portion R of one section, the length of extension of the field plates FP2, FP3 on the gate curved portions R is respectively formed to be longer than the length of extension of the field plates FP2, FP3 on the gate linear portions S, and is greater than or equal to 30 µm. As a result, not forming Tc to be thick partially on the gate curved portions R means that it is possible to alleviate the field concentration on the gate curved portions R, and it is therefore possible to make the radius of curvature of the gate curved portions R small. It is therefore possible to make the interval between parallel gate linear portions S narrow, and, by means of high-density integration, a large current capacitance is conceivable. If the length of extension on the gate linear portions S is afforded some scope, matching of the length of extension on the gate linear portions S to the length on the gate curved portions R is permissible.

Tenth Embodiment

Figure 23:
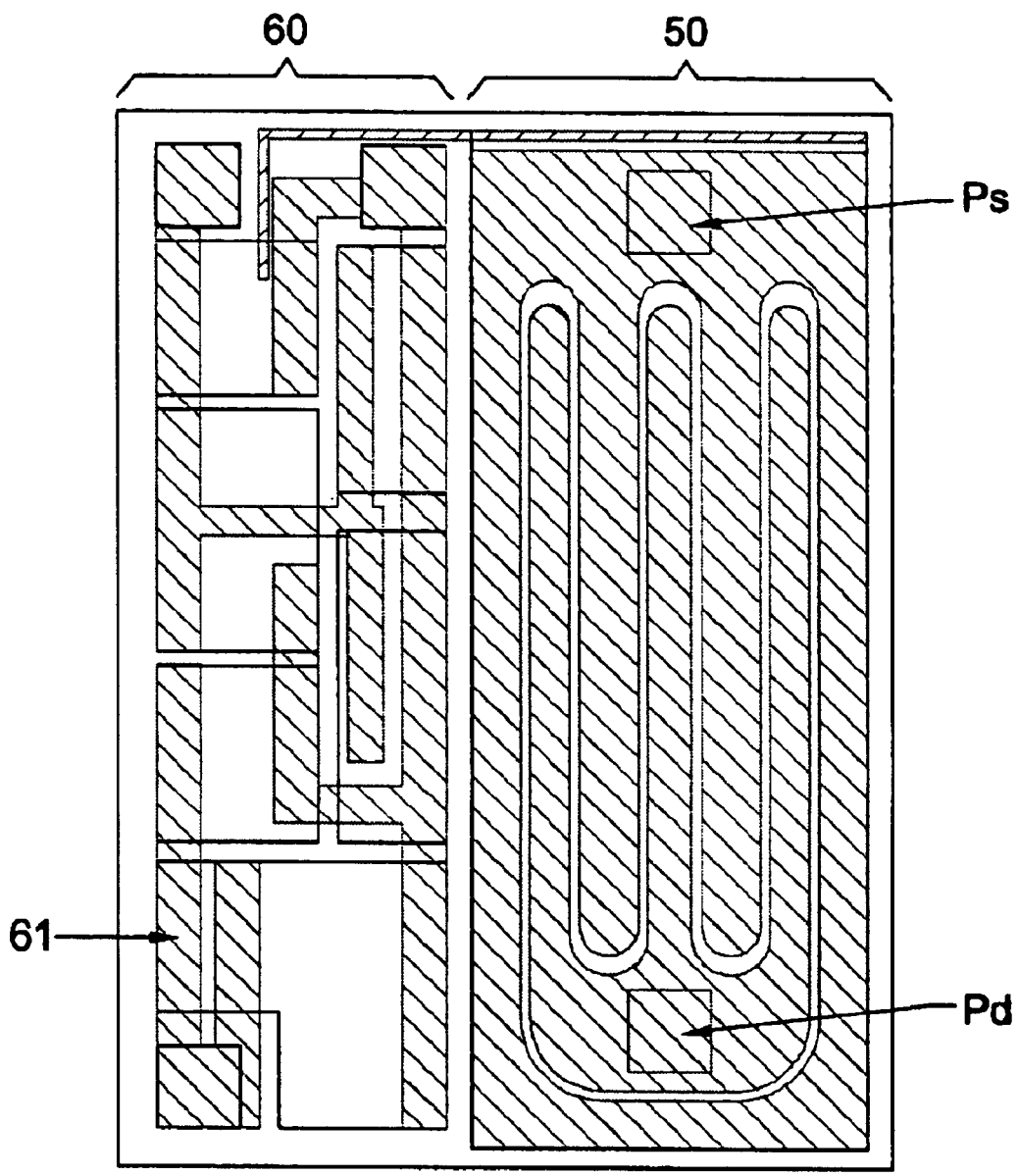
FIG. 23 is a planar view showing a chip planar pattern for a semiconductor device comprising a high withstand voltage lateral MISFET device, according to a tenth embodiment of the present invention.

FIG. 23 is a planar view showing a chip planar pattern for a semiconductor device comprising a high withstand voltage lateral MISFET device, according to a tenth embodiment of the present invention. Note that components in FIG. 23 which are the same as components shown in FIG. 22 have been assigned the same reference numerals and a description of such components will therefore be omitted hereinbelow.

The chip plane of the present embodiment has a lateral MISFET device section (high voltage section) 50, which possesses a comb-tooth type planar pattern of the kind shown in FIG. 22, and a control circuit section (low voltage section) 60 which is distinct from the lateral MISFET device section 50. The control circuit section 60 includes a circuit for controlling the movement of the gate of the MISFET device section 50 and a circuit for preventing an overcurrent. Consequently, the control circuit section 60 has a high number of devices and there is a requirement for interconnect wiring space. Therefore, according to the present embodiment, not only a first metal layer, which forms the source electrode layer 11, the drain electrode layer 12 and the first field plate FP1, of the lateral MISFET device section 50, but also a second metal layer, which serves to form the field plates FP2, FP3, are employed as an interconnect wiring layer 61 for a circuit block on the control circuit section 60. It is therefore possible to reduce the wiring space on the control circuit section 60, and, by the same degree, to attempt to expand the proportion of the area occupied by the lateral MISFET device section 50 or to reduce the chip size.

Eleventh Embodiment

Figure 24:
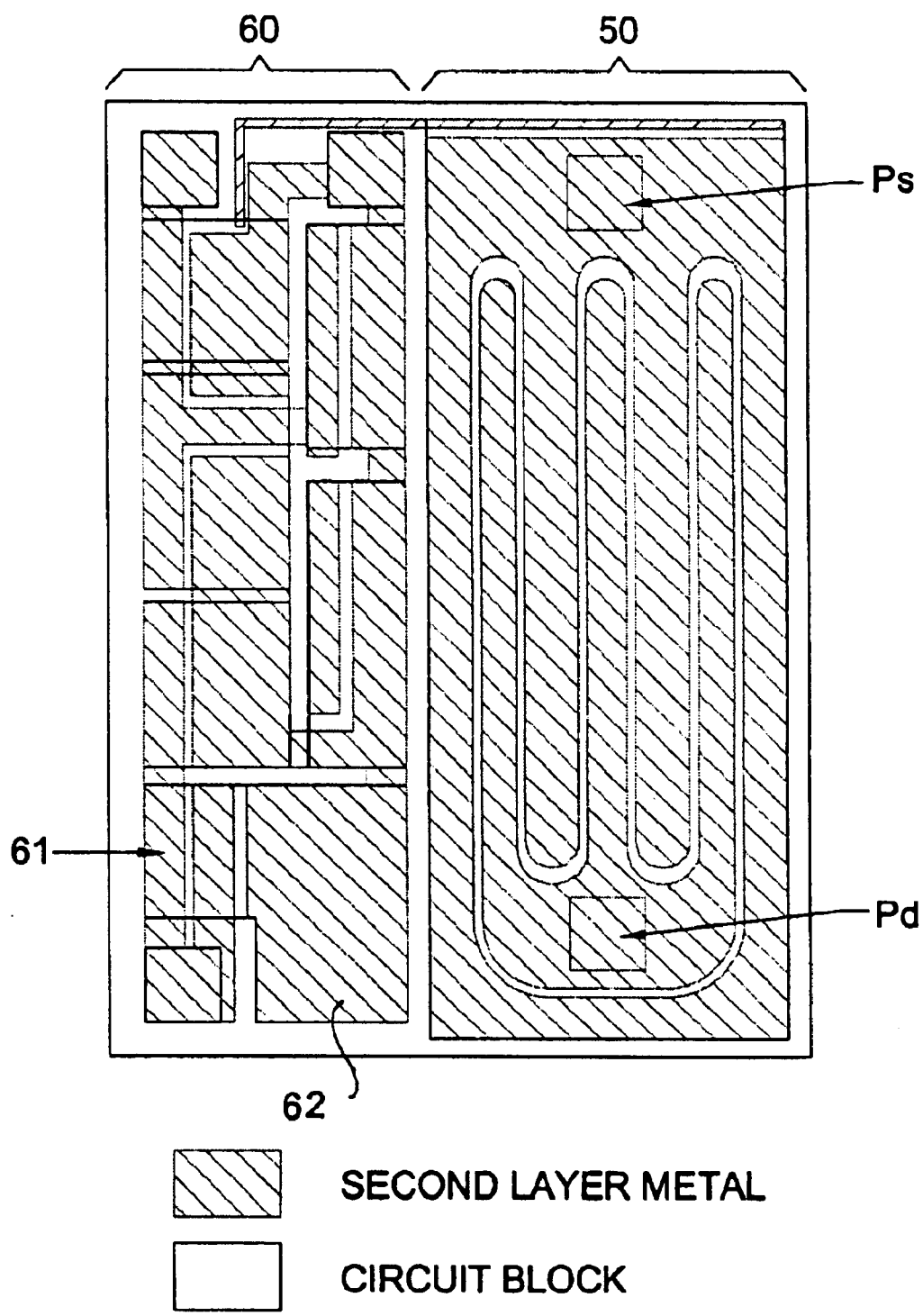
FIG. 24 is a planar view showing a chip planar pattern for a semiconductor device comprising a high withstand voltage lateral MISFET device, according to an eleventh embodiment of the present invention.
Figure 25:
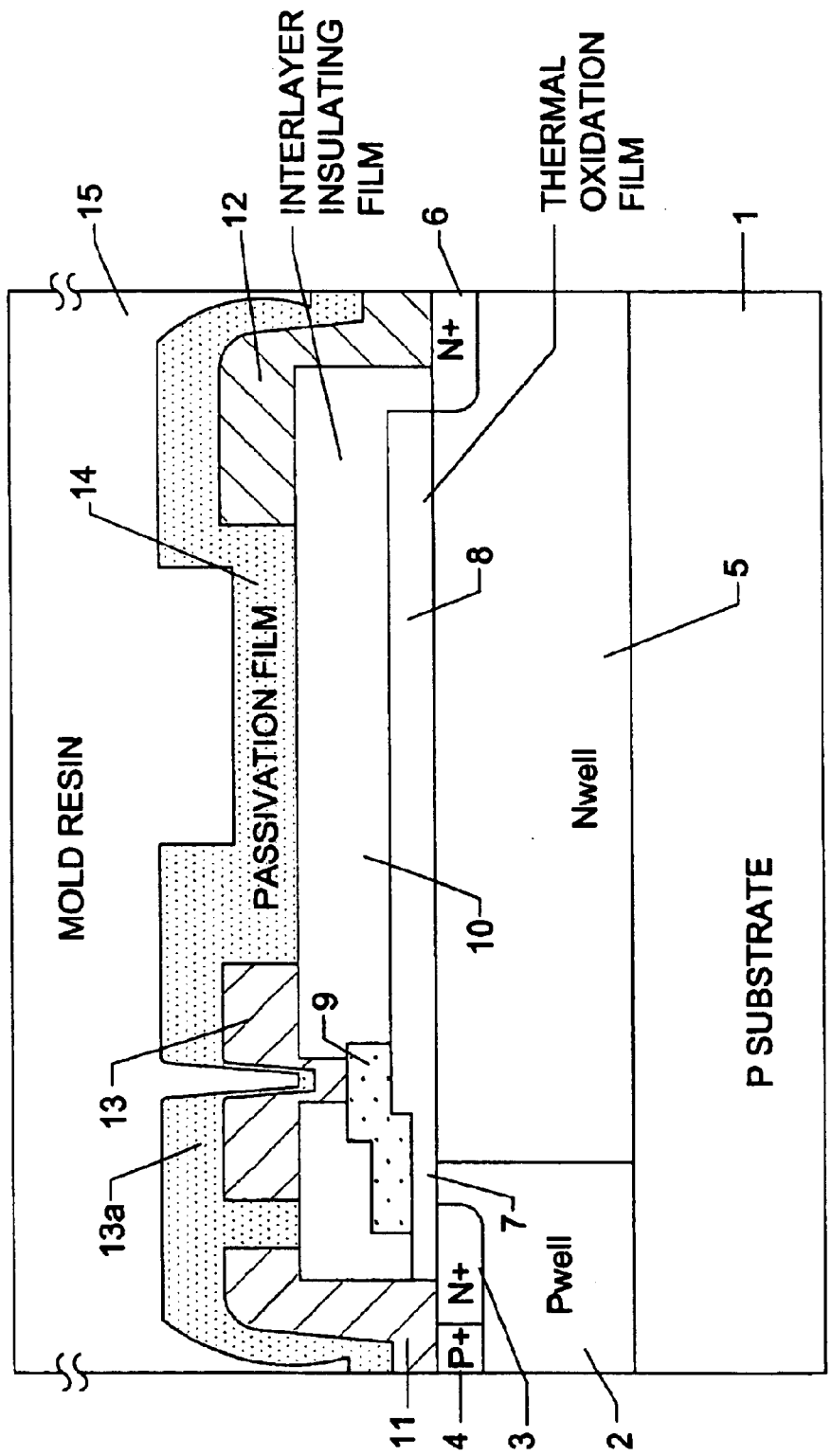
FIG. 25 is a partial sectional view showing a semiconductor device comprising a high withstand voltage lateral MISFET device.
Figure 26:
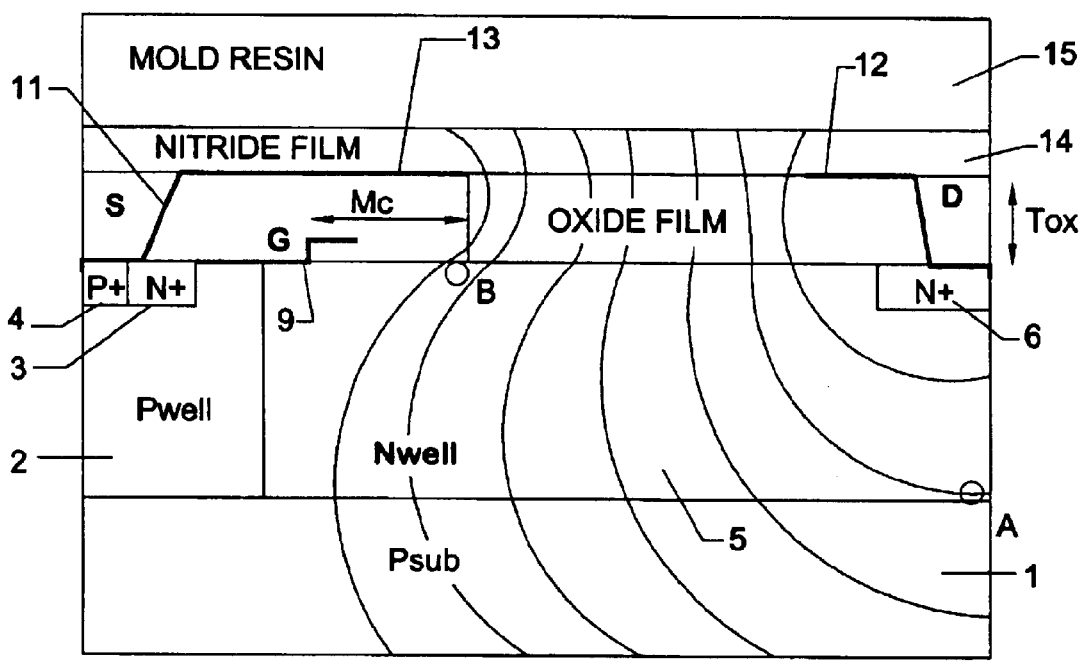
FIG. 26 is a two-dimensional device simulation figure to show the distribution of equipotential lines in a state in which a charge accumulation layer has not been formed in a case in which a drain voltage of 700V is applied in an OFF state in a high withstand voltage lateral MISFET device with a design withstand voltage of 700V and in which the length of extension of the channel field plate=Mc 10 $\mu$m, the film thickness Tx of the insulating film=2 $\mu$m, and the length Ld of the drain drift region=60 $\mu$m.
Figure 27:
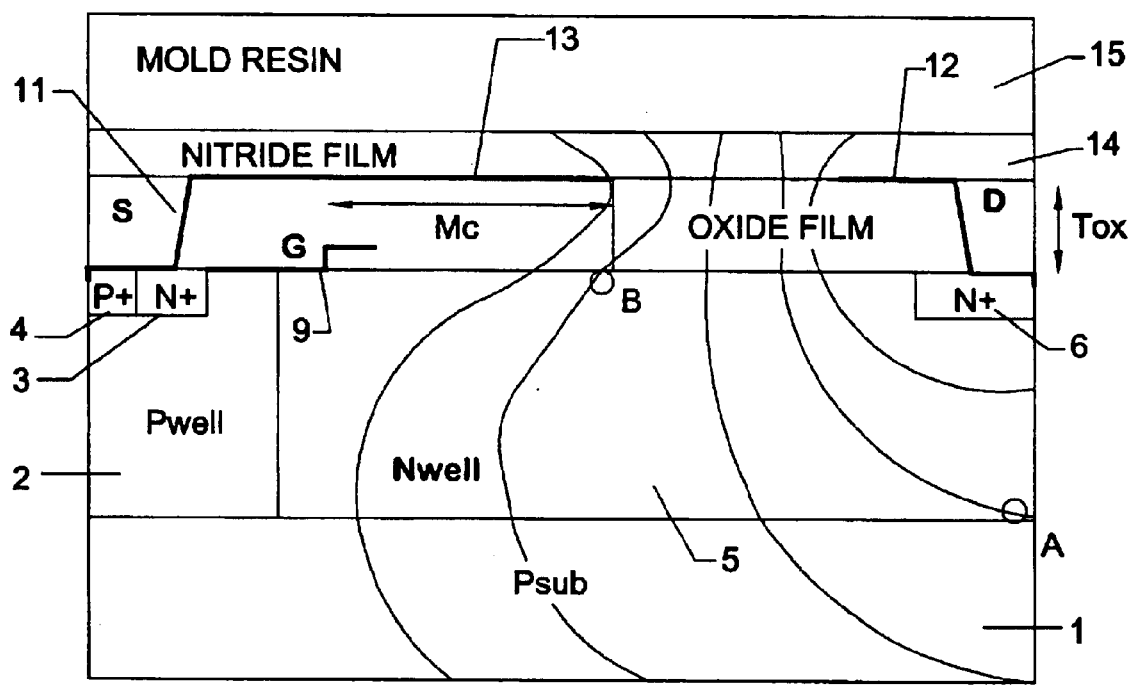
FIG. 27 is a two-dimensional device simulation figure to show the distribution of equipotential lines in a state in which a charge accumulation layer has not been formed in a case in which a drain voltage of 700V is applied in an OFF state in a high withstand voltage lateral MISFET device with a design withstand voltage of 700V and in which the length of extension of the channel field plate=Mc 25 $\mu$m, the film thickness Tx of the insulating film=2 $\mu$m, and the length Ld of the drain drift region=60 $\mu$m.

FIG. 24 is a planar view showing a chip planar pattern for a semiconductor device comprising a high withstand voltage lateral MISFET device, according to an eleventh embodiment of the present invention. Note that components in FIG. 24 that are the same as components shown in FIG. 23 have been assigned the same reference numerals and a description of such components will therefore be omitted hereinbelow.

According to the present embodiment, the first metal layer, which forms the source electrode layer 11, the drain electrode layer 12 and the first field plate FP1, of the lateral MISFET device section 50, is employed as an interconnect wiring layer 61 for a circuit block on the control circuit section 60. Further, the second metal layer, which serves to form the field plates FP2, FP3, is employed as an interconnect wiring layer 61 for a circuit block on the control circuit section 60, and also as a shield film 62 on the control circuit section 60. As a result, the control circuit section 60 is capable of preventing operational instability caused by floating ions within the resin covering layer and is capable of shielding electromagnetic noise and the like from the lateral MISFET device section 50, whereby it is possible to realize a highly reliable semiconductor device.

As described hereinabove, the present invention is a semiconductor device, which has a high withstand voltage lateral MISFET device with a breakdown voltage that is generally 350V to 1200V, and is characterized by the fact that, with regard to the gate electrode layer, the drain electrode layer, or to the upper layer field plates thereof, minimum values for the length of extension of same are controlled in relation to the total insulating film thickness within a numerical domain that roughly exceeds the typical upper limit values of the prior art, and, therefore, even if charge accumulation, which grows at the interface of the resin covering layer during actual use, affects the variation in the distribution of equipotential lines, it becomes possible to suppress the field strength directly below the extending tip of the channel field plate such that this field strength is always lower than that at the voltage breakdown sacrificial position directly below the drain region, and it is thus possible to realize a stable semiconductor device that is capable of suppressing a gradual withstand voltage drop and a gradual ON current drop. Moreover, the semiconductor device according to the present invention also makes it possible to afford the drain drift region a high concentration that is twice that known conventionally and consequently to achieve a natural increase in the ON current. In addition, in a high withstand voltage lateral MISFET device, which has a comb-tooth type planar pattern in which gate linear portions and gate curved portions are formed, since it becomes possible to alleviate the field concentration on the gate curved portions in comparison with conventional practice, it is equally possible to make the radius of curvature of the gate curved portions small to thus improve the degree of device integration, and, also by virtue of this fact, it becomes possible to realize a large current capacitance.

The invention has been described with reference to certain preferred embodiments thereof. It will be understood, however, that modification and variations are possible within the scope of the appended claims.

What is claimed is:

1. A semiconductor device having a high withstand voltage lateral MISFET device, comprising:

a first conductivity-type channel region, which is formed on the main face side of a first conductivity-type substrate;

a second conductivity-type source region, which is formed on the main face side within the channel region;

a second conductivity-type drain region, which is separated from said channel region on the main face side of said first conductivity-type substrate by a second conductivity-type drain drift region therebetween;

a drain electrode layer, which is conductively connected with said drain region;

a gate electrode layer, which backgates said channel region via a gate insulating film, and which extends toward the drain side on a first insulating film formed on the main face of said drain drift region;

a source electrode layer, which is conductively connected with said channel region and said source region; and a resin covering layer, which covers said gate electrode layer, a protective film being interposed therebetween, wherein a breakdown drain voltage, when the voltage breakdown sacrificial position directly below said drain region reaches a critical field strength in a state in which said resin covering layer does not cover the gate electrode layer or has been peeled therefrom, is $V_{dabs}$ (V), and wherein the length of extension Mc (μm) of said gate electrode layer on said first insulating film and the total insulating film thickness Tc (μm) directly below the extending tip of said gate electrode layer are greater than or equal to lower limit values $Mc_{min}$, $Tc_{min}$ that satisfy the following inequalities:

$350 \leq V_{dabs} \leq 1200$;

$Tc_{min} \leq \beta$;

$Mc_{min} \leq 35$;

$Mc_{min} \geq -\alpha(Tc_{min}-\beta)$;

where $\alpha = 3500/V_{dabs}$, $\beta = 0.01 V_{dabs}$.

2. The semiconductor device according to claim 1, wherein said lower limit values $Mc_{min}$, $Tc_{min}$ satisfy the following inequalities:

$Tc_{min} \leq 4$;

$Mc_{min} \geq 35 - 8.75 Tc_{min}$.

3. The semiconductor device according to claim 2, wherein said lower limit values $Mc_{min}$, $Tc_{min}$ satisfy the following inequalities:

$Tc_{min} \leq 5$;

$Mc_{min} \geq 35 - 7 Tc_{min}$.

4. The semiconductor device according to claim 3, wherein said lower limit values $Mc_{min}$, $Tc_{min}$ satisfy the following inequalities:

$Tc_{min} \leq 6$;

$Mc_{min} \geq 35 - 5.83 Tc_{min}$.

5. The semiconductor device according to claim 4, wherein said lower limit values $Mc_{min}$, $Tc_{min}$ satisfy the following inequalities:

$Tc_{min} \leq 7$;

$Mc_{min} \geq 35 - 5 Tc_{min}$.

6. The semiconductor device according to claim 1, wherein said MISFET device has a comb-tooth type device planar pattern extending in a gate width direction and in which gate linear portions and gate curved portions are alternately repeated and connected to one another, and wherein the length of extension of said gate electrode layer on said gate curved portions is longer than the length of extension of said gate electrode layer on said gate linear portions.

7. The semiconductor device according to claim 1, wherein an amount of charge per unit area of said drain drift region is at least $1 \times 10^{12}/cm^2$ and no more than $3 \times 10^{12}/cm^2$.

8. The semiconductor device according to claim 1, wherein said drain region being is within a second conductivity type well, which is formed on the main face side of said first conductivity type semiconductor substrate, the impurity concentration in the second conductivity type well being higher than the impurity concentration of said drain drift region.

9. The semiconductor device according to claim 1, wherein a first conductivity type top region is provided on the main face side of said drain drift region.

10. A semiconductor device having a high withstand voltage lateral MISFET device, comprising:

a first conductivity-type channel region, which is formed on the main face side of a first conductivity-type substrate;

a second conductivity-type source region, which is formed on the main face side within the channel region;

a second conductivity-type drain region, which is separated from said channel region on the main face side of said first conductivity-type substrate by a second conductivity-type drain drift region therebetween;

a drain electrode layer, which is conductively connected with said drain region;

a gate electrode layer, which backgates said channel region via a gate insulating film, and which extends toward the drain side on a first insulating film formed on the main face of said drain drift region;

a source electrode layer, which is conductively connected with said channel region and said source region;

a resin covering layer, which covers said gate electrode layer, a protective film being interposed therebetween; and a first field plate, which extends, further than said gaze electrode layer, toward the drain side on a second insulating film formed on said gate electrode layer, and which, at least when said MISFET device is OFF, is intended to apply a potential that is substantially the same as the potential of said gate electrode layer or said source electrode layer, wherein a breakdown drain voltage, when the voltage breakdown sacrificial position directly below said drain region reaches a critical field strength in a state in which said resin covering layer does not cover the gate electrode layer or has been peeled therefrom, is $V_{dabs}$ (V), and the length of extension $Mc_1$ (mm) of said first field plate from the source side end of said first insulating film and the total insulating film thickness $Tc_1$ (mm) directly below the extending tip of said first field plate are greater than or equal to lower limit values $Mc_{1min}$, $Tc_{1min}$ that satisfy the following inequalities:

$350 \leq V_{dabs} \leq 1200$;

$Tc_{1min} \leq \beta$; $Mc_{1min} \leq 35$;

$Mc_{1min} \geq -\alpha(Tc_{1min}-\beta)$;

where $\alpha = 3500/V_{dabs}$, $\beta = 0.01 V_{dabs}$.

11. The semiconductor device according to claim 10, wherein said lower limit values $Mc_{1min}$, $Tc_{1min}$ satisfy the following inequalities:

$Tc_{1min} \leq 4$;

$Mc_{1min} \geq 35 - 8.75 Tc_{1min}$.

12. The semiconductor device according to claim 11, wherein said lower limit values $Mc_{1min}$, $Tc_{1min}$ satisfy the following inequalities:

$Tc_{1min} \leq 5$;

$Mc_{1min} \geq 35 - 7Tc_{1min}$.

13. The semiconductor device according to claim 12, wherein said lower limit values $Mc_{1min}$, $Tc_{1min}$ satisfy the following inequalities:

$Tc_{1min} \leq 6$;

$Mc_{1min} \geq 35 - 5.83Tc_{1min}$.

14. The semiconductor device according to claim 13, wherein said lower limit values $Mc_{1min}$, $Tc_{1min}$ satisfy the following inequalities:

$Tc_{1min} \leq 7$;

$Mc_{1min} \geq 35 - 5Tc_{1min}$.

15. A semiconductor device having a high withstand voltage lateral MISFET device, comprising:
- a first conductivity-type channel region, which is formed on the main face side of a first conductivity-type substrate;
- a second conductivity-type source region, which is formed on the main face side within the channel region;
- a second conductivity-type drain region, which is separated from said channel region on the main face side of said first conductivity-type substrate by a second conductivity-type drain drift region therebetween;
- a drain electrode layer, which is conductively connected with said drain region;
- a gate electrode layer, which backgates said channel region via a gate insulating film, and which extends toward the drain side on a first insulating film formed on the main face of said drain drift region;
- a source electrode layer, which is conductively connected with said channel region and said source region;
- a resin covering layer, which covers said gate electrode layer a protective film being interposed therebetween;
- a first field plate, which extends, further than said gate electrode layer, toward the drain side on a second insulating film formed on said gate electrode layer, and which, at least when said MISFET device is OFF, is intended to apply a potential that is substantially the same as the potential of said gate electrode layer or said source electrode layer; and
- a second field plate, which extends, further than said first field plate, toward the drain side on a third insulating film formed on the first field plate, and which, at least when said MISFET device is OFF, is intended to apply a potential that is substantially the same as the potential of said gate electrode layer or said source electrode layer,
- the breakdown drain voltage, when the voltage breakdown sacrificial position directly below said drain region reaches a critical field strength in a state in which said resin covering layer does not cover the gate electrode layer or has been peeled therefrom is $V_{dabs}$ (V), and the length of extension $Mc_2$ (mm) of said second field plate from the source side end of said first insulating film and the total Insulating film thickness $Tc_2$ (mm) directly below the extending tip of said second field plate are greater than or equal to lower limit values $Mc_{2min}$, $Tc_{2min}$ that satisfy the following inequalities:

$350 \leq V_{dabs} \leq 1200$;

$Tc_{2min} \leq \beta$;

$Mc_{2min} \leq 35$; $Mc_{2min} > -\alpha(Tc_{2min} - \beta;)$;

Where $\alpha - 3500/V_{dabs}$, $\beta; = 0.01 V_{dabs}$.

16. The semiconductor device according to claim 15, wherein said lower limit values $Mc_{2min}$, $Tc_{2min}$ satisfy the following inequalities:

$Tc_{2min} \leq 4$;

$Mc_{2min} \geq 35 - 8.75Tc_{2min}$.

17. The semiconductor device according to claim 16, wherein said lower limit values $Mc_{2min}$, $Tc_{2min}$ satisfy the following inequalities:

$Tc_{2min} \leq 5$;

$Mc_{2min} \geq 35 - 7Tc_{2min}$.

18. The semiconductor device according to claim 17, wherein said lower limit values $Mc_{2min}$, $Tc_{2min}$ satisfy the following inequalities:

$Tc_{2min} \leq 6$;

$Mc_{2min} \geq 35 - 5.83Tc_{2min}$.

19. The semiconductor device according to claim 18, wherein said lower limit values $Mc_{2min}$, $Tc_{2min}$ satisfy the following inequalities:

$Tc_{2min} \leq 7$;

$Mc_{2min} \geq 35 - 5Tc_{2min}$.

20. The semiconductor device according to claim 15, wherein; said first field plate is formed by a first metal layer and said second field plate is formed by a second metal layer, and further including, in a region separate from the region occupied by said MISFET device within the main face side of said first conductivity-type substrate, a control circuit section for said MISFET device, said control circuit section being constituted using said first and second metal layers as circuitry interconnect wiring layers.

21. The semiconductor device according to claim 15, wherein; said first field plate is formed by a first metal layer and said second field plate is formed by a second metal layer, and further including, in a region separate from the region occupied by said MISFET device within the main face side of said first conductivity-type substrate, a control circuit section for said MISFET device, said control circuit section being constituted using said first metal layer as a circuitry interconnect wiring layer and using said second metal layer as a shield film to cover at least some of the circuitry.

22. A semiconductor device having a high withstand voltage lateral MISFET device, comprising:
- a first conductivity-type channel region, which is formed on the main face side of a first conductivity-type substrate;
- a second conductivity-type source region, which is formed on the main face side within the channel region;
- a second conductivity-type drain region, which is separated from said channel region on the main face side of said first conductivity-type substrate by a second conductivity-type drain drift region therebetween;
- a gate electrode layer, which backgates said channel region via a gate insulating film;

a source electrode layer, which is conductively connected with said channel region and source region;

a drain electrode layer, which is conductively connected with said drain region and which extends toward the channel side on a first insulating film formed on the main face of said drain drift region; and a resin covering layer, which covers the drain electrode layer, a protective film being interposed therebetween, wherein a breakdown drain voltage, when the voltage breakdown sacrificial position directly below said drain region reaches a critical field strength in a state in which said resin covering layer does not cover the drain electrode layer or has been peeled therefrom, is $V_{dabs}$ (V), and wherein the length of extension Md ($\mu$m) of said drain electrode layer on said first insulating film and the total insulating film thickness Td ($\mu$m) directly below the extending tip of said drain electrode layer are greater than or equal to lower limit values $Md_{min}$, $Td_{min}$ that satisfy the following inequalities:

$350 \leq V_{dabs} \leq 1200$;

$Td_{min} \leq \beta$;

$Md_{min} \leq 35$;

$Md_{min} \geq -\alpha(Td_{min}-\beta)$;

where $\alpha=3500/V_{dabs}$, $\beta=0.01V_{dabs}$.

23. The semiconductor device according to claim 22, wherein said lower limit values $Md_{min}$, $Td_{min}$ satisfy the following inequalities:

$Td_{min} \leq 4$;

$Md_{min} \geq 35-8.75Td_{min}$.

24. The semiconductor device according to claim 23, wherein said lower limit values $Md_{min}$, $Td_{min}$ satisfy the following inequalities:

$Td_{min} \leq 5$;

$Md_{min} \geq 35-7Td_{min}$.

25. The semiconductor device according to claim 24, wherein said lower limit values $Md_{min}$, $Td_{min}$ satisfy the following inequalities:

$Td_{min} \leq 6$;

$Md_{min} \geq 35-5.83Td_{min}$.

26. The semiconductor device according to claim 25, wherein said lower limit values $Md_{min}$, $Td_{min}$ satisfy the following inequalities:

$Td_{min} \leq 7$;

$Md_{min} \geq 35-5Td_{min}$.

27. A semiconductor device having a high withstand voltage lateral MISFET device, comprising:

a first conductivity-type channel region, which is formed on the main face side of a first conductivity-type substrate;

a second conductivity-type source region, which is formed on the main face side within the channel region;

a second conductivity-type drain region, which is separated from said channel region on the main face side of said first conductivity-type substrate by a second conductivity-type drain drift region therebetween;

a gate electrode layer, which backgates said channel region via a gate insulating film a source electrode layer, which is conductively connected with said channel region and said source region;

a drain electrode layer, which is conductively connected with said drain region and which extends toward the channel side on a first insulating film formed on the main face of said drain drift region;

a resin covering layer, which covers said gate electrode layer a protective film being interposed therebetween;

a first field plate, which extends, further than said drain electrode layer, toward the channel side on a second insulating film formed on said drain electrode layer, and which, at least when said MISFET device is OFF, is intended to apply a potential that is substantially the same as the potential of drain electrode layer; and the breakdown drain voltage, when the voltage breakdown sacrificial position directly below said drain region reaches a critical field strength in a state in which said resin covering layer does not cover the gate electrode layer or has been peeled therefrom is $V_{dabs}$ (V), and the length of extension $Mc_2$ (mm) of said second field plate from the source side end of said first insulating film and the total insulating film thickness $Tc_2$ (mm) directly below the extending tip of said second field plate are greater than or equal to lower limit values $Mc_{2min}$, $Tc_{2min}$ that satisfy the following inequalities:

$350 \leq V_{dabs} \leq 1200$;

$Tc_{2min} \leq \beta$;

$Mc_{2min} \leq 35$;

$Mc_{2min} > -\alpha(Tc_{2min}-\beta;)$;

Where $\alpha-3500/V_{dabs}$, $\beta;=0.01 V_{dabs}$.

28. The semiconductor device according to claim 27, wherein said lower limit values $Md_{3min}$, $Td_{3min}$ satisfy the following inequalities:

$Td_{3min} \leq 4$;

$Md_{3min} \geq 35-8.75Td_{3min}$.

29. The semiconductor device according to claim 28, wherein said lower limit values $Md_{3min}$, $Td_{3min}$ satisfy the following inequalities:

$Td_{3min} \leq 5$;

$Md_{3min} \geq 35-7Td_{3min}$.

30. The semiconductor device according to claim 29, wherein said lower limit values $Md_{3min}$, $Td_{3min}$ satisfy the following inequalities:

$Td_{3min} \leq 6$;

$Md_{3min} \geq 35-5.83Td_{3min}$.

31. The semiconductor device according to claim 30, wherein said lower limit values $Md_{3min}$, $Td_{3min}$ satisfy the following inequalities:

$Td_{3min} \leq 7$;

$Md_{3min} \geq 35-5Td_{3min}$.

32. The semiconductor device according to claim 27, wherein; said drain electrode layer is formed by a first metal layer and said first field plate is formed by a second metal layer, further including, in a region separate from the region occupied by said MISFET device within the main face side of said first conductivity-type substrate, a control circuit section for said MISFET device, and said control circuit section being constituted using said first and second metal layers as circuitry interconnect wiring layers.

33. The semiconductor device according to claim 27, wherein; said drain electrode layer is formed by a first metal layer and said first field plate is formed by a second metal layer, and further including, in a region separate from the region occupied by said MISFET device within the main face side of said first conductivity-type substrate, a control circuit section for said MISFET device, said control circuit section being constituted using said first metal layer as a circuitry interconnect wiring layer and using said second metal layer as a shield film to cover at least some of the circuitry.

34. A semiconductor device that has a high withstand voltage lateral MISFET device, comprising:
a first conductivity-type channel region, which is formed on the main face side of a first conductivity-type substrate;
a second conductivity-type source region, which is formed on the main face side within the channel region;
a second conductivity-type drain region, which is separated from said channel region on the main face side of said first conductivity-type substrate by a second conductivity-type drain drift region therebetween;
a gate electrode layer, which backgates said channel region via a gate insulating film and which extends toward the drain side on a first insulating film formed on the main face of said drain drift region;
a source electrode layer, which is conductively connected with said channel region and source region;
a drain electrode layer, which is conductively connected with said drain region and which extends toward the channel side on a second insulating film formed on the main face of said drain drift region; and
a resin covering layer, which covers said gate electrode layer and said drain electrode layer, a protective film being interposed therebetween,
wherein a breakdown drain voltage, when the voltage breakdown sacrificial position directly below said drain region reaches a critical field strength in a state in which said resin covering layer does not cover the gate electrode layer and the drain electrode layer or has been peeled therefrom, is $V_{dabs}$ (V), and the length of extension Mc ($\mu$m) of said gate electrode layer on said first insulating film, the total insulating film thickness Tc ($\mu$m) directly below the extending tip of said gate electrode layer, the length of extension Md ($\mu$m) of said drain electrode layer on said second insulating film and the total insulating film thickness Td ($\mu$m) directly below the extending tip of said drain electrode layer are greater than or equal to lower limit values $Mc_{min}$, $Tc_{min}$, $Md_{min}$, $Td_{min}$ that satisfy the following inequalities:

$$350 \leq V_{dabs} \leq 1200;$$

$$Tc_{min} \leq \beta;$$

$$Td_{min} \leq \beta;$$

$$Mc_{min} \leq 35;$$

$$Md_{min} \leq 35;$$

$$Mc_{min} \geq -\alpha(Tc_{min}-\beta);$$

$$Md_{min} \geq -\alpha(Td_{min}-\beta);$$

where $\alpha=3500/V_{dabs}$, $\beta=0.01V_{dabs}$.

35. The semiconductor device according to claim 34, wherein said lower limit values $Mc_{min}$, $Tc_{min}$, $Md_{min}$, $Td_{min}$ satisfy the following inequalities:

$$Tc_{min} \leq 4;$$

$$Td_{min} \leq 4;$$

$$Mc_{min} \geq 35-8.75Tc_{min};$$

$$Md_{min} \geq 35-8.75Td_{min}.$$

36. The semiconductor device according to claim 35, wherein said lower limit values $Mc_{min}$, $Tc_{min}$, $Md_{min}$, $Td_{min}$ satisfy the following inequalities:

$$Tc_{min} \leq 5;$$

$$Td_{min} \leq 5;$$

$$Mc_{min} \geq 35-7Tc_{min};$$

$$Md_{min} \geq 35-7Td_{min}.$$

37. The semiconductor device according to claim 36, wherein said lower limit values $Mc_{min}$, $Tc_{min}$, $Md_{min}$, $Td_{min}$ satisfy the following inequalities:

$$Tc_{min} \leq 6;$$

$$Td_{min} \leq 6;$$

$$Mc_{min} \geq 35-5.83Tc_{min};$$

$$Md_{min} \geq 35-5.83Td_{min}.$$

38. The semiconductor device according to claim 37, wherein said lower limit values $Mc_{min}$, $Tc_{min}$, $Md_{min}$, $Td_{min}$ satisfy the following inequalities:

$$Tc_{min} \leq 7;$$

$$Td_{min} \leq 7;$$

$$Mc_{min} \geq 35-5Tc_{min};$$

$$Md_{min} \geq 35-5Td_{min}.$$

39. A semiconductor device that has a high withstand voltage lateral MISFET device, comprising:
a first conductivity-type channel region, which is formed on the main face side of a first conductivity-type substrate;
a second conductivity-type source region, which is formed on the main face side within the channel region;
a second conductivity-type drain region, which is separated from said channel region on the main face side of said first conductivity-type substrate by a second conductivity-type drain drift region therebetween;
a gate electrode layer, which backgates said channel region via a gate insulating film and which extends toward the drain side one first insulating film formed on the main face of said drain drift region;
a source electrode layer, which is conductively connected with said channel region and source region;
a drain electrode layer, which is conductively connected with said drain region and which extends toward the gate side on a second insulating film formed on the main face side of said drain drift region;

a resin covering layer, which covers said gate electrode layer and said drain electrode layer, a protective film being interposed therebetween; and a first field plate, which extends, further than said gate electrode layer, toward the drain side on a third insulating film formed on said gate electrode layer, and which, at least when said MISFET device is OFF, is intended to apply a potential that is substantially the same as the potential of said gate electrode layer or said source electrode layer;

wherein a breakdown drain voltage, when the voltage breakdown sacrificial position directly below the drain region reaches a critical field strength in a state in which said resin covering layer does not cover the gate electrode layer and drain electrode layer or has been peeled therefrom, is $V_{dabs}$ (V), and the length of extension $Mc_1$ (mm) of said first field plate from the source side end of said first insulating film, the total insulating film thickness $Tc_1$ (mm) directly below the extending tip of said first field plate, the length of extension Md (mm) of said drain electrode layer on said second insulating film and the total insulating film thickness Td (mm) directly below the extending tip of said drain electrode layer are greater than or equal to lower limit values $Mc_{1min}$, $Tc_{1min}$, $Md_{min}$, $Td_{min}$ that satisfy the following inequalities:

$$350 \leq V_{dabs} \leq 1200;$$

$$Tc_{1min} \leq \beta; Td_{1min} \leq \beta;$$

$$Mc_{1min} \leq 35; Md_{1min} \leq 35;$$

$$Mc_{1min} \leq -\alpha(Tc_{1min}-\beta);$$

$$Md_{min} \leq -\alpha(Td_{min}-\beta);$$

where $\alpha=3500/V_{dabs}$, $\beta=0.01V_{dabs}$.

40. The semiconductor device according to claim 39, wherein said lower limit values $Mc_{1min}$, $Tc_{1min}$, $Md_{min}$, $Td_{min}$ satisfy the following inequalities:

$$Tc_{1min} \leq 4;$$

$$Td_{min} \leq 4;$$

$$Mc_{1min} \geq 35-8.75Tc_{1min};$$

$$Md_{min} \geq 35-8.75Td_{min}.$$

41. The semiconductor device according to claim 40, wherein said lower limit values $Mc_{1min}$, $Tc_{1min}$, $Md_{min}$, $Td_{min}$ satisfy the following inequalities:

$$Tc_{1min} \leq 5;$$

$$Td_{min} \leq 5;$$

$$Mc_{1min} \geq 35-7Tc_{1min};$$

$$Md_{min} \geq 35-7Td_{min}.$$

42. The semiconductor device according to claim 41, wherein said lower limit values $Mc_{1min}$, $Tc_{1min}$, $Md_{min}$, $Td_{min}$ satisfy the following inequalities:

$$Tc_{1min} \leq 6;$$

$$Td_{min} \leq 6;$$

$$Mc_{1min} \geq 35-5.83Tc_{1min};$$

$$Md_{min} \geq 35-5.83Td_{min}.$$

43. The semiconductor device according to claim 42, wherein said lower limit values $Mc_{1min}$, $Tc_{1min}$, $Md_{min}$, $Td_{min}$ satisfy the following inequalities:

$$Tc_{1min} \leq 7;$$

$$Td_{min} \leq 7;$$

$$Mc_{1min} \geq 35-5Tc_{1min};$$

$$Md_{min} \geq 35-5Td_{min}.$$

44. The semiconductor device according to claim 39, wherein the unoccupied interval between said first field plate and said drain electrode layer is greater than or equal to 2 μm.

45. A semiconductor device having a high withstand voltage lateral MISFET device, comprising:

a first conductivity-type channel region, which is formed on the main face side of a first conductivity-type substrate;

a second conductivity-type source region, which is formed on the main face side within the channel region;

a second conductivity-type drain region, which is separated from said channel region on the main face side of said first conductivity-type substrate by a second conductivity-type drain drift region therebetween;

a gate electrode layer, which backgates said channel region via a gate insulating film and which extends toward the drain side on a first insulating film formed on the main face of said drain drift region;

a source electrode layer, which is conductively connected with said channel region and said source region;

a drain electrode layer, which is conductively connected with said drain region and which extends toward the channel side on a first insulating film formed on the main face of said drain drift region;

a resin covering layer, which covers said gate electrode layer and said drain electrode layer, a protective film being interposed therebetween;

a first field plate, which extends, further than said gate electrode layer, toward drain side on a third insulating film formed on said gate electrode layer, and which, at least when said MISFET device is OFF, is intended to apply a potential that is substantially the same as the potential of gate electrode layer or said source electrode layer;

a second field plate, which extends, further than said first field plate, toward the drain side on a fourth insulating film formed on the first field plate, and which, at least when said MISFET device is OFF, is intended to apply a potential that is substantially the same as the potential of said gate electrode layer or said source electrode layer, a third field plate, which extends further than said drain electrode layer, toward the channel side on al fifth insulating film formed on said drain electrode layer, and which, at least when said MISFET device is OFF, is intended to apply a potential that is substantially the same as the potential of said drain electrode layer; and the breakdown drain voltage, when the voltage breakdown sacrificial position directly below said drain region reaches a critical field strength in a state in which said resin covering layer does not cover the gate electrode layer and drain electrode or has been peeled therefrom is $V_{dabs}$ (V), and the length of extension $Mc_2$ (mm) of said second field plate from the source side end of said first insulating film and the total insulating film thickness $Tc_2$ (mm) directly below the extending tip of said second field plate, the length of extension Md3 (mm) of said third field plate from the drain side end of said second insulating film and the total insulating film thickness Td3 (mm) directly below the extending tip of said third field plate are greater than or equal to lower limit values $Mc_{2min}$, $Tc_{2min}$, Md3min, Td3min that satisfy the following inequalities:

$350 \leq V_{dabs} \leq 1200$;

$Tc_{2min} \leq \beta$; $Td_{3min} \leq \beta$;

$Mc_{2min} \leq 35$; $Md_{3min} \leq \beta$;

$Mc_{2min} \geq -\alpha(Tc_{2min}-\beta;)$;

$Md_{3min} \geq -\alpha(Td_{3min}-\beta;)$

Where $\alpha-3500/V_{dabs}$, $\beta; =0.01 V_{dabs}$.

46. The semiconductor device according to claim 45, wherein said lower limit values $Mc_{2min}$, $Tc_{2min}$, $Md_{3min}$, $Td_{3min}$ satisfy the following inequalities:

$Tc_{2min} \leq 4$;

$Td_{3min} \leq 4$;

$Mc_{2min} \geq 35-8.75Tc_{2min}$;

$Md_{3min} \geq 35-8.75Td_{3min}$.

47. The semiconductor device according to claim 46, wherein said lower limit values $Mc_{2min}$, $Tc_{2min}$, $Md_{3min}$, $Td_{3min}$ satisfy the following inequalities:

$Tc_{2min} \leq 5$;

$Td_{3min} \leq 5$;

$Mc_{2min} \geq 35-7Tc_{2min}$;

$Md_{3min} \geq 35-7Td_{3min}$.

48. The semiconductor device according to claim 47, wherein said lower limit values $Mc_{2min}$, $Tc_{2min}$, $Md_{3min}$, $Td_{3min}$ satisfy the following inequalities:

$Tc_{2min} \leq 6$;

$Td_{3min} \leq 6$;

$Mc_{2min} \geq 35-5.83Tc_{2min}$;

$Md_{3min} \geq 35-5.83Td_{3min}$.

49. The semiconductor device according to claim 48, wherein said lower limit values $Mc_{2min}$, $Tc_{2min}$, $Md_{3min}$, $Td_{3min}$ satisfy the following inequalities:

$Tc_{2min} \leq 7$;

$Td_{3min} \leq 7$;

$Mc_{2min} \geq 35-5Tc_{2min}$;

$Md_{3min} \geq 35-5Td_{3min}$.

50. The semiconductor device according to claim 45, wherein; said first field plate and said drain electrode layer are formed by a first metal layer and said second field plate and said third field plate are formed by a second metal layer, and further including, in a region separate from the region occupied by said MISFET device within the main face side of said first conductivity-type substrate, a control circuit section for said MISFET device, said control circuit section being constituted using said first and second metal layers as circuitry interconnect wiring layers.

51. The semiconductor device according to claim 45, wherein; said first field plate and said drain electrode layer are formed by a first metal layer and said second field plate and said third field plate are formed by a second metal layer, and further including, in a region separate from the region occupied by said MISFET device within the main face side of said first conductivity-type substrate, a control circuit section for said MISFET device, said control circuit section being constituted using said first metal layer as a circuitry interconnect wiring layer and using said second metal layer as a shield film to cover at least some of the circuitry.

* * * * *